(12) United States Patent
Yoo et al.

(10) Patent No.: US 12,144,103 B2
(45) Date of Patent: Nov. 12, 2024

(54) PRINTED CIRCUIT BOARD AND CAMERA DEVICE COMPRISING SAME

(71) Applicant: LG INNOTEK CO., LTD., Seoul (KR)

(72) Inventors: Do Hyuk Yoo, Seoul (KR); Hee Jung Lee, Seoul (KR); Young Ju Han, Seoul (KR); Young Il Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 852 days.

(21) Appl. No.: 17/252,172

(22) PCT Filed: Jun. 14, 2019

(86) PCT No.: PCT/KR2019/007212
§ 371 (c)(1),
(2) Date: Dec. 14, 2020

(87) PCT Pub. No.: WO2019/240538
PCT Pub. Date: Dec. 19, 2019

(65) Prior Publication Data
US 2021/0267043 A1   Aug. 26, 2021

(30) Foreign Application Priority Data

Jun. 15, 2018 (KR) .................. 10-2018-0069233
Jun. 26, 2018 (KR) .................. 10-2018-0073446
Aug. 14, 2018 (KR) .................. 10-2018-0095130

(51) Int. Cl.
*H01S 5/024* (2006.01)
*H05K 1/02* (2006.01)
*H05K 1/11* (2006.01)

(52) U.S. Cl.
CPC ....... *H05K 1/0206* (2013.01); *H01S 5/02469* (2013.01); *H05K 1/112* (2013.01)

(58) Field of Classification Search
CPC .................................................. H05K 1/0206
See application file for complete search history.

(56) References Cited

U.S. PATENT DOCUMENTS 8,350,389 B2   1/2013   Itaya et al.
9,232,630 B1   1/2016   Jacobsson et al.
(Continued)

FOREIGN PATENT DOCUMENTS

CN   105472877 A   4/2016
JP   6-13491 A   1/1994
(Continued)

OTHER PUBLICATIONS

Office Action dated Dec. 2, 2022 in Korean Application No. 10-2018-0095130.
(Continued)

*Primary Examiner* — Minsun O Harvey
*Assistant Examiner* — Stephen Sutton Kotter
(74) *Attorney, Agent, or Firm* — Saliwanchik, Lloyd & Eisenschenk

(57) ABSTRACT

A printed circuit board according to an embodiment comprises: a substrate comprising at least two insulating layers; pads arranged on the substrate; heat dissipation vias arranged to pass through the substrate in a region of the substrate which vertically overlaps the pads; and through vias arranged to pass through the substrate in a region of the substrate which does not vertically overlap the pads, wherein each heat dissipation via includes a plurality of via parts which are spaced apart from each other in at least one of the at least two insulating layers, the upper surface of each of the plurality of via parts has a first horizontal width in a first direction that is smaller than a second horizontal width thereof in a second direction different from the first direction, and the plurality of via parts have a surface area corresponding to 10% or greater of the surface area of the pads.

12 Claims, 35 Drawing Sheets

(56) References Cited

U.S. PATENT DOCUMENTS

| | | |
|---|---|---|
| 9,768,361 B2 | 9/2017 | Riel et al. |
| 9,906,312 B2 | 2/2018 | Kim |
| 9,984,950 B2 | 5/2018 | Kim et al. |
| 10,566,363 B2 | 2/2020 | Riel et al. |
| 2012/0261166 A1 | 10/2012 | Oh et al. |
| 2014/0174793 A1* | 6/2014 | Oh ................ H05K 1/0206 29/852 |
| 2016/0142155 A1 | 5/2016 | Kim |
| 2016/0306265 A1 | 10/2016 | Riel et al. |
| 2017/0343889 A1 | 11/2017 | Riel et al. |
| 2018/0156972 A1* | 6/2018 | Kainuma ............ H05K 1/183 |

FOREIGN PATENT DOCUMENTS

| | | |
|---|---|---|
| JP | 7-66524 A | 3/1995 |
| JP | 2008-244304 A | 10/2008 |
| JP | 2017-523467 A | 8/2017 |
| KR | 10-2012-0032268 A | 4/2012 |
| KR | 10-1181105 B1 | 9/2012 |
| KR | 10-2012-0117456 A | 10/2012 |
| KR | 10-1205440 B1 | 11/2012 |
| KR | 10-1289186 B1 | 7/2013 |
| KR | 10-2014-0083849 A | 7/2014 |
| KR | 10-2014-0134944 A | 11/2014 |
| KR | 10-2016-0007455 A | 1/2016 |
| KR | 10-2016-0058591 A | 5/2016 |
| KR | 10-1685648 B1 | 12/2016 |
| KR | 10-2017-0119953 A | 10/2017 |
| KR | 10-2017-0123796 A | 11/2017 |

OTHER PUBLICATIONS

International Search Report in International Application No. PCT/KR2019/007212, filed Jun. 14, 2019.

Office Action dated Jun. 3, 2023 in Chinese Application No. 201980054511.2.

Office Action dated Apr. 16, 2024 in Chinese Application No. 201980054511.2.

* cited by examiner

PRINTED CIRCUIT BOARD AND CAMERA DEVICE COMPRISING SAME

CROSS-REFERENCE TO RELATED APPLICATIONS

This application is the U.S. national stage application of International Patent Application No. PCT/KR2019/007212, filed Jun. 14, 2019, which claims the benefit under 35 U.S.C. § 119 of Korean Application Nos. 10-2018-0069233, filed Jun. 15, 2018; 10-2018-0073446, filed Jun. 26, 2018; and 10-2018-0095130, filed Aug. 14, 2018; the disclosures of each of which are incorporated herein by reference in their entirety.

TECHNICAL FIELD

An embodiment relates to a printed circuit board, and more particularly, to a printed circuit board on which a semiconductor light emitting element, a semiconductor light source element, a semiconductor optical element, a semiconductor light source chip, and a light emitting element are mounted, and a camera device including the same.

BACKGROUND ART

A semiconductor element containing a compound such as GaAs, AlGaAs, GaN, or AlGaN has a wide band gap energy, and it is easy to control the band gap energy. Accordingly, semiconductor elements including the above compounds are variously used as light emitting elements, light receiving elements, and various diodes.

In particular, light emitting elements such as light emitting diodes and laser diodes using a group 3-5 or 2-6 compound semiconductor material of semiconductors are red, green, and red by the development of thin film growth technology and device materials. Various colors such as blue and ultraviolet light can be implemented, and efficient white light can be realized by using fluorescent materials or by combining colors. Low power consumption, semi-permanent life, and quick response compared to conventional light sources such as fluorescent and incandescent lamps. It has speed, safety and environmental friendliness.

In addition, if a light-receiving element such as a photodetector or a solar cell is also manufactured using a compound semiconductor material of Group 3-5 or Group 2-6 of a semiconductor, the development of device material absorbs light in various wavelength ranges to generate photocurrent Light in various wavelength ranges from gamma rays to radio wavelength ranges can be used. In addition, due to the advantages of fast response speed, safety, environmental friendliness, and easy adjustment of device materials, it can be easily used for power control or ultra-high frequency circuits or communication modules.

Meanwhile, among the conventional semiconductor light source element technologies, there is a vertical-cavity surface-emitting laser (VCSEL), it is used in optical modules, optical transmission/reception modules, optical communications, optical parallel processing, optical connections, autofocus elements, Etc.

In addition, in the prior art, the vertical resonance type surface-emitting laser is used as a high-power VCSEL package structure for vehicles or mobiles.

Meanwhile, as the application fields of such VCSEL packages have recently been diversified, high output and high voltage driving are required, and miniaturization of semiconductor element packages is also strongly requested for miniaturization of products.

DISCLOSURE

Technical Problem

In an embodiment according to the present invention, a printed circuit board having a new structure and a camera device including the same are provided.

In addition, in an embodiment according to the present invention, a printed circuit board having excellent heat dissipation property while allowing both a light emitting element and a driving element to be disposed on one substrate, and a camera device including the same are provided.

In addition, in an embodiment of the present invention, a printed circuit board capable of significantly reducing the thickness and a camera device including the same are provided.

The technical problems to be achieved in the proposed embodiment are not limited to the technical problems mentioned above, and other technical problems not mentioned may be clearly understood by those of ordinary skill in the art to which the proposed embodiment belongs from the following description.

Technical Solution

The light emitting module according to the embodiment includes a substrate; a pad disposed on the substrate; a vertical cavity type surface-emitting laser element mounted on the pad; and a heat dissipation via disposed through the substrate in the substrate on a region vertically overlapped with the pad, wherein the heat dissipation via includes a plurality of via parts spaced apart from each other in a first direction in the substrate. And, a second horizontal width in a second direction orthogonal to the first direction of an upper surface of each of the plurality of via parts is greater than a first horizontal width in the first direction, and the heat dissipation via including the plurality of via parts has a surface area of 10% or more of a surface area of the pad.

In addition, the heat dissipation via including the plurality of via parts has a surface area ranging from 40% to 60% of the surface area of the pad.

In addition, the plurality of via parts constituting the via includes an overlapping region overlapping in a vertical direction with a vertical cavity type surface-emitting laser element mounted on the pad, and an area of the overlapping region is 10% or more of the surface area of the vertical cavity type surface-emission laser element.

In addition, each of the plurality of via parts includes a plurality of via holes disposed through the substrate and connected to each other, and neighboring via holes among the plurality of via holes form an overlapping region overlapping each other in a vertical direction, and an area of the overlapping area is 40% or more of an area of each of the via holes.

Further, the second horizontal width is at least 4 times or more of the first horizontal width.

In addition, the pad includes a first region vertically overlapping with the plurality of via parts, and a second region excluding the first region, and the vertical cavity type surface emitting laser element is disposed on the second region.

In addition, the heat dissipation via is electrically connected to a cathode electrode of the vertical cavity type surface emitting laser element through the pad.

In addition, the light emitting module further comprises a holder disposed on the substrate and opening an upper region of the vertical cavity type surface-emission laser element; and a diffusion part coupled to the holder and covering the upper region of the vertical cavity type surface-emitting laser element.

Further, the light emitting module further comprises a plurality of connection patterns disposed on the substrate; a plurality of connection parts disposed on the plurality of connection patterns; and a driver element mounted on the connection pattern through the plurality of connection parts, wherein at least some of the driver elements are positioned on a region overlapping the pad in a vertical direction.

In addition, at least one of the connection parts is disposed on the pad, and the driver element includes a ground terminal directly connected to the pad through the connection part.

In addition, the pad connects between a cathode electrode of the vertical cavity type surface-emission laser element and a ground terminal of the driver element. Preferably, a first connection part connected to the cathode electrode and a second connection part connected to the ground terminal are disposed on the pad at a predetermined interval, respectively, and the pad is connected with the first connection part and the second connection part. Accordingly, the pad connects the cathode electrode and the ground terminal through the first connection part and the second connection part.

In addition, the substrate includes a plurality of insulating layers, and the vias are disposed in the plurality of insulating layers to be aligned in a perpendicular direction, and wherein each of the via includes the plurality of via parts.

On the other hand, the camera device according to the embodiment includes a substrate including first and second rigid regions and a flexible region between the first and second rigid regions; a connector disposed on the first rigid region of the substrate; a holder disposed in the second rigid region and dividing the second rigid region into a light emitting region and a camera region; a light-emitting module positioned in the light-emitting area divided through the holder; and a camera module positioned in the camera area divided through the holder, wherein the light emitting module includes a pad disposed on the substrate, a vertical cavity type surface-emitting laser element mounted on the pad, a plurality of connection patterns disposed on the substrate, a plurality of connection parts disposed on the plurality of connection patterns, a driver element mounted on the connection pattern through the plurality of connection parts, and a heat dissipation via disposed through at least one insulating layer of the substrate in an area of the substrate vertically overlapping with the pad, wherein the heat dissipation via includes a plurality of via parts spaced apart from each other in a first direction in the substrate, and an upper surface of each of the plurality of via parts has a second horizontal width in a second direction orthogonal to the first direction greater than a first horizontal width in the first direction, and the heat dissipation via including the plurality of via parts has a surface area of 10% or more of a surface area of the pad.

At least some of the driver elements are positioned on a region overlapping the pad in a vertical direction, at least one of the connection parts is disposed on the pad, and the driver element includes a ground terminal directly connected to the pad through the connection part.

A printed circuit board according to an embodiment includes a substrate including at least two or more insulating layers; a pad disposed on the substrate; a heat dissipating part disposed through the substrate in a region vertically overlapping the pad; a via disposed through the substrate in a region that does not vertically overlap the pad; and a protective layer disposed on a lower surface of the substrate, wherein the heat dissipation part comprises the same metal material as the via, the metal material comprises copper, and the heat dissipation part has a surface area of 40% or more of a surface of the pad.

In addition, the heat dissipation part includes a heat dissipation coin inserted into a through hole passing the substrate in a region vertically overlapping with the pad, and a plating part disposed between an inner wall of the through hole and the heat dissipation coin.

In addition, the plating part includes a first plating part disposed between the inner wall of the through hole and the heat dissipation coin, and a second plating part disposed on an upper surface of the heat dissipation coin, and wherein an upper surface of the second plating part is positioned on the same plane as an upper surface of the substrate.

In addition, the protective layer is disposed on a lower surface of the substrate to cover the lower surface of the heat dissipation part.

In addition, the heat dissipation part is formed to protrude below a lower surface of the substrate, wherein the protective layer is disposed under the substrate, and a hole is formed to expose a protruding region of the heat dissipation part.

In addition, the heat dissipation part has a height ranging from 200 μm to 300 μm and a width ranging from 1 mm to 2 mm.

In addition, the camera device according to the embodiment includes at least two or more substrates; a pad disposed on the substrate; a vertical cavity type surface-emitting laser element mounted on the pad; a heat dissipating part disposed through the substrate in a region vertically overlapping with the pad; and a via disposed through the substrate in an area not vertically overlapping with the pad, wherein the heat dissipation part includes the same metal material as the via, and the metal material includes copper, and the heat dissipation part has a surface area of 40% or more of a surface area of the pad.

In addition, the heat dissipation part may include a heat dissipation coin inserted into a through hole passing the substrate, a first plating part disposed between the inner wall of the through hole and the heat dissipation coin in a region vertically overlapping with the pad, a second plating part disposed on an upper surface of the heat dissipation coin, wherein the upper surface of the second plating part is located on the same plane as the upper surface of the substrate.

In addition, the heat dissipation part includes an overlapping region overlapping in a vertical direction with a vertical cavity type surface-emission laser element mounted on the pad, and an area of the overlapping region is 10% or more of the surface area of the vertical cavity type surface-emission laser element.

In addition, the camera device further comprises a holder disposed on the substrate and opening an upper region of the vertical cavity type surface-emission laser element; a diffusion part coupled to the holder and covering the upper region of the vertical cavity type surface-emitting laser element; a plurality of connection patterns disposed on the substrate; a plurality of connection parts disposed on the plurality of connection patterns; and a driver element mounted on the connection pattern through the plurality of connection parts.

In addition, at least some of the driver elements are positioned on an area overlapping the pad in a vertical direction, and at least one of the connection parts is disposed on the pad.

In addition, the driver element includes a ground terminal directly connected to the pad through the connection part.

In addition, the heat dissipation part is electrically connected to a cathode electrode of the vertical cavity type surface-emission laser element through the pad, and the pad connects between the cathode electrode of the vertical cavity type surface-emission laser element and the ground terminal of the driver element.

Further, the substrate includes first and second rigid regions and a flexible region between the first and second rigid regions, and the holder is disposed in the second rigid region of the substrate, and dividing the second rigid region into a light emitting region and a camera region, wherein the vertical cavity type surface-emission laser element includes: a connector disposed in the light emitting region of the substrate and disposed in the first rigid region of the substrate; and a camera module disposed in the camera area of the substrate divided through the holder.

A printed circuit board according to an embodiment includes a substrate including at least two or more insulating layers; a pad disposed on the substrate; a heat dissipation via disposed through each of the at least two insulating layers in a region vertically overlapping the pad; and a through via disposed through the substrate in a region not vertically overlapping with the pad, wherein the pad includes a first pad disposed on an uppermost portion of the substrate, and a second pad disposed on the lowermost portion of the substrate. and, a third pad disposed between the at least two or more insulating layers, wherein the heat dissipating vias are disposed between the first to third pads, respectively, and Including a plurality of via parts spaced apart from each other in at least one insulating layer of the at least two or more insulating layers, and wherein the plurality of via parts have a surface area of 10% or more of the surface area of the first pad.

In addition, the substrate includes a flexible first insulating layer, a rigid second insulating layer disposed on the first insulating layer, and a rigid third insulating layer disposed below the first insulating layer, and the first pad is disposed on the second insulating layer, the second pad is disposed under the third insulating layer, and the third pad is disposed on an upper surface and a lower surface of the first insulating layer, respectively, in a region vertically overlapping the first and second pads.

In addition, the heat dissipation via includes a first heat dissipation via disposed in the first insulating layer and connected to the third pad, a second heat dissipation via disposed in the second insulating layer and connected to the first pad and the third pad, and a third heat dissipation via disposed in the third insulating layer and connected to the second pad and the third pad, wherein a plurality of via parts constituting the first heat dissipation via to a third heat dissipation via are aligned in a mutually perpendicular direction within the first to third insulating layers, and the through via formed in the first insulating layer has a smaller width than the first heat dissipation via.

Further, the first heat dissipation via has a rectangular shape in vertical cross section, and the second and third heat dissipation vias have a trapezoidal shape in vertical cross section.

In addition, the plurality of via parts have a surface area ranging from 40% to 60% of the surface area of the first pad.

In addition, the camera device according to the embodiment includes a substrate including at least two or more insulating layers; a pad disposed on the substrate; a vertical cavity type surface-emitting laser element mounted on the pad; a heat dissipation via disposed through each of the at least two insulating layers in a region vertically overlapping the pad; and a through via passing through the substrate in an area not vertically overlapping with the pad, wherein the pad comprises a first pad on which the vertical cavity type surface emitting laser element is mounted and disposed on an uppermost portion of the substrate, a second pad disposed on a lowermost portion of the substrate, and a third pad disposed between the at least two or more insulating layers, wherein the heat dissipation via includes a plurality of via parts each disposed between the first to third pads and spaced apart from each other in at least one of the at least two insulating layers, wherein an area of the first pad is at least twice the area of the vertical cavity type surface-emission laser element.

In addition, the area of the first pad is 4 or more times the area of the vertical cavity type surface-emission laser element.

In addition, the area of the first pad is at least 6 times the area of the vertical cavity type surface-emission laser element.

In addition, the plurality of via parts include an overlapping region overlapping in a vertical direction with a vertical cavity type surface-emission laser element mounted on the first pad, and an area of the overlapping region is 10% or more of the surface area of the vertical cavity type surface-emission laser element.

In addition, the first pad includes a first region vertically overlapping the plurality of via parts and a second region excluding the first region, and the vertical cavity type surface emitting laser element is mounted on the second area of the first pad.

In addition, the camera device further comprises a holder disposed on the substrate and opening an upper region of the vertical cavity type surface-emission laser element; a diffusion part coupled to the holder and covering an upper region of the vertical cavity type surface-emitting laser element; a plurality of connection patterns disposed on the substrate; a plurality of connection parts disposed on the plurality of connection patterns; and a driver element mounted on the connection pattern through the plurality of connection parts.

In addition, at least some of the driver elements are positioned on a region overlapping the first pad in a vertical direction, and at least one of the connection parts is disposed on the first pad.

In addition, the driver element includes a ground terminal directly connected to the first pad through the connection part.

In addition, the heat dissipation via is electrically connected to a cathode electrode of the vertical cavity type surface-emission laser element through the first pad, and the first pad connects between the cathode electrode of the vertical cavity type surface-emission laser element and the ground terminal of the driver element.

Further, the substrate includes first and second rigid regions and a flexible region between the first and second rigid regions, and the holder is disposed in the second rigid region of the substrate, and dividing the second rigid region into a light emitting region and a camera region, wherein the vertical cavity type surface-emission laser is disposed on the light emitting region, a connector disposed in the first rigid region of the substrate; and a camera module disposed in the camera area of the substrate divided through the holder.

In addition, the substrate includes a flexible first insulating layer, a rigid second insulating layer disposed on the first insulating layer, and a rigid third insulating layer disposed below the first insulating layer, and the first pad is disposed on the second insulating layer, the second pad is disposed under the third insulating layer, and the third pad is in a region vertically overlapping the first and second pads, wherein the heat dissipation via includes a first heat dissipation via disposed in the first insulating layer and connected to the third pad, a second heat dissipation via disposed in the second insulating layer and connected to the first pad and the third pad, and a third heat dissipation via disposed in the third insulating layer and connected to the second pad and the third pad.

In addition, a plurality of via parts constituting the first heat dissipation via to a third heat dissipation via are aligned in a mutually perpendicular direction within the first to third insulating layers, the through via formed in the first insulating layer has a smaller width than the first heat dissipation via, and the first heat dissipation via has a rectangular shape in vertical cross section, and the second and third heat dissipation vias have a trapezoidal shape in vertical cross section.

Advantageous Effects

A light-emitting package including a vertical cavity type surface-emission laser element, a light-emitting module, and a camera device including the same according to the embodiment requires only one substrate for mounting the vertical cavity type surface-emission laser element 100 and arranging the circuit pattern layer, the total thickness of the light emitting package can be reduced. In detail, the light emitting package according to the embodiment may remove the heat dissipation substrate including aluminum nitride (AlN), which was required to arrange the conventional vertical cavity type surface emitting laser element. Accordingly, the light emitting package, the light emitting module, and the camera device in the present invention can be manufactured to be slimmer compared to the comparative example.

In addition, the light emitting package including the vertical cavity type surface-emitting laser element, the light emitting module, and the camera device including the same according to the embodiment may omit the adhesive layer between the first substrate and the second substrate in the comparative example, the Since the problem caused by poor adhesion of the adhesive layer can be solved, the reliability of the light emitting package can be improved.

In addition, the light emitting package including the vertical cavity type surface-emitting laser element, the light emitting module, and the camera device including the same according to the embodiment can minimize the signal transmission distance because the signal is transmitted on one substrate. The resulting signal loss can be minimized. That is, in the prior art, signals are transmitted between the first substrate and the second substrate, and specifically, the signal is transmitted between the first substrate and the vertical cavity type surface emitting laser element through wire bonding in both the cathode and anode parts. Accordingly, the signal transmission distance increased. On the other hand, in the embodiment according to the present invention, the vertical cavity type surface-emitting laser element and a circuit pattern are disposed in one substrate, the signal transmission distance can be drastically reduced.

Specifically, in the present invention, when the substrate is connected to the cathode part of the vertical cavity type surface-emitting laser element, the signal is transmitted through the additional connection part without using wire bonding. This can minimize signal loss. In addition, in the present invention, the ground terminal of the driver element is also disposed on the pad on which the cathode electrode of the vertical cavity type surface-emission laser element is disposed, so that the signal distance between the cathode electrode and the driver element can be minimized, and thereby minimizing signal can be minimized.

In addition, the light-emitting package including the vertical cavity type surface-emitting laser element, the light-emitting module, and the camera device including the same according to the embodiment can be manufactured in a single process, thereby process efficiency and product yield may be improved compared to those in which the first and second substrates were respectively manufactured by separate processes in the prior art.

In addition, the light emitting package including the vertical cavity type surface-emission laser element, the light emitting module, and the camera device including the same according to the embodiment are provided with vias (V1, V2, V3) on an area vertically overlapping with the vertical cavity type surface emission laser element. In addition, the vias V1, V2, and V3 each include a plurality of via parts VP1, VP2, and VP3. In this case, at least one of the via parts VP1, VP2, and VP3 has a second horizontal width greater than a first horizontal width. That is, the plurality of via parts VP1, VP2, and VP3 may have a bar shape elongated in the second direction. Accordingly, in the present invention, by changing the shape of the via parts VP1, VP2, and VP3, the via area can be maximized within a limited area, and thus heat dissipation characteristics can be improved.

In addition, in the light emitting package including the vertical cavity type surface-emission laser element, the light emitting module, and the camera device including the same according to the embodiment, a heat dissipation part is inserted on a region vertically overlapping the vertical cavity type surface emission laser element. In this case, the width of the heat dissipation part may have a width greater than that of the vertical cavity type surface-emission laser element. Accordingly, in the present invention, heat generated from the vertical cavity type surface-emission laser element can be efficiently discharged through the arrangement of the heat dissipation part, and thus heat dissipation characteristics can be improved.

In addition, the printed circuit board on which the vertical cavity type surface-emission laser element is mounted according to the embodiment and the camera device including the same include the vias V1, V2, and V3 arranged on an area vertically overlapping with the vertical cavity type surface-emitting laser element. In addition, the vias V1, V2, and V3 are each formed of a plurality of via parts spaced apart from each other in a first direction and a second direction within a corresponding insulating layer. Therefore, in the present invention, through the configuration of the via including the plurality of via parts, the area of the via can be maximized within a limited area, and thus heat dissipation characteristics can be improved. Meanwhile, the vias V1, V2, and V3 are interconnected through pads. That is, a pad is disposed between each of the vias V1, V2, and V3. In addition, the pad may disperse and transmit heat transmitted through each of the vias V1, V2, and V3. Meanwhile, an uppermost pad among the pads is a mounting pad on which the vertical cavity type surface emitting laser element is mounted. In this case, the mounting pad may have an area of at least twice the area of the vertical cavity type surface-emission laser element. Preferably, the mounting pad may have an area of at least 4 times the area of the vertical cavity type surface emitting laser element. Preferably, the mounting pad may have an area of at least 6 times the area of the vertical cavity type surface-emission laser element. Accordingly, in the present invention, heat generated from the vertical cavity type surface-emission laser element can be efficiently discharged through a change in the area of the pad, and thus heat dissipation characteristics can be improved.

BEST MODE

Figure 1A:
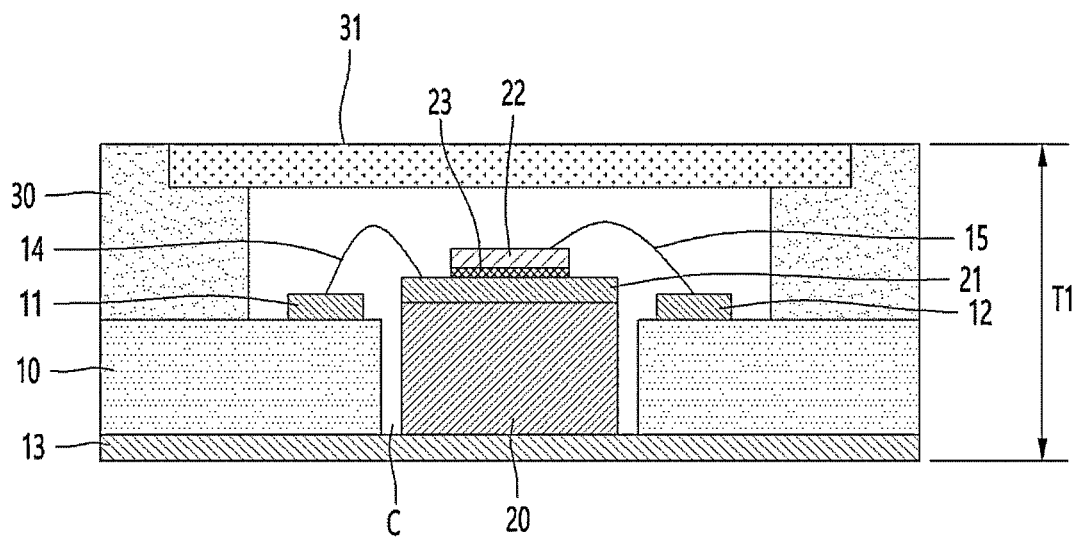
FIG. 1A and FIG. 1B are diagrams illustrating a light emitting package according to a comparative example.

Hereinafter, exemplary embodiments disclosed in the present specification will be described in detail with reference to the accompanying drawings, but identical or similar elements are denoted by the same reference numerals regardless of reference numerals, and redundant descriptions thereof will be omitted. The suffixes "module" and "part" for components used in the following description are given or used interchangeably in consideration of only the ease of preparation of the specification, and do not themselves have a distinct meaning or role. In addition, in describing the embodiments disclosed in the present specification, when it is determined that a detailed description of related known technologies may obscure the subject matter of the embodiments disclosed in the present specification, the detailed description thereof will be omitted. In addition, the accompanying drawings are for easy understanding of the embodiments disclosed in the present specification, and the technical idea disclosed in the present specification is not limited by the accompanying drawings, and all modifications included in the spirit and scope of the present invention It should be understood to include equivalents or substitutes.

Terms including an ordinal number such as first and second may be used to describe various elements, but the elements are not limited by the terms. These terms are used only for the purpose of distinguishing one component from another component.

When a component is referred to as being "connected" or "connected" to another component, it is understood that it may be directly connected or connected to the other component, but other components may exist in the middle. Should be. On the other hand, when a component is referred to as being "directly connected" or "directly connected" to another component, it should be understood that there is no other component in the middle.

Singular expressions include plural expressions unless the context clearly indicates otherwise.

In this application, terms such as "comprises" or "have" are intended to designate the presence of features, numbers, steps, actions, components, parts, or combinations thereof described in the specification, but one or more other features. It is to be understood that the presence or addition of elements or numbers, steps, actions, components, parts, or combinations thereof, does not preclude in advance the possibility.

Hereinafter, exemplary embodiments of the present invention will be described in detail with reference to the accompanying drawings.

A light emitting package according to a comparative example will be described with reference to FIGS. 1A and 1B.

The light emitting package including the vertical cavity type surface-emission laser element 22 requires at least two printed circuit boards to mount the vertical cavity type surface-emission laser element 22.

There may be at least two printed circuit boards included in the light emitting package including the vertical cavity type surface emitting laser element 22 according to the comparative example.

Referring to FIG. 1A, a light emitting package including a vertical cavity type surface-emission laser element 22 according to a comparative example includes a first substrate 10 and a second substrate 20.

The first substrate 10 may be a printed circuit board on which a circuit pattern for signal transmission is disposed. The first substrate 10 may be a printed circuit board on which chips other than the vertical cavity type surface-emission laser element 22 are mounted. For example, the first substrate 10 may be a printed circuit board on which various chips such as other chips, semiconductor devices, sockets, driver IC chips, and light receiving elements other than the vertical cavity type surface-emitting laser element 22.

The second substrate 20 may be a substrate on which the vertical cavity type surface-emission laser element 22 is mounted. The second substrate 20 may be a heat dissipation substrate provided for heat dissipation of the vertical cavity type surface-emitting laser element 22. The second substrate 20 may have different physical properties from the first substrate 10. The vertical cavity type surface-emission laser element 22 emits heat of high temperature, and its operating performance is sensitively changed by the emitted heat. Accordingly, the vertical cavity type surface-emission laser element 22 is mounted on a separate second substrate 20 having excellent heat dissipation performance unlike other chips.

To this end, the second substrate 20 may include a material having high thermal conductivity. Accordingly, the second substrate 20 may be provided with a material having high heat dissipation properties so that heat generated by the vertical cavity type surface-emitting laser element 22 can be efficiently discharged to the outside. For example, the second substrate 20 may include a metal compound. The second substrate 20 may include a metal oxide having a thermal conductivity of 140 W/mK or higher. For example, the second substrate 20 may include aluminum nitride (AlN) or alumina (Al2O3).

That is, the vertical cavity type surface-emission laser element 22 is disposed on the second substrate 20 having high heat dissipation characteristics as sufficient heat is not emitted from the existing first substrate 10. In this case, the vertical cavity type surface-emission laser element 22 is mounted on the connection part 23 disposed on the second substrate 20.

In the first substrate 10, a cavity C into which the second substrate 20 is inserted is formed. Circuit pattern portions 11 and 12 connected to the vertical cavity type surface emitting laser element 22 through a first wire 14 and a second wire 15 are disposed on the upper surface of the first substrate 10 And a metal plate 13 is disposed on the lower surface thereof. In addition, the diffusion part 31 is coupled to the first substrate 10 through a holder 30.

The thickness of the first substrate 10 is smaller than the thickness of the second substrate 20. The first substrate 10 is 200 μm to 250 μm, and the second substrate 20 is 380 μm to 400 μm. Accordingly, in the conventional light emitting package as shown in FIG. 1A, the total thickness T1 including the metal plate (eg, SUS) is 3.56 mm to 4.0 mm.

In this case, the vertical cavity type surface-emission laser element 22 should be spaced apart from the diffusion part 31 by a predetermined distance. Accordingly, in the conventional light emitting package as described above, the thickness of the entire light emitting package is determined by the thickness of the second substrate 20. Here, the second substrate 20 is thicker than the first substrate 10, and the total thickness of the light emitting package is affected by the second substrate 20. Accordingly, the light emitting package according to the comparative example has an increased thickness compared to the light emitting package including only the first substrate 10.

In addition, as described above, the light emitting package according to the comparative example shown in FIG. 1A is manufactured by mounting the second substrate 20 inside the cavity of the first substrate 10. In this case, it is difficult to implement a circuit pattern in the second substrate 20 according to characteristics of a material constituting the substrate.

Accordingly, in a comparative example, after implementing a circuit pattern on a separate first substrate 10, the anode electrode and the cathode electrode of the vertical cavity type surface-emission laser element 22 are connected with the circuit pattern 11, 12 of the first substrate 10 through a wire. According to this comparative example, as the anode electrode and the cathode electrode of the vertical cavity type surface-emission laser element 22 are connected to the first substrate 10 through the separate wire as described above, the signal transmission distance increases, this acts as a loss of a transmission signal due to an increase in inductance.

In addition, in the comparative example, the second substrate 20 is formed of a metal oxide such as aluminum nitride. In addition, this reduces the bonding force with the metal plate 13 disposed under the second substrate, and accordingly, a number of defects occur at the interface between the metal plate 13 and the second substrate 20.

Figure 1B:
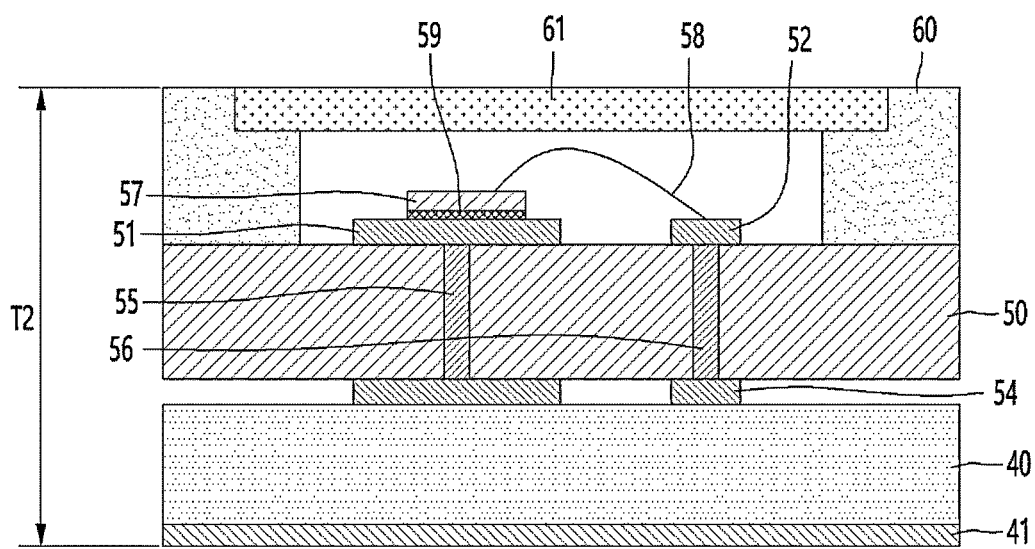

In addition, according to FIG. 1B, the light emitting package according to the comparative example is manufactured by disposing the second substrate 50 on the first substrate 40. The first substrate 40 may include a metal plate 41 under it. The second substrate 50 may include upper circuit patterns 51 and 52, vias 55, and lower circuit patterns 53 and 54. In addition, a vertical cavity type surface-emitting laser element 57 is mounted on the second substrate 50 through a connection part 59. Further, a diffusion part 61 is disposed on the second substrate 50 through a holder 60.

However, in such a light emitting package, the total thickness of the light emitting package is affected by both the thickness of the first substrate 40 and the thickness of the second substrate 50. That is, the thickness T2 of the conventional light emitting package as shown in FIG. 1B was 3.76 mm to 4.2 mm. That is, in the conventional light emitting package as described above, the first substrate 40 and the second substrate 50 are stacked in a vertical direction, and the total thickness of the light emitting package is increased.

In addition, in the light emitting package according to the comparative example, the first substrate 40 and the second substrate 50 are coupled to each other by an adhesive layer (not shown). Accordingly, the light emitting package according to the comparative example has a problem in that the reliability of an electronic device including the adhesive layer is deteriorated due to a poor connection of the adhesive layer. In addition, the adhesive layer increases the total thickness of the light emitting package.

Hereinafter, a light emitting package, a light emitting module, and a camera module including the same according to an embodiment of the present invention will be described.

Figure 2:
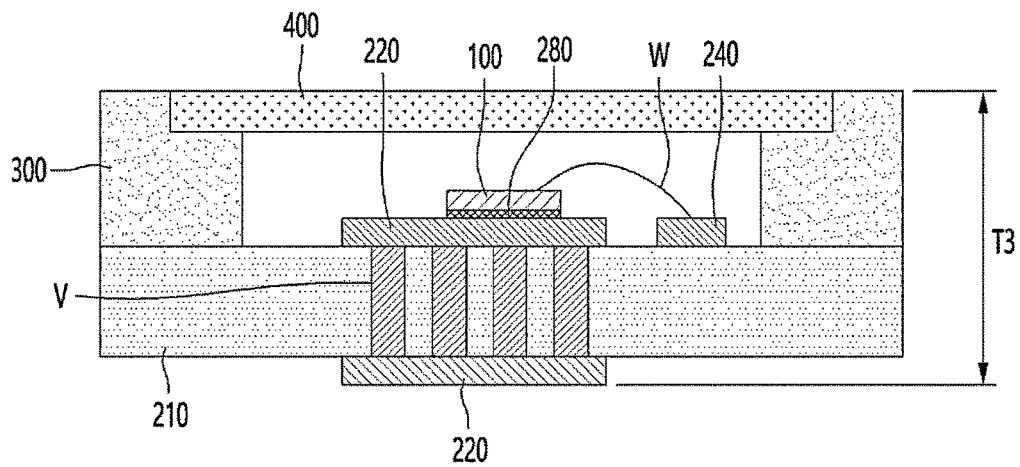
FIG. 2 is a schematic diagram of a light emitting package according to an exemplary embodiment.

FIG. 2 is a schematic diagram of a light emitting package according to an embodiment of the present invention.

Referring to FIG. 2, in the light emitting package according to the embodiment of the present invention, only one printed circuit board may be used to mount the vertical cavity type surface emitting laser element 100. The substrate 210 constituting the light emitting package according to the embodiment may be a rigid-flexible printed circuit board (RFPCB). The substrate 210 constituting the light emitting package according to the embodiment may be a rigid printed circuit board. The substrate 210 constituting the light emitting package according to the embodiment may be a flexible circuit board.

In detail, in the light emitting package according to the embodiment, a vertical cavity type surface-emission laser element 100 and a pattern part 240 connected to the vertical cavity type surface-emission laser element 100 may be disposed on one substrate 210.

The substrate 210 may be a printed circuit board for arranging the vertical cavity type surface-emission laser element 100. In addition, the substrate 210 may be a printed circuit board for arranging the pattern part 240 electrically connected to the vertical cavity type surface-emission laser element 100. In addition, the substrate 210 may be a printed circuit board for arranging various signal lines that transmit signals to the vertical cavity type surface-emission laser element 100 through the pattern part 240.

A thickness of the substrate 210 as described above may be 200 μm to 250 μm. That is, the thickness of the substrate 210 may be substantially the same as the thickness of the first substrate 10 in the comparative example.

In this case, in the present invention, the vertical cavity type surface emitting laser element 100 is disposed on the substrate 210. Accordingly, in the light emitting package according to the embodiment of the present invention, unlike the comparative example, the total thickness of the light emitting package is determined by the thickness of the substrate 210.

Accordingly, in the present invention, the total thickness may be determined by the second substrate in the comparative example, or may be manufactured to be slimmer than a light emitting package in which the total thickness is determined by the respective thicknesses of the first and second substrates.

That is, the light emitting package according to the embodiment of the present invention as shown in FIG. 2 may have a total thickness T3 including a metal plate of 3.1 mm to 3.43 mm smaller than that of T1 and T2.

Accordingly, the total thickness T3 of the light emitting package in the embodiment may have a thickness of 80% to 95% of the thickness T1 of the comparative example of FIG. 1A. For example, the total thickness T3 of the light emitting package in the embodiment may have a thickness of 85% to 90% of the thickness T1 of the comparative example of FIG. 1A.

In addition, the total thickness T3 of the light emitting package in the embodiment may have a thickness of 20% to 50% of the thickness T2 of the comparative example of FIG. 1B. For example, the total thickness T3 of the light emitting package in the embodiment may have a thickness of 25% to 40% of the thickness T2 of the comparative example of FIG. 1B. For example, the total thickness T3 of the light emitting package in the embodiment may have a thickness of 25% to 35% of the thickness T2 of the comparative example of FIG. 1B.

Since the light emitting package including the vertical cavity type surface-emission laser element 100 according to the embodiment requires only one printed circuit board to mount the vertical cavity type surface-emission laser element 100 and arrange a circuit pattern. It is possible to reduce the total thickness of the light emitting package. In detail, in the light emitting package according to the embodiment, the heat dissipation substrate (the second substrate) including aluminum nitride may be removed, and thus the total thickness of the light emitting package may be reduced.

In addition, in the light emitting package including the vertical cavity type surface-emitting laser element 100 according to the embodiment, the adhesive layer between the first substrate and the second substrate can be omitted, thereby solving the problem due to poor adhesion of the adhesive layer. Therefore, the reliability of the light emitting package can be improved.

In addition, in the light emitting package including the vertical cavity type surface emitting laser element 100 according to the embodiment, since the signal is transmitted on one substrate 210, the signal transmission distance and signal loss can be minimized. Specifically, conventionally, a signal is transmitted between the first substrate and the second substrate, or a signal is transmitted between the cathode electrode and the anode electrode through a wire, thereby increasing the signal transmission distance. On the other hand, an embodiment according to the present invention, the vertical cavity type surface-emission laser element 100 and the circuit patterns are mounted and arranged on the one substrate 210, and at least one of a cathode electrode and an anode electrode of the vertical cavity type surface emission laser element is not connected via wire, and thereby the signal transmission distance can be drastically reduced.

In addition, the light emitting package including the vertical cavity type surface-emitting laser element 100 according to the embodiment may be manufactured in a single process. thereby, the embodiment can improve process efficiency and product yield compared to those in which the first and second substrates were respectively manufactured by separate processes in the prior art.

A holder 300 is disposed on the substrate 210. Further, a diffusion part 400 is disposed on the holder 300 to cover an upper region of the vertical cavity type surface-emission laser element 100. The diffusion part 400 may inhibit the light from being directly exposed to the user while diffusing the light generated from the vertical cavity type surface-emission laser element 100.

A pad 220 is disposed on the surface of the substrate 210, in an area vertically overlapping the area where the vertical cavity type surface emitting laser element 100 is disposed. When the substrate 210 is formed of at least two or more insulating layers, the pads 220 may be formed on each insulating layer.

In this case, the vertical cavity type surface-emission laser element 100 is disposed on an uppermost pad 220 disposed among the pads 220. That is, the uppermost pad 220 is a mounting pad on which the vertical cavity type surface-emission laser element 100 is mounted.

In addition, vias V for electrically connecting the pads 220 disposed in different layers are disposed in the substrate 210. In this case, a plurality of vias may be disposed in the substrate 210.

At this time, the plurality of vias include a signal transmission via electrically connecting circuit patterns of different layers to each other, and a heat dissipation via for discharging heat generated from the vertical cavity type surface emitting laser element 100 to the outside. In addition, the heat dissipation via may be positioned on a region overlapping the pad 220 in a vertical direction, based on a region where the pad 220 is disposed. That is, the connection part 280 is disposed on the uppermost pad 220, and the vertical cavity type surface-emission laser element 100 is mounted on the uppermost pad 220 through the connection part 280.

In addition, the heat dissipation via V is disposed between the uppermost pad 220 and the lowermost pad 220. In this case, the heat dissipation via V is positioned on a region overlapping the uppermost pad 220 in a vertical direction, and thus heat transferred through the uppermost pad 220 may be discharged to the outside.

At this time, the general heat dissipation vias are disposed in the printed circuit board only for the purpose of heat transfer.

On the other hand, in the present invention, not only the heat transfer function but also a signal transfer function can be performed. That is, the heat dissipation via V may be electrically connected to the vertical cavity type surface emitting laser element 100. Preferably, the heat dissipation via V may be electrically connected to a cathode electrode of the vertical cavity type surface-emission laser element 100. This will be described in detail below.

In this case, the heat dissipation via V may include a plurality of via parts VP spaced apart from each other in a first direction within the substrate 210. In FIG. 2, it is shown that the heat dissipation via V is composed of four via parts VP spaced apart a predetermined distance in the first direction. The first direction may be a horizontal direction (or an X-axis direction) of the upper surface of the substrate 210. However, the number of via parts VP may be proportional to the area of the pad 220. That is, the number of via parts may be increased or decreased to increase or decrease the area of the via parts VP.

In addition, each via part VP constituting the heat dissipation via V may have a bar shape extending in a second direction perpendicular to the first direction. That is, in general, a conventional via has a circular shape in a horizontal cross section. In this case, the conventional via has a width in the first direction and a width in the second direction substantially the same.

Differently, the width in the first direction of each of the via parts VP is different from the width in the second direction. For example, a width of each of the via parts VP in the first direction may be smaller than a width in the second direction. For example, the width of each via part in the first direction may be about half of the width in the second direction. For example, the width of each via part in the first direction may be about ¼ of the width in the second direction. In other words, the width of each via part in the second direction may have at least twice the width of the first direction. In other words, the width of each via part in the second direction may have at least 4 times or more of the width in the first direction.

As described above, since the width in the second direction is larger than the width in the first direction, the area of the heat dissipation via can be increased, so that more heat generated from the vertical cavity type surface emitting laser element can be radiated to the outside. Specifically, in the present invention, a heat dissipation via (V) is disposed in a bar shape on an area overlapping with the pad 220, and the vertical cavity type surface emitting laser element 100 is provided through the disposed heat dissipation via (V). By allowing the heat generated from to be radiated to the outside, heat dissipation of the vertical cavity type surface-emission laser element 100 may be improved.

Hereinafter, with reference to the accompanying drawings, a light emitting package, a light emitting module, and a camera module including the same according to an embodiment of the present invention will be described in detail.

Figure 3:
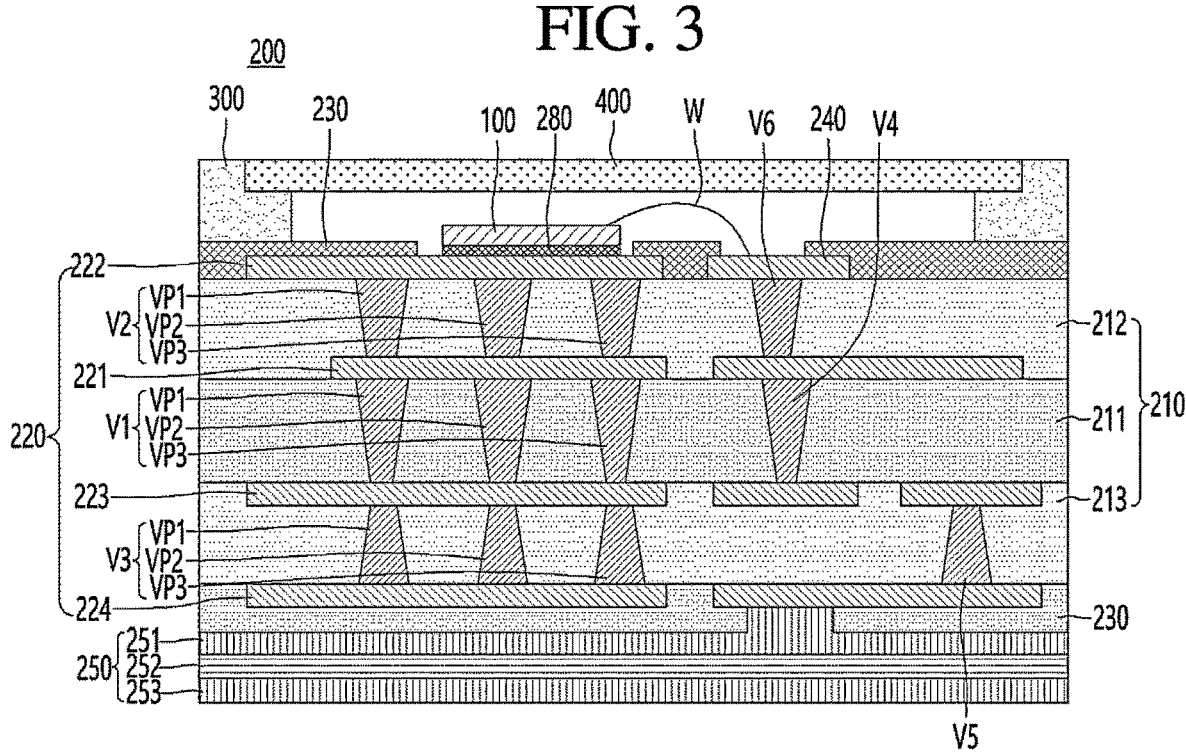
FIG. 3 is a diagram specifically showing a light emitting package according to an exemplary embodiment.
Figure 4:
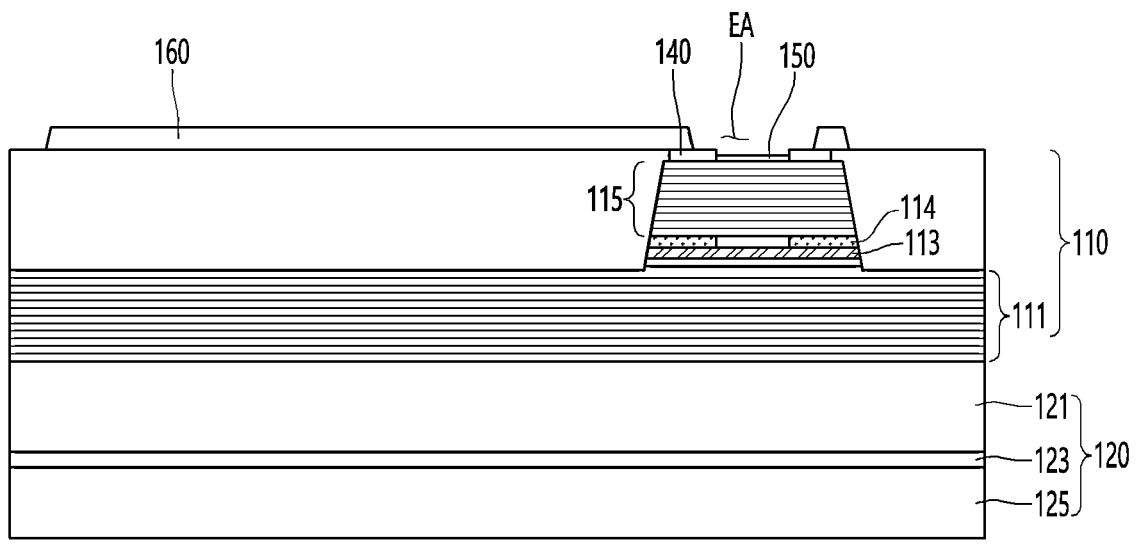
FIG. 4 is a view showing the vertical cavity type surface emitting laser element shown in FIG. 3.
Figure 5:
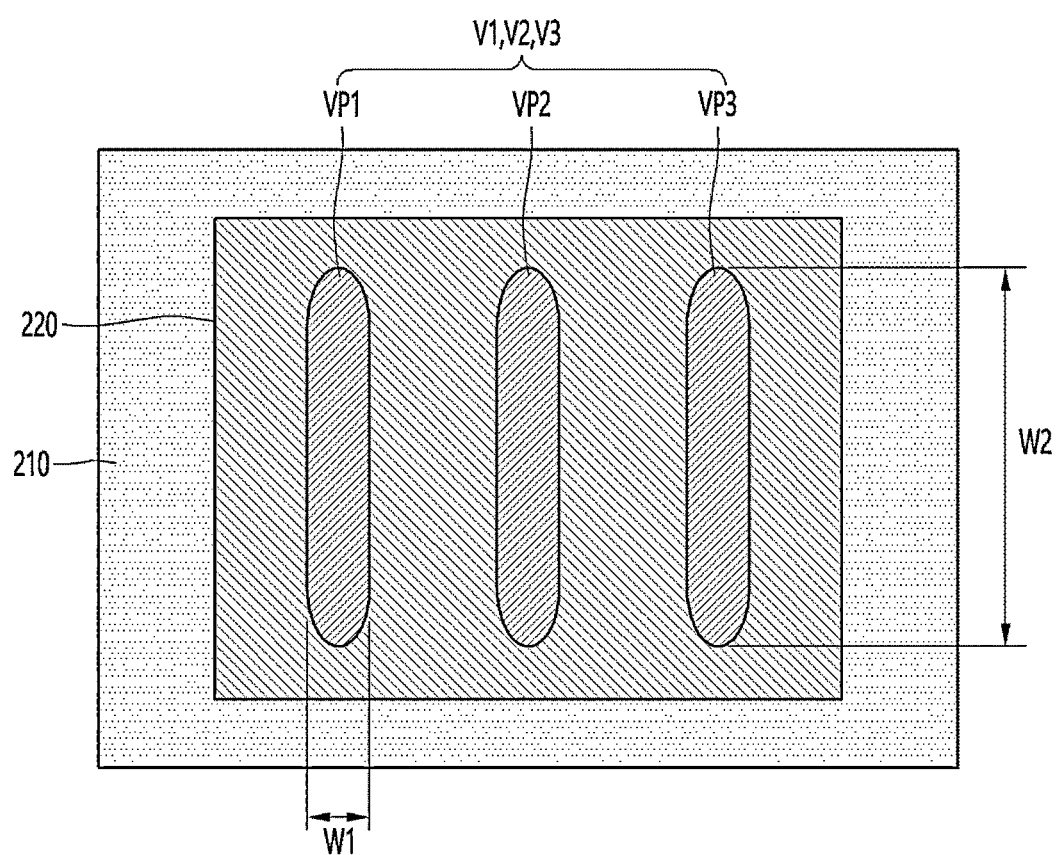
FIG. 5 is a plan view of the via part shown in FIG. 3.
Figure 6:
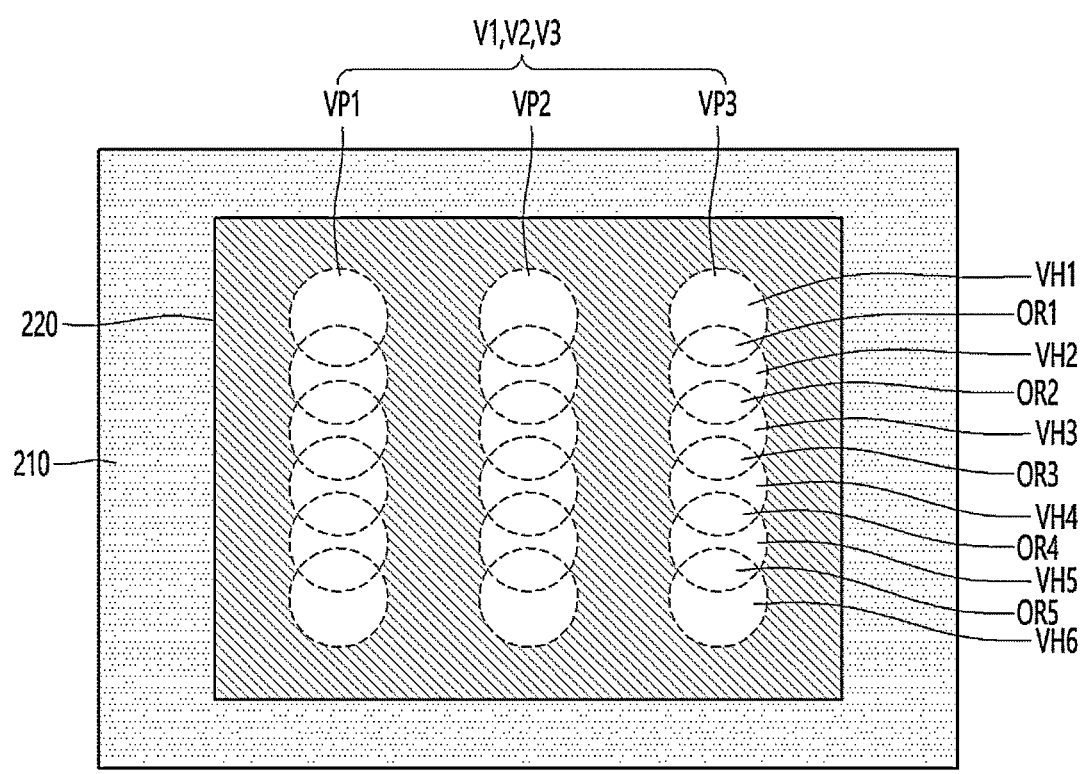
FIG. 6 is a plan view illustrating a detailed configuration of a via part according to an exemplary embodiment.
Figure 7A:
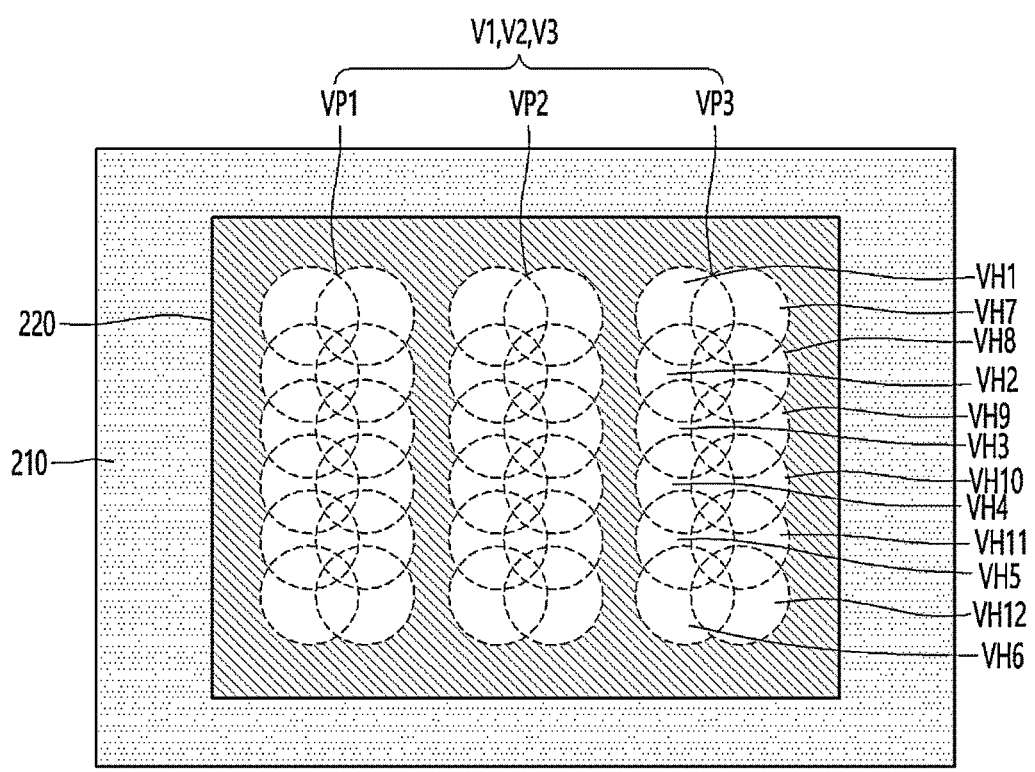
FIGS. 7A and 7B are plan views showing a detailed configuration of a via part according to another exemplary embodiment.
Figure 7B:
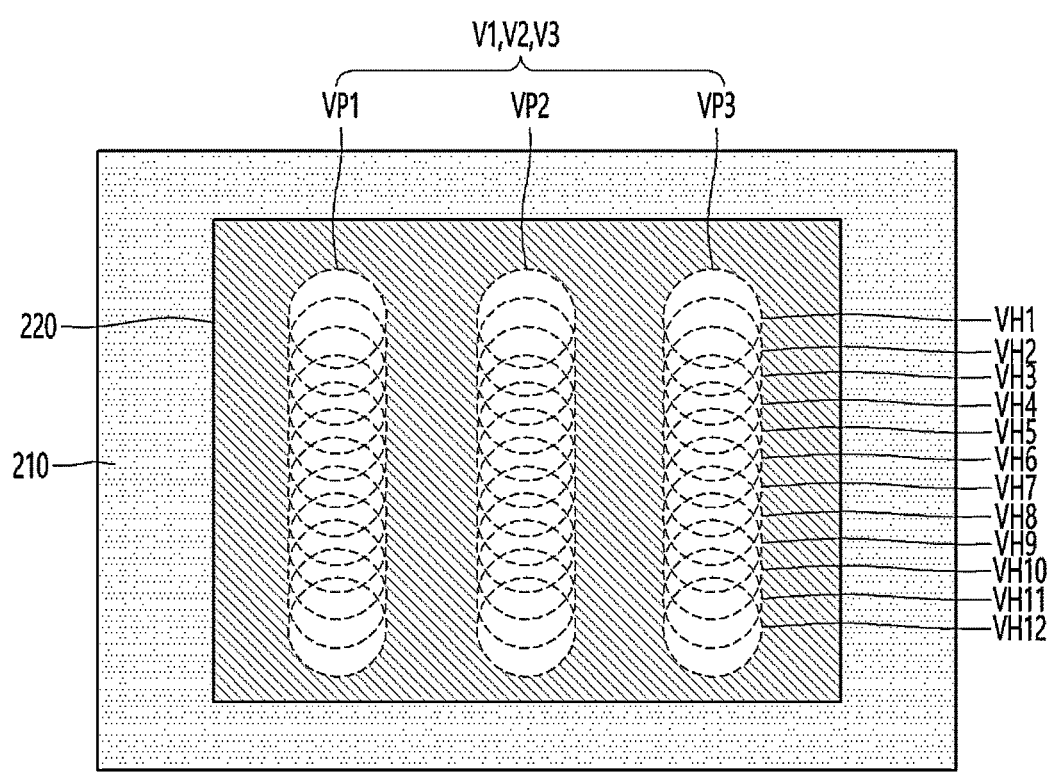

FIG. 3 is a view showing a light emitting package according to an embodiment of the present invention, FIG. 4 is a view showing the vertical cavity type surface emitting laser element 100 shown in FIG. 3, and FIG. 5 is a view of the via shown in FIG. 3, FIG. 6 is a plan view showing a detailed configuration of a via according to an embodiment of the present invention, and FIGS. 7A and 7B are plan views showing a detailed configuration of a via according to another embodiment of the present invention.

Referring to FIGS. 3 to 7B, the light emitting package 200 includes a vertical cavity type surface emitting laser element 100, a substrate 210, a pad 220, a via (V1, V2, V3, V4, V5), and a protective layer 230, an electrode pattern 240, a protective part 250, a connection member (Wire, W), a holder 300, and a diffusion part 400.

The substrate 210 may have a flat plate structure. The substrate 210 may be a printed circuit board (PCB). Here, the substrate 210 may be implemented as a double-sided substrate including a single insulating layer, and may be implemented as a multilayer substrate in which a plurality of insulating layers are successively stacked.

Preferably, the substrate 210 may include a plurality of insulating layers 211, 212, and 213. The plurality of insulating layers 211, 212, 213 may have a first insulating layer 211 disposed in a center, and a second insulating layer 212 disposed on the first insulating layer 211, and a third insulating layer 213 disposed under the first insulating layer 211. Accordingly, the substrate 210 in the present invention may be configured as 4 layers based on the circuit pattern layer. However, this is only an embodiment of the present invention, and the circuit pattern layer may be composed of two layers (single insulating layer), and differently, may be composed of six or more layers. Hereinafter, for convenience of description, it will be described that the substrate 210 includes three insulating layers, and accordingly, four circuit pattern layers are implemented on the substrate 210.

The plurality of insulating layers 211, 212, 213 is a board on which an electric circuit capable of changing wiring is disposed, and a printed material made of an insulating material capable of forming a circuit pattern layer on the surface thereof, a wiring board and an insulating board may all be included in this.

The plurality of insulating layers 211, 212, 213 may be rigid or flexible. The plurality of insulating layers 211, 212, 213 may be rigid or flexible. For example, the insulating layer 110 may include glass or plastic. Specifically, the insulating layer 211, 212, 213 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, the insulating layers 211, 212, 213 may include an optically isotropic film. As an example, the insulating layers 211, 212, 213 may include cyclic olefin copolymer (COC), cyclic olefin polymer (COP), optically isotropic PC, optically isotropic polymethylmethacrylate (PMMA), or the like.

In addition, the insulating layers 211, 212, 213 may be partially bent while having a curved surface. That is, the insulating layers 211, 212, 213 may partially have a plane and may partially be bent while having a curved surface. Specifically, an end portion of the insulating layer 211, 212, 213 may be bent while having a curved surface, or bent or crooked while having a surface with a random curvature.

Further, the substrate 210 including the plurality of insulating layers 211, 212, 213 may be a flexible substrate having flexibility. In addition, the substrate 210 including the plurality of insulating layers 211, 212, 213 may be a curved or bent substrate.

Meanwhile, each of the plurality of insulating layers 211, 212, and 213 as described above may be formed of different materials. Preferably, the first insulating layer 211 disposed in the center may be flexible. In addition, the second insulating layer 212 and the third insulating layer 213 respectively disposed above and below the first insulating layer 211 may be rigid.

Circuit pattern layers are disposed on the surfaces of the plurality of insulating layers 211, 212, 213, respectively. In this case, the circuit pattern layer includes a pad 220 positioned on a region overlapping a region in which the vertical cavity type surface-emission laser element 100 is disposed, and an electrode pattern 240 connected to an anode electrode of the vertical cavity type surface-emission laser element 100 through the connection member W.

The circuit pattern layer is a wiring for transmitting an electrical signal, and may be formed of a metal material having high electrical conductivity. For this, the circuit pattern layer may be formed of at least one metal material selected from among gold (Au), silver (Ag), platinum (Pt), titanium (Ti), tin (Sn), copper (Cu), and zinc (Zn). In addition, the circuit pattern layer may be formed of past or solder paste including at least one selected from gold (Au), silver (Ag), platinum (Pt), titanium (Ti), tin (Sn), copper (Cu), and zinc (Zn), which are excellent in bonding strength. It may be formed of a paste or solder paste including a metallic material of. Preferably, the circuit pattern layer may be formed of copper (Cu) having high electrical conductivity and a relatively low cost. In addition, the circuit pattern layer may be increase electrical conductivity or improve the bonding strength by plating formed of at least one selected from gold (Au), silver (Ag), platinum (Pt), nickel (Ni) and palladium (Pd) on a metal (eg, copper) having high electrical conductivity.

The circuit pattern layer can be formed by a conventional printed circuit board manufacturing process, such as additive process, subtractive process, modified semi-additive process (MSAP) and semi-additive process (SAP). Here, detailed description is omitted.

The circuit pattern layer includes the pad 220. The pad 220 includes a first pad 221 disposed on an upper surface of the first insulating layer 211, a second pad 222 disposed on an upper surface of the second insulating layer, and a third pad 223 on a lower surface of the first insulating layer 211 and a fourth pad 224 disposed on a lower surface of the third insulating layer 213.

The first to fourth pads 221, 222, 223, 224 are formed on a surface of the plurality of insulating layers 211, 212, 213 overlapping in a vertical direction with an area in which the vertical cavity type surface emitting laser element 100 is disposed. The first to fourth pads 221, 222, 223, and 224 may have a larger surface area than that of the vertical cavity type surface-emission laser element 100.

Preferably, the vertical cavity type surface-emission laser element 100 may have a first horizontal width of 660 μm and a second horizontal width of 720 μm. In this case, the first horizontal width may be a horizontal width in the X-axis direction of the vertical cavity type surface-emission laser element 100, and the second horizontal width may be a horizontal width in the Y-axis direction of the vertical cavity type surface-emission laser element 100. Hereinafter, a linear distance in the X-axis direction is referred to as a first horizontal width, and a linear distance in the Y-axis direction is referred to as a second horizontal width.

Meanwhile, a lowermost layer of the vertical cavity type surface-emission laser element 100 constitutes an electrode part. In addition, the electrode part is disposed on the second pad 222. In this case, a first horizontal width of the electrode part may be 600 μm, and a second horizontal width of the electrode part may be 670 μm. This will be described in detail below.

Meanwhile, each of the first to fourth pads 221, 222, 223, and 224 may have different horizontal widths. Preferably, each of the first horizontal width and the second horizontal width of the second to fourth pads 222, 223, and 224 may be the same. In addition, the first horizontal width and the second horizontal width of the first pad 221 may be smaller than the first and second horizontal widths of each of the second to fourth pads.

The first pad 221 may have a first horizontal width of 800 μm and a second horizontal width of 900 μm. That is, on the upper surface of the first insulating layer 211 on which the first pad 221 is disposed, in addition to the vertical cavity type surface emitting laser element 100, a circuit pattern layer for connection with an additional chip may be disposed. In addition, a circuit pattern layer connecting between an external device and the light emitting package 200 may be disposed on the upper surface of the first insulating layer 211. Accordingly, the first pad 211 disposed on the upper surface of the first insulating layer 211 may have first and second horizontal widths smaller than those of the second to fourth pads 222, 223, and 224. have. In addition, the first insulating layer 211 may be a flexible substrate, and the second insulating layer disposed on the upper and lower surfaces of the first insulating layer 211 may be a rigid substrate.

In addition, each of the second to fourth pads 222, 223, and 224 may have a first horizontal width of 1500 μm and a second horizontal width of 1600 μm.

A connection part 280 is disposed on the second pad 222 among the first to fourth pads 221, 222, 223 and 224. For example, the connection part 280 may be a metal paste. For example, the connection part 280 may be a silver (Ag) paste. In addition, the vertical cavity type surface emitting laser element 100 is disposed on the connection part 280. That is, the vertical cavity type surface-emission laser element 100 may be mounted on the second pad 222 through the connection part 280. Accordingly, the second pad 222 may be referred to as a mounting pad for mounting the vertical cavity type surface-emission laser element 100.

In this case, the second pad 222 in the present invention may have a surface area of at least 1.2 times or more than a surface area of the vertical cavity type surface-emission laser element 100. In the present invention, the second pad 222 may have a surface area of at least 1.5 times or more than the surface area of the vertical cavity type surface-emission laser element 100. In the present invention, the second pad 222 may have a surface area of at least twice that of the vertical cavity type surface-emitting laser element 100. In the present invention, the second pad 222 may have a surface area of at least 2.5 times that of the vertical cavity type surface-emission laser element 100.

That is, the second pad 222 provides a mounting area in which the vertical cavity type surface-emission laser element 100 is mounted. In addition, the second pad 222 may be provided to transfer heat generated from the vertical cavity type surface-emission laser element 100 to a lower portion through the via V. Accordingly, the second pad 222 may have a surface area of 150% to 300% of the surface area of the vertical cavity type surface emitting laser element 100. At this time, if the surface area of the second pad 222 is less than 150% of the surface area of the vertical cavity type surface-emission laser element 100, there is a problem in that the heat emission performance of the vertical cavity type surface emitting laser element 100 decreases. In addition, if the surface area of the second pad 222 is greater than 300% of the surface area of the vertical cavity type surface emitting laser element 100, there is a problem in that the total volume of the light emitting package increases due to an increase in the space occupied by the second pad 222.

Meanwhile, the first to fourth pads 221, 222, 223, and 224 may be disposed on regions overlapping in the vertical direction, respectively. In other words, the first to fourth pads 221, 222, 223, and 224 may be vertically aligned and positioned on the surfaces of the plurality of insulating layers 211, 212, and 213. In other words, the first to fourth pads 221, 222, 223, and 224 may be aligned and positioned on a region overlapping the vertical cavity type surface-emission laser element 100 in a vertical direction.

Meanwhile, a plurality of vias V1, V2, V3, V4, and V5 are disposed in the plurality of insulating layers 211, 212, 213. A second via group V4 and V5 among the plurality of vias V1, V2, V3, V4, and V5 are through vias disposed for signal transmission between different layers, and a first via group V1, V2, V3 is a heat dissipation via that emits heat generated from the vertical cavity type surface-emission laser element 100 to the outside. Accordingly, the first via group V1, V2, and V3 may include heat dissipation vias. In this case, the first via group V1, V2, and V3 do not only perform a heat dissipation function, but may also perform a signal transmission function by being electrically connected to the vertical cavity type surface-emission laser element 100. In other words, the first via group V1, V2, and V3 are electrically connected to an electrode part (more specifically, a cathode electrode) disposed at the lowermost portion of the vertical cavity type surface-emission laser element 100.

The first to third vias V1, V2, and V3 constituting the first via group V1, V2, and V3 are formed through the plurality of insulating layers 211, 212, and 213, respectively.

Preferably, the first via V1 is formed through the first insulating layer 211. The second via V2 is formed through the second insulating layer 212. In addition, the third via V3 is formed through the third insulating layer 213. In addition, the first to third vias V3 may directly contact with at least one of the first to fourth pads 221, 222, 223, and 224.

In other words, an upper surface of the first via V1 may directly contact a lower surface of the first pad 221 and a lower surface of the first via V1 may directly contact an upper surface of the third pad 223. In addition, an upper surface of the second via V2 may directly contact a lower surface of the second pad 222 and a lower surface of the second via V2 may directly contact an upper surface of the first pad 221. An upper surface of the third via V3 may directly contact a lower surface of the third pad 223, and a lower surface of the third via V3 may directly contact an upper surface of the fourth pad 224.

Each of the first to third vias V1, V2, and V3 may include a plurality of via parts VP spaced apart from each other in a first direction. That is, each of the first to third vias V1, V2, and V3 includes first to third via parts VP1, VP2, and VP3 spaced apart from each other in the plurality of insulating layers 211, 212, 213. In the present exemplary embodiment, the first to third via parts VP1, VP2, and VP3 will be described as being spaced apart in the first direction. However, the spaced apart direction may be a second direction perpendicular to the first direction, a diagonal direction of the first direction, or a direction oblique to the first direction, not the first direction. In addition, although the first to third via parts VP1, VP2, and VP3 are described in the present invention, 10 or fewer via parts may be formed.

The first direction may be a horizontal direction (or an X-axis direction) of an upper surface of each of the plurality of insulating layers 211, 212, 213. In this case, the drawings show that the first to third vias V1, V2, and V3 are each composed of three via parts, but this is only an embodiment of the present invention, and via parts constituting each of the vias (a number of VP) could be further increased.

In addition, each of the first to third via parts VP1, VP2 and VP3 connected to the first to fourth pads 221, 222, 223, and 224 has a bar shape extending in a second direction perpendicular to the first direction. That is, in general, a conventional via has a circular shape in a horizontal cross section. In this case, the conventional via has a width in the first direction and a width in the second direction substantially the same. The directions in which the first to third via parts VP1, VP2, and VP3 are respectively extended include a first direction perpendicular to the second direction, a diagonal direction of the second direction, and an oblique direction to the second direction and random direction as well as the second direction described above. In addition, the first to third via parts (VP1, VP2, VP3) has a straight bar, a curvature bar, or a zigzag bar according to the extending direction, a wider thereby, it can be formed to have width than the conventional circular via.

In addition, a width (length) of the first to third via parts VP1, VP2, and VP3 in a long axis direction may be greater than a thickness of each of the first to third via parts VP1, VP2, and VP3. This can increase the heat dissipation effect by increasing the volume of the via.

In contrast, a width in the first direction (also referred to as a first horizontal width) of each of the via parts VP1, VP2, VP3 has a width in the first direction (also referred to as a first horizontal width) is different from a width in the second direction (also referred to as a second horizontal width). For example, a width of each of the via parts VP1, VP2, and VP3 in the first direction may be smaller than a width in the second direction. For example, the width of each of the via parts VP1, VP2, and VP3 in the first direction may be about half of the width in the second direction. For example, a width of each of the via parts VP1, VP2, and VP3 in the first direction may be about ¼ of the width in the second direction. In other words, the width of each via part in the second direction may have at least twice the width of the first direction. In other words, the width of each via part in the second direction may have at least 4 times or more of the width in the first direction. More preferably, the width of each of the via parts in the second direction may have a range of at least 9 to 15 times the width in the first direction.

That is, the first horizontal width of each of the via parts VP1, VP2, and VP3 may be 10 μm to 150 μm. In addition, the second horizontal width of each of the via parts VP1, VP2, and VP3 may be 20 μm to 2000 μm. In addition, the second horizontal width of each of the via parts VP1, VP2, and VP3 may be 200 μm to 1700 μm. In addition, the second horizontal width of each of the via parts VP1, VP2, and VP3 may be 400 μm to 1500 μm. In addition, the thickness of each of the via parts VP1, VP2, and VP3 may be 50 μm to 60 μm. For example, the thickness of each of the via parts VP1, VP2, and VP3 may be 55 μm.

In the present invention, as described above, each of the via parts VP1, VP2, and VP3 may have a bar shape that extends in the second direction, thereby improving heat dissipation characteristics within a limited area.

That is, a general via has a circular shape in which the first horizontal width and the second horizontal width are the same. Accordingly, the general via may be limitedly formed within a limited area. In other words, in the circular via, the upper surface of the via must be disposed at a position spaced from the edge region of the lower surface of the pad at a predetermined interval, and each via must be disposed at a predetermined distance from each other. Accordingly, conventionally, it has a smaller area than the bar-shaped via of the present invention within a limited area. In this case, heat generated by the vertical cavity type surface-emitting laser element 100 cannot be efficiently discharged, and thus heat dissipation characteristics are deteriorated. Accordingly, in the present invention, as described above, each via part (VP1, VP2, VP3) has a bar shape elongated in the second direction, thereby maximizing heat dissipation characteristics within a limited arrangement area. have.

Preferably, the surface area of the first to third vias (V1, V2, V3) including the via parts (VP1, VP2, VP3) may be determined by a surface area of the second pad 222 on which the vertical cavity type surface emitting laser element 100 is mounted. In this case, the surface area of each of the first to third vias V1, V2, and V3 may be an upper surface or a lower surface. In this case, the first to third vias V1, V2, and V3 have a trapezoidal shape, and accordingly, an upper surface area and a lower surface area of each of the first to third vias (V1, V2, V3) are different each other, the surface area of the first to third vias V1, V2, and V3 may mean a larger area among the upper surface area and the lower surface area.

Each of the first to third vias V1, V2, and V3 may have the surface area of at least 10% or more of the surface area of the second pad 222. For example, the surface area of each of the first to third vias V1, V2, and V3 may have at least 15% or more of the surface area of the second pad 222. For example, the surface area of each of the first to third vias V1, V2, and V3 may have at least 20% or more of the surface area of the second pad 222. For example, the surface areas of each of the first to third vias V1, V2, and V3 may have at least 30% or more of the surface area of the second pad 222. For example, the surface area of each of the first to third vias V1, V2, and V3 may have at least 40% or more of the surface area of the second pad 222. For example, the surface area of each of the first to third vias V1, V2, and V3 may have at least 50% or more of the surface area of the second pad 222. For example, the surface area of each of the first to third vias V1, V2, and V3 may be 60% or less of the surface area of the second pad 222. For example, the surface area of each of the first to third vias V1, V2, and V3 may be 75% or less of the surface area of the second pad 222.

At this time, if the surface area of each of the first to third vias V1, V2, and V3 is less than 10% of the surface area of the second pad 222, the heat generated from the vertical cavity type surface emitting laser element 100 cannot be released efficiently. In addition, if the surface area of the first to third vias V1, V2, V3 is greater than at least 75% of the surface area of the second pad 222, a part of each of the first to third vias V1, V2, V3 does not overlap (or may not be aligned) with the lower surface of the second pad 222, and thereby degrades the reliability of the via. In addition, if the surface area of the first to third vias V1, V2, V3 is greater than at least 75% of the surface area of the second pad 222, the gap between the plurality of via parts constituting each via becomes narrower, thereby, side surfaces of each via part are connected to each other, and the via area is widened. Accordingly, when filling the conductive material inside the via, since the conductive material is filled lower than the substrate, it is difficult to form the pad flat. For this reason, a reliability problem of disconnection (no current passing through) may occur when a device such as a vertical cavity type surface emitting laser is mounted.

In addition, a part of each of the first to third vias V1, V2, and V3 may overlap with the vertical cavity type surface-emitting laser element 100 in a vertical direction.

In this case, a surface of each of the first to third vias V1, V2, and V3 may include an overlapping region overlapping a lower surface of the vertical cavity type surface-emission laser element 100. In this case, the surface area of the overlapping area of each of the first to third vias V1, V2, and V3 may be 10% or more of the surface area of the vertical cavity type surface-emission laser element 100. Here, the surface area of the overlapping region may be an area of a surface having a larger area among an upper surface and a lower surface of each of the vias. For example, the overlapping area of each of the first to third vias V1, V2, and V3 may be 15% or more of the surface area of the vertical cavity type surface-emission laser element 100. For example, the overlapping area of each of the first to third vias V1, V2, and V3 may be 20% or more of the surface area of the vertical cavity type surface-emission laser element 100. For example, the overlapping area of each of the first to third vias V1, V2, and V3 may be 30% or more of the surface area of the vertical cavity type surface-emission laser element 100. For example, the overlapping area of each of the first to third vias V1, V2, and V3 may be 40% or more of the surface area of the vertical cavity type surface-emission laser element 100. For example, the overlapping area of each of the first to third vias V1, V2, and V3 may be 50% or more of the surface area of the vertical cavity type surface-emission laser element 100. For example, the overlapping area of each of the first to third vias V1, V2, and V3 may be 60% or more of the surface area of the vertical cavity type surface-emission laser element 100.

Accordingly, the light emitting package 200 according to the present invention may be manufactured to be slimmer than the light emitting package of the comparative example in which the total thickness is determined by the substrate 210.

Since the light emitting package including the vertical cavity type surface-emitting laser element 100 according to the embodiment requires only one substrate for mounting the vertical cavity type surface-emitting laser element 100 and arranging the circuit pattern layer, the total thickness of the light emitting package can be reduced. In detail, the light emitting package according to the embodiment may remove the heat dissipation substrate (the second substrate of the comparative example) including aluminum nitride.

In addition, in the light emitting package including the vertical cavity type surface-emitting laser element 100 according to the embodiment, the adhesive layer between the first substrate and the second substrate can be omitted, thereby solving the problem due to poor adhesion of the adhesive layer. Therefore, the reliability of the light emitting package can be improved.

In addition, in the light emitting package including the vertical cavity type surface emitting laser element 100 according to the embodiment, since the signal is transmitted on one substrate 210, the signal transmission distance and signal loss can be minimized. Specifically, conventionally, a signal is transmitted between the first substrate and the second substrate, or a signal is transmitted between the cathode electrode and the anode electrode through a wire, thereby increasing the signal transmission distance. On the other hand, an embodiment according to the present invention, the vertical cavity type surface-emission laser element 100 and the circuit patterns are mounted and arranged on the one substrate 210, thereby the signal transmission distance can be drastically reduced. Specifically, in the present invention, when the substrate is connected to the cathode of the vertical cavity type surface-emitting laser element, signal transmission is performed through the additional connection without wire bonding, thereby minimizing signal loss.

In addition, the light emitting package including the vertical cavity type surface-emitting laser element 100 according to the embodiment can be manufactured in a single process (that is, a process of manufacturing one substrate), and thereby, the embodiment can improve process efficiency and product yield compared to those in which the first and second substrates were respectively manufactured by separate processes in the prior art.

Meanwhile, a protective layer 230 is disposed on the uppermost and lowermost portions of the substrate 210. The protective layer 230 is formed to protect the surfaces of the insulating layers 211, 212, 213 or the circuit pattern layer. Preferably, the protective layer 230 may be a resist layer. For example, the protective layer 230 may be a solder resist layer including an organic polymer material. For example, the protective layer 230 may include an epoxy acrylate-based resin. In detail, the protective layer 230 may include a resin, a curing agent, a photoinitiator, a pigment, a solvent, a filler, an additive, an acrylic monomer, and the like. However, the exemplary embodiment is not limited thereto, and the protective layer 230 may be any one of a photo-solder resist layer, a cover-lay, and a polymer material.

A thickness of the protective layer 230 may be 1 μm to 20 μm. The thickness of the protective layer 230 may be 1 μm to 15 μm. For example, the thickness of the protective layer 230 may be 5 μm to 20 μm. When the thickness of the protective layer 230 is more than 20 μm, the total thickness of the light emitting package may increase. When the thickness of the protective layer 230 is less than 1 μm, reliability of the circuit pattern layer included in the light emitting package may be deteriorated.

The protective layer 230 exposes a surface of at least one circuit pattern layer among the circuit pattern layers. In this case, the protective layer 230 includes an upper protective layer 230 disposed on the second insulating layer 212 and a lower protective layer 230 disposed under the third insulating layers 211, 212 and 213.

In addition, the upper protective layer 230 may expose the vertical cavity type surface-emission laser element 100 mounted on the second insulating layer 212 and the electrode pattern 240. Also, the circuit pattern layer disposed on the second insulating layer 212 may include a ground region for ground, and the upper protective layer 230 may expose the ground region.

In addition, the lower protective layer 230 may be disposed while exposing a ground area for ground among the circuit pattern layer disposed on the lower surface of the third insulating layer 213.

In addition, a protective part 250 may be disposed under the lower protective layer 230.

The protective part 250 may be entirely formed on the lower surface of the lower protective layer 230 including the ground area exposed through the lower protective layer 230.

In this case, the protective part 250 may include a shielding layer 251 disposed under a lower surface of the lower protective layer 230 and the ground area exposed through the lower protective layer 230. The shielding layer 251 may be a shielding layer that shields Electro Magnetic Interference (EMI).

An adhesive layer 252 may be disposed on a lower surface of the shielding layer 251. The adhesive layer 252 may be disposed under the shielding layer 251 for attaching the metal plate 253. The metal plate 253 may be a sus (SUS). The metal plate 253 may have a thickness of 100 μm.

Meanwhile, a holder 300 is disposed on the upper protective layer 230. In this case, an adhesive layer (not shown) may be disposed between the upper protective layer 230 and the holder 300, and the holder 300 may be stably attached to the upper protective layer 230.

In this case, the holder 300 includes a seating part on which the diffusion part 400 is seated while exposing the upper region of the vertical cavity type surface-emission laser element 100. In addition, a diffusion part 400 is disposed on the seating part to cover an upper region of the vertical cavity type surface-emission laser element 100. The diffusion part 400 may be referred to as a diffuser.

In the embodiment of the present invention as described above, vias V1, V2, and V3 including a plurality of via parts having a bar shape are formed under the pad 220 on which the vertical cavity type surface emitting laser element 100 is disposed. The plurality of vias V1, V2, and V3 transfer heat generated from the vertical cavity type surface-emission laser element 100 to the outside from a lower portion of the vertical cavity type surface-emission laser element 100. In this case, the plurality of vias V1, V2, and V3 have a larger area that can be formed in the same space than the conventional circular vias, and thus emission characteristics can be improved.

Hereinafter, a layer structure of the vertical cavity type surface-emission laser element 100 and a plurality of via parts VP1, VP2, VP3 each constituting the vias V1, V2, and V3 will be described in detail.

FIG. 4 is a diagram illustrating a vertical cavity type surface emitting laser element 100 according to an embodiment of the present invention.

As shown in FIG. 4, the light emitting element included in the light emitting package according to the embodiment of the present invention may be a vertical cavity type surface emitting laser element 100 (VCSEL).

The vertical cavity type surface-emission laser element 100 may include a light emitting structure 110 and first and second electrodes 120 and 160.

The first electrode 120 may include an adhesive layer 121, a substrate 123, and a first conductive layer 125. The adhesive layer 121 may include a material capable of uthetic bonding. For example, the adhesive layer 121 may include at least one of AuSn, NiSn, and InAu.

The substrate 123 may be formed of a conductive member, and this may be formed of a conductive material such as copper (Cu-copper), gold (Au-gold), nickel (Ni nickel), molybdenum (Mo), copper-tungsten (Cu—W), a carrier wafer (eg, Si, Ge, AlN, GaAs, ZnO, SiC, etc.). As another example, the substrate 123 may be implemented as a conductive sheet. When the substrate 123 is made of GaAs, the light emitting structure 110 may be grown on the substrate 123, and the adhesive layer 121 may be omitted.

The first conductive layer 125 may be disposed under the substrate 123. The first conductive layer 125 may be selected from Ti, Ru, Rh, Ir, Mg, Zn, Al, In, Ta, Pd, Co. Ni, Si, Ge, Ag and Au and their optional alloys. And, the first conductive layer 125 may be formed a single layer or a multi-layer.

The light emitting structure 110 may include a first semiconductor layer 111, an active layer 113, an aperture layer 114, and a second semiconductor layer 115 disposed on the first electrode 120. In the light emitting structure 110, a plurality of compound semiconductor layers may be grown on the first substrate 121, and the growth equipment for the plurality of compound semiconductor layers includes an electron beam evaporator, physical vapor deposition (PVD), chemical vapor deposition (CVD), plasma laser deposition (PLD), dual-type thermal evaporator sputtering, metal organic chemical vapor deposition (MOCVD), etc., but is not limited thereto.

The first semiconductor layer 111 may be implemented with at least one of a group 3-5 or a group 2-6 compound semiconductor doped with a first conductivity type dopant. For example, the first semiconductor layer 111 may be formed of GaAs, GaAl, InP, InAs, and GaP, but is not limited thereto. The first semiconductor layer 111 may be formed of a semiconductor material having a composition formula of (y<x) as $Al_xGa_{1-x}As(0<x<1)/Al_yGa_{1-y}As(0<x<1)$. The first semiconductor layer 111 may be an n-type semiconductor layer doped with an n-type dopant such as Si, Ge, Sn, Se, Te, etc. The first semiconductor layer 111 may be a distributed bragg reflector (DBR) having a thickness of $\lambda/4n$ by alternately disposing different semiconductor layers.

The active layer 113 may be implemented with at least one of a group 3-5 or a group 2-6 compound semiconductor. For example, the active layer 113 may be one of GaAs, GaAl, InP, InAs, and GaP, but is not limited thereto. When the active layer 113 is implemented in a multi-well structure, the active layer 113 may include a plurality of well layers and a plurality of barrier layers alternately disposed. The plurality of well layers may be formed of, for example, a semiconductor material having a composition formula of $In_pGa_{1-p}As$ ($0 \leq p \leq 1$). The barrier layer may be formed of, for example, a semiconductor material having a composition formula of $In_qGa_{1-q}As$ ($0 \leq q \leq 1$), but is not limited thereto.

The aperture layer 114 may be disposed on the active layer 113. The aperture layer 114 may include a circular opening in a central portion, but is not limited thereto. The aperture layer 114 may include a function of limiting current movement so that current is concentrated to the center of the active layer 113. That is, the aperture layer 114 may adjust a resonance wavelength and a beam angle vertically emitted from the active layer 113 may be adjusted. The aperture layer 114 may include a dielectric material such as $SiO_2$ or $Al_2O_3$, and may have a higher band gap than the active layer 113 and the first and second semiconductor layers 111 and 115.

The second semiconductor layer 115 may be implemented with at least one of a Group 3-5 or Group 2-6 compound semiconductor doped with a second conductivity type dopant. For example, the second semiconductor layer 115 may be one of GaAs, GaAl, InP, InAs, and GaP, but is not limited thereto. The second semiconductor layer 115 may be formed of, for example, a semiconductor material having a composition formula of $Al_xGa_{1-x}As(0<x<1)/Al_yGa_{1-y}As$ ($0<x<1$) ($y<x$). The second semiconductor layer 115 may be a p-type semiconductor layer having a p-type dopant such as Mg, Zn, Ca, Sr, Ba. The second semiconductor layer 115 may be a DBR having a thickness of $\lambda/4n$ by alternately disposing different semiconductor layers. The second semiconductor layer 115 may have a lower reflectance than the first semiconductor layer 111. For example, The first and second semiconductor layers 111 and 115 may vertically form a resonance cavity with a reflectance of 90% or more. In this case, light may be emitted to the outside through the second semiconductor layer 115 which is lower than the reflectance of the first semiconductor layer 111.

The vertical cavity type surface-emitting laser element 100 according to the embodiment may include a second conductive layer 140 on the light emitting structure 110. The second conductive layer 140 is on the second semiconductor layer 115. The second conductive layer may be disposed along the edge of the emission area EA. The second conductive layer 140 may have a circular ring type top view, but is not limited thereto and may be an elliptical shape or a polygonal shape. The second conductive layer 140 may include an ohmic contact function. The second conductive layer 140 may be implemented with at least one of a group 3-5 or a group 2-6 compound semiconductor doped with a second conductivity type dopant. For example, the second conductive layer 140 is GaAl, InP, InAs, and GaP, but is not limited thereto. The second conductive layer 140 may be a p-type semiconductor layer having a p-type dopant such as Mg, Zn, Ca, Sr, or Ba.

The vertical cavity type surface-emission laser element 100 according to the embodiment may include a protective layer 150 on the light emitting structure 110. The protective layer 150 may be disposed on the second semiconductor layer 115. The protective layer 150 may vertically overlap the light emitting area EA. The light emitting element 100 of the embodiment may include an insulating layer 130. The insulating layer 130 may be disposed on the light emitting structure 110. The insulating layer 130 may include an insulating material such as an oxide, nitride, fluoride, or sulfide of a material such as Al, Cr, Si, Ti, Zn, and Zr, or an insulating resin. The insulating layer 130 may be selectively formed from, for example, $SiO_2$, $Si_3N_4$, $Al_2O_3$, and $TiO_2$. The insulating layer 130 may be formed as a single layer or multiple layers, but is not limited thereto.

The second electrode 160 may be disposed on the second conductive layer 140 and the insulating layer 130. The second electrode 160 may be electrically connected to the second conductive layer 140. The second electrode 160 is selected from Ti, Ru, Rh, Ir, Mg, Zn, Al, In, Ta, Pd, Co, Ni, Si, Ge, Ag, and Au, and optional alloys thereof, and may be formed as a single layer or multiple layers.

Meanwhile, the first electrode 160 may be an anode electrode of the vertical cavity type surface-emission laser element 100, and the second electrode 120 may be a cathode electrode.

In addition, the first electrode 160 is connected to the electrode pattern 240 through a connection member W, and the second electrode 120 is disposed on the pad 222.

Hereinafter, the vias V1, V2, and V3 including the plurality of via parts VP1, VP2, and VP3 will be described with reference to FIGS. 5 to 7B. The vias V1, V2, and V3 are heat dissipation vias, and are disposed on a region overlapping the pad 220 in a vertical direction as described above. In addition, at least a part of the vias V1, V2, and V3 overlap in a vertical direction with an area in which the vertical cavity type surface-emission laser element 100 is disposed.

In this case, the vias V1, V2, and V3 each include a plurality of via parts VP1, VP2, and VP3. Each of the plurality of via parts VP1, VP2, and VP3 has a first horizontal width W1 and a second horizontal width W2 different from each other as shown in FIG. 5. For example, the first horizontal width W1 is smaller than the second horizontal width W2. For example, the first horizontal width W1 may be a level of ½ of the second horizontal width W2. For example, the first horizontal width W1 may be about ¼ of the second horizontal width W2. For example, the first horizontal width W1 may be ⅑ to ⅟₁₅ of the second horizontal width W2. In other words, the second horizontal width W2 may be at least twice the first horizontal width W1. For example, the second horizontal width W2 may be 4 or more times the first horizontal width W1. For example, the second horizontal width W2 may have a range between 9 and 15 times the first horizontal width W1. In the drawings of the present invention, the vias V1, V2, and V3 are schematically arranged to be parallel to one side of a linear pad, but the present invention is not limited thereto. That is, the vias V1, V2, and V3 may have a curved or zigzag shape, and thus may be formed at an angle with one side of the pad and a predetermined inclination angle. In addition, although the first horizontal width and the second horizontal width are vertically illustrated, this is only an example of the existence of different short widths and long widths of vias.

Accordingly, the first horizontal width W1 of each of the via parts VP1, VP2, and VP3 may be 10 μm to 150 μm. In addition, the second horizontal width W2 of each of the via parts VP1, VP2, and VP3 may be 20 μm to 2000 μm. In addition, the second horizontal width W2 of each of the via parts VP1, VP2, and VP3 may be 200 μm to 1700 μm. In addition, the second horizontal width W2 of each of the via parts VP1, VP2, and VP3 may be 400 μm to 1500 μm.

Referring to FIG. 6, each of the via parts VP1, VP2, and VP3 does not include only one via hole VH, but a plurality of via holes VH1, VH2, VH3, VH4, VH5 and VH6 overlapping at least some in a vertical direction.) In the drawings, for convenience of explanation, each via part (VP1, VP2, VP3) is shown to be composed of six via holes, but this is only an embodiment of the present invention, and each of the via parts VP1, VP2, VP3 may further increase the number of via holes. In addition, in the drawing, six via holes are schematically formed to overlap each other in a straight line, but differently, each of the via parts VP1, VP2, and VP3 may be formed by connecting a plurality of via holes having a curved or zigzag shape and the like to each other.

In this case, each of the plurality of via holes VH1, VH2, VH3, VH4, VH5, and VH6 may be disposed by overlapping at least some of the adjacent via holes. For example, a second via hole VH2 is disposed in a region adjacent to the first via hole VH1. In this case, a portion of the second via hole VH2 may overlap with a portion of the first via hole VH1 in a vertical direction. That is, a first overlapping region OR1 may be formed between the first via hole VH1 and the second via hole VH2. That is, the first via hole VH1 is disposed through the insulating layers 211, 212, and 213. In addition, the second via hole is disposed through the insulating layers 211, 212 and 213 so as to overlap with the first via hole VH1 at a position adjacent to the first via hole VH1. Accordingly, the first and second via holes VH1 and VH2 have a shape connected to each other. For example, the first and second via holes VH1 and VH2 may have a top-view peanut shape. Likewise, the third via hole VH3 is disposed at a position adjacent to the second via hole VH2. A second overlapping region OR2 may be formed between the second via hole VH2 and the third via hole VH3.

Similarly, the fourth via hole VH4 is disposed at a position adjacent to the third via hole VH3. A third overlapping region OR3 may be formed between the third via hole VH3 and the fourth via hole VH4.

Likewise, the fifth via hole VH5 is disposed at a position adjacent to the fourth via hole VH4. A fourth overlapping region OR4 may be formed between the fourth via hole VH4 and the fifth via hole VH5.

Likewise, the sixth via hole VH6 is disposed at a position adjacent to the fifth via hole VH5. A fifth overlapping region OR5 may be formed between the fifth via hole VH5 and the sixth via hole VH6.

As described above, each of the via parts VP1, VP2, and VP3 is not formed by a single via hole VH, but is formed by a combination of a plurality of via holes VH1 to VH6. Accordingly, each of the via parts VP1, VP2, and VP3 has the second horizontal width W2 larger than the first horizontal width W1.

Meanwhile, in each of the via parts VP1, VP2, and VP3, an overlap region is disposed between adjacent via holes as described above. In this case, a shape of the upper surface of each of the via parts VP1, VP2, and VP3 may be determined according to the size of the overlapping area. Here, in the embodiment of the present invention, the overlapping area occupies at least 40% or more. In other words, the second via hole VH2 may be formed to overlap the first via hole VH1 by at least 40% or more. In other words, the area of the first overlapping area OR1 may be 40% or more of the area of the first via hole VH1. For example, the area of the first overlapping area OR1 may be 50% or more of the area of the first via hole VH1. For example, the area of the first overlapping area OR1 may be 60% or more of the area of the first via hole VH1. For example, the area of the first overlapping area OR1 may be 70% or more of the area of the first via hole VH1. For example, the area of the first overlapping area OR1 may be 80% or more of the area of the first via hole VH1. For example, the area of the first overlapping area OR1 may be 90% or less of the area of the first via hole VH1.

Meanwhile, on the upper surfaces of each of the via parts VP1, VP2, and VP3, a side surface in the second direction may be determined by the area of the overlapping region. That is, if the area of the overlapping area increases, the side surface will have a straight line shape, and if the area of the overlapping area decreases, the side surface may have a curve shape.

At this time, if the first overlapping region OR1 is less than 40% of the area of the first via hole VH1, there is a problem in that the via area in the overlapping region between each of the via holes is reduced, and thus heat dissipation performance is deteriorated.

In addition, if the first overlapping region OR1 is larger than 90% of the area of the first via hole VH1, a manufacturing time for forming the vias V1, V2, and V3 may be considerably increased. Accordingly, the first overlapping area OR1 has a range between 40% and 90% of the area of the first via hole VH1.

Likewise, the second to fifth overlapping regions OR2, OR3, OR4, OR5 may be have a range between 40% and 90% of the area of any one of the second to fifth via holes VH1 to VH6.

Meanwhile, the plurality of via parts VP1, VP2, and VP3 constituting each of the vias V1, V2, and V3 may be modified in various forms. In FIG. 6, it has been described that the plurality of via holes are disposed only in the second direction. However, if the area of each of the via holes is small, the plurality of via holes may be disposed not only in the second direction but also in the first direction.

That is, referring to FIG. 7A, each of the via parts VP1, VP2, and VP3 includes a first via hole VH1, a second via hole VH2 disposed in a region adjacent to the first via hole VH1 in the second direction and overlapping the first via hole VH1, a third via hole VH3 disposed in a region adjacent to the second via hole VH2 and overlapping the second via hole VH2, a fourth via hole VH4 disposed in a region adjacent to the third via hole VH3 in a second direction and overlapping the third via hole VH3, a fifth via hole VH5 disposed in a region adjacent to the fourth via hole VH4 in the second direction and overlapping the fourth via hole VH4, a sixth via hole VH6 disposed in a region adjacent to the fifth via hole VH5 in the second direction and overlapping the fifth via hole VH5, a seventh via hole VH7 disposed in a region adjacent to the first via hole VH1 in the first direction and overlapping the first via hole VH1, an eighth seventh via hole VH8 disposed in a region adjacent to the second via hole VH2 in the first direction and overlapping the second via hole VH2, a ninth via hole VH9 disposed in a region adjacent to the third via hole VH3 in the first direction and overlapping the third via hole VH3, a tenth via hole VH10 disposed in a region adjacent to the fourth via hole VH4 in the first direction and overlapping the fourth via hole VH4, an eleventh via hole VH11 disposed in a region adjacent to the fifth via hole VH5 in the first direction and overlapping the fifth via hole VH5, and a twelfth via hole VH12 disposed in a region adjacent to the sixth via hole VH6 in the first direction and overlapping the sixth via hole VH6.

In this case, the area of each of the via parts VP1, VP2, and VP3 may be maximized, and thus heat dissipation characteristics may be improved.

Meanwhile, as the area of the overlapping region in FIG. 6 increases as in FIG. 7B, the number of via holes formed in the same space increases.

That is, as shown in FIG. 7B, as the overlapping area increases, each of the via parts VP1, VP2, and VP3 includes first to twelfth via holes VH1 to VH12. That is, in FIG. 6, six via holes are included in the same space, but the number of via holes increases as the overlapping area increases, and accordingly, the area of each via part increases. Here, each of the via holes VH1 to 12 may be disposed to overlap with neighboring via holes by 80% to 90%. Accordingly, each of the via holes may overlap with other via holes other than the adjacent via holes. In other words, the first via hole VH1 may overlap not only the second via hole VH2 immediately adjacent, but also the second via hole, the third via hole, and the fourth via hole VH2, VH3, and VH4. As the area of the overlapping area increases, the side portion of the upper surface of the via part has a linear shape, and accordingly, an area occupied by the via part in the same space can be maximized.

Figure 8:
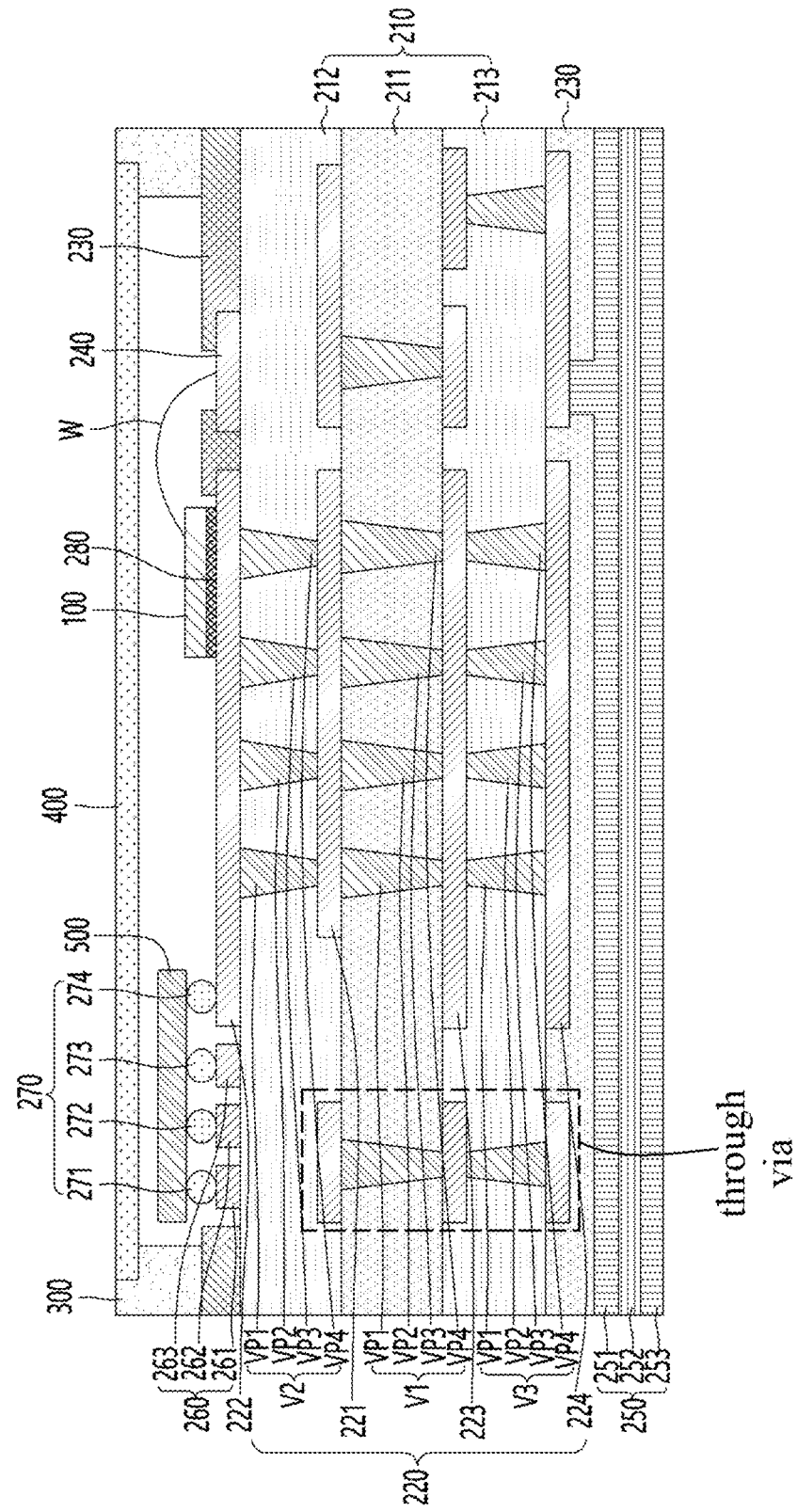
FIG. 8 is a diagram illustrating a light emitting module according to an exemplary embodiment.
Figure 9A:
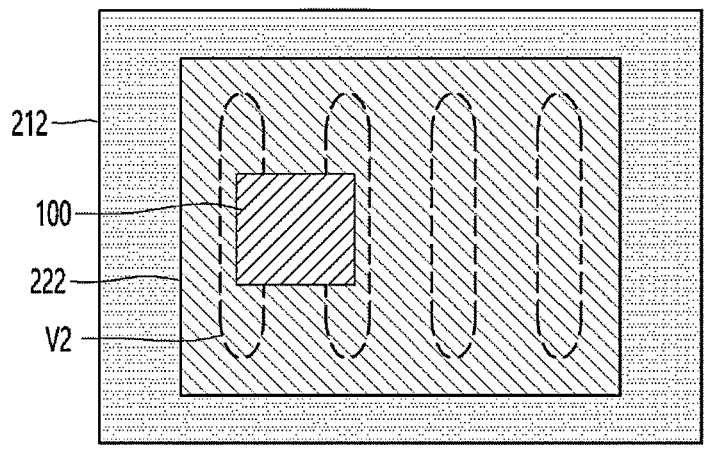
FIGS. 9A-9C are plan views showing an arrangement of a vertical cavity type surface-emission laser element according to an exemplary embodiment.
Figure 9B:
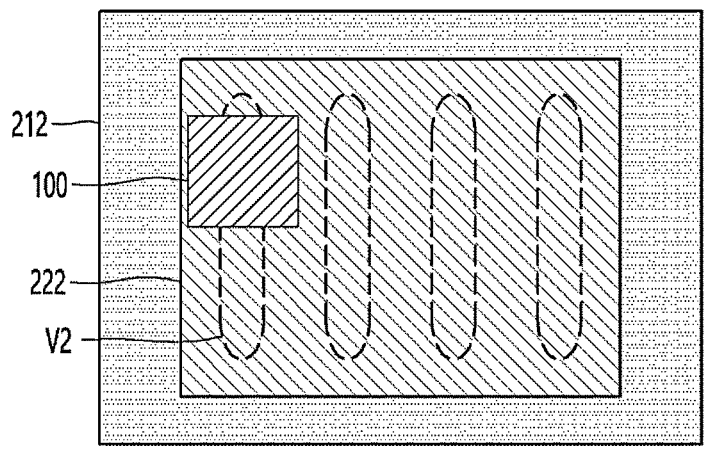
Figure 9C:
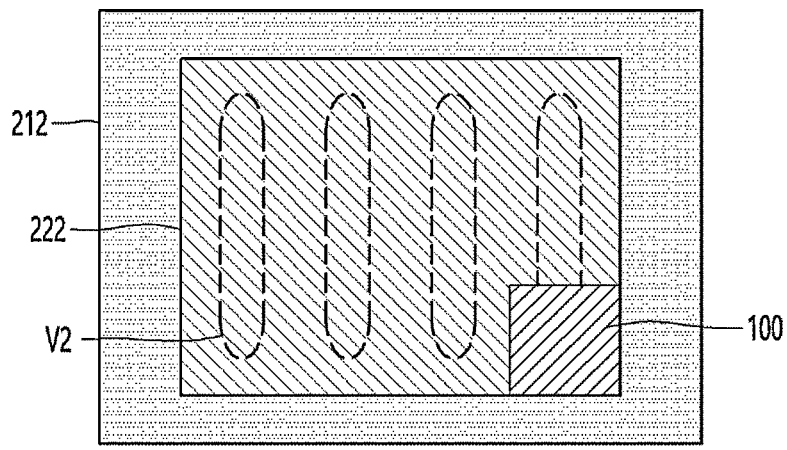
Figure 10:
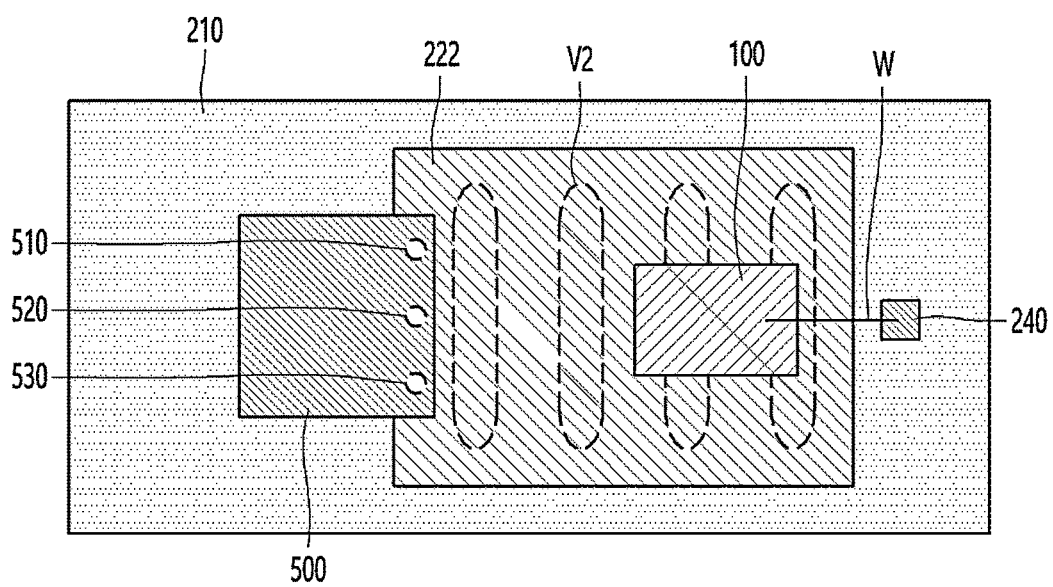
FIG. 10 is a plan view showing a connection relationship between the driver element of FIG. 8 and the vertical cavity type surface-emission laser element.
Figure 11A:
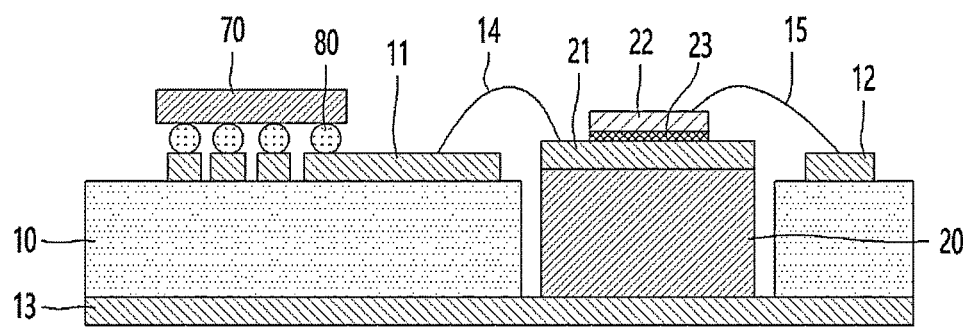
FIGS. 11A and 11B are diagrams comparing circuit distances between a driver element of the present embodiment and a comparative example and a cathode electrode of a vertical cavity type surface-emission laser element.
Figure 11B:
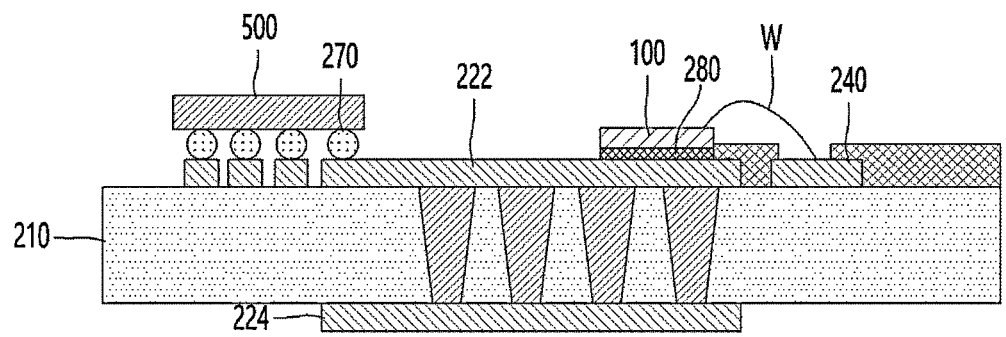
Figure 12A:
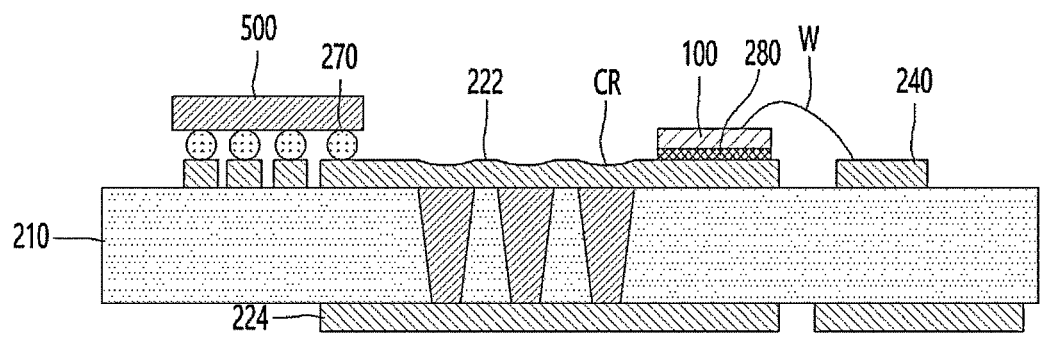
FIGS. 12A and 12B are views showing an arrangement of a vertical cavity type surface-emission laser element according to another embodiment.
Figure 12B:
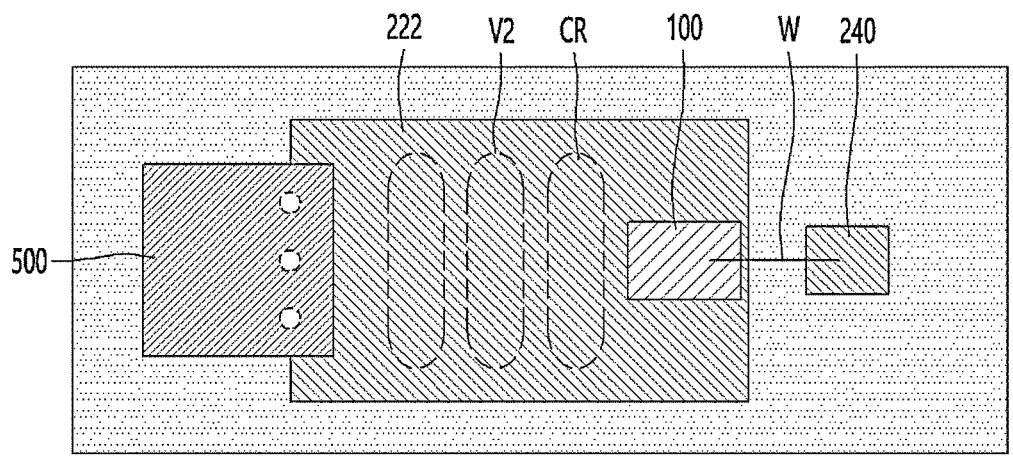
Figure 13A:
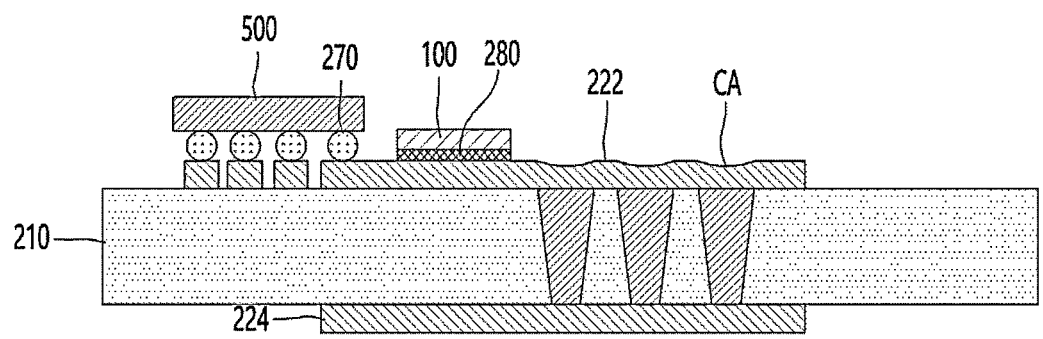
FIGS. 13A and 13B are views showing an arrangement of a vertical cavity type surface-emission laser element according to another embodiment.
Figure 13B:
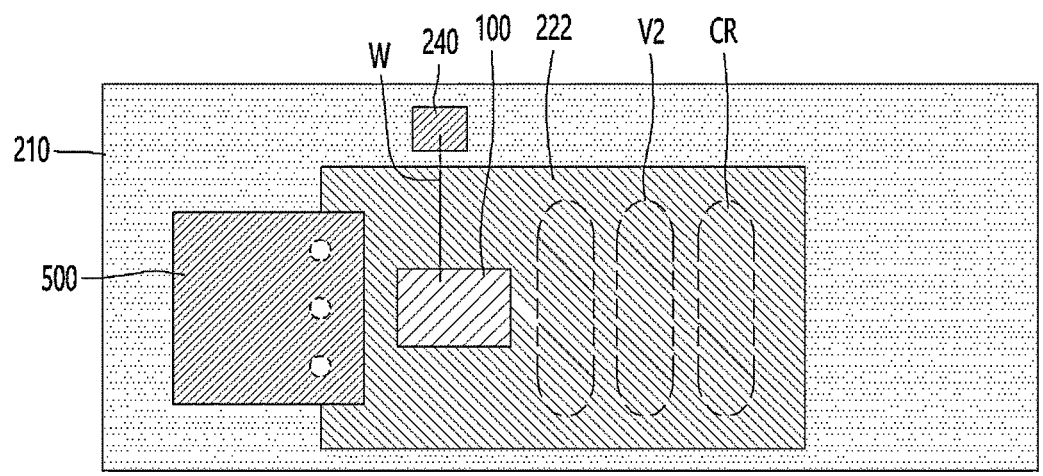

FIG. 8 is a view showing a light emitting module according to an embodiment of the present invention, FIGS. 9A-9C are plan views showing an arrangement of a vertical cavity type surface-emitting laser element 100 according to an embodiment of the present invention, FIG. 10 is a plan view showing a connection relationship between the driver element of FIG. 8 and the vertical cavity type surface-emission laser element 100, FIGS. 11A and 11B are views comparing the circuit distance between the driver element of the present invention and the comparative example and the cathode electrode of the vertical cavity type surface-emission laser element 100, FIGS. 12A and 12B are views showing an arrangement form of a vertical cavity type surface-emitting laser element 100 according to another embodiment of the present invention, FIGS. 13A and 13B are diagrams showing an arrangement of a vertical cavity type surface-emitting laser element 100 according to another embodiment of the present invention.

Hereinafter, a light emitting module according to an embodiment of the present invention will be described with reference to FIGS. 8 to 13B.

In the light emitting module according to the exemplary embodiment of the present invention, the driver element 500 may be additionally disposed on the insulating layers 211, 212, and 213 in the light emitting package of FIG. 3.

That is, the light emitting module includes the substrate 210 including the insulating layers 211, 212, 213, the pad 220 including the first to third pads, the vias V1, V2, and V3, the protective layer 230, The electrode pattern 240 and the protective part 250.

In this case, a connection pattern 260 for mounting the driver element 500 is additionally formed on the upper surface of the uppermost insulating layer 212 of the insulating layers 211, 212, 213.

In addition, a second connection part 270 is disposed on the connection pattern 260, and the driver element 500 is attached on the second connection part 270 by the second connection part 270. That is, the vertical cavity type surface-emitting laser element 100 is attached on the pad 220 through the first connection part 280, and the driver element 500 is attached on the connection pattern 260 through the second connection part 270.

Meanwhile, a plurality of terminals (not shown) are positioned on the lower surface of the driver element 500. The plurality of terminals may include a reception terminal for receiving a signal, a transmission terminal for transmitting a signal, and a ground terminal. In this case, conventionally, the ground terminal of the driver element 500 and the ground terminal of the vertical cavity type surface-emission laser element 100 are interconnected through a connection member such as a separate wire, but in this embodiment, there may be no separate wire. In addition, a separate wire may not be required when connecting the ground terminal and the cathode electrode of the vertical cavity type surface-emission laser element 100.

Alternatively, in the present invention, both the cathode electrode and the ground terminal of the driver element 500 may be positioned on one pad. In this case, the one pad is a pad on which the vias V1, V2, and V3 are disposed, and preferably the one pad is a second pad 222 disposed on the uppermost insulating layer.

That is, the connection pattern 260 on which the driver element 500 is disposed is disposed on the upper surface of the second insulating layer 212. In this case, the connection pattern 260 may be disposed on the second insulating layer 212 according to the number of terminals provided in the driver element 500. In this case, in the present invention, a part of the pad 222 on which the vertical cavity type surface-emission laser element 100 is disposed is used as a connection pattern of the driver element 500.

That is, the connection pattern 260 may include first to third connection patterns 261, 262, and 263. In addition, first to third sub-connection parts 271, 272, and 273 constituting the second connection part 270 are disposed on the first to third connection patterns 261, 262, and 263, respectively. In addition, the driver element 500 may be mounted on the connection pattern through the first to third sub-connection parts 271, 272, and 273. At this time, a fourth sub-connection part 274 constituting the second connection part 270 is also located on the pad 222, and a ground terminal of the driver element 500 may be located on the fourth sub-connection part 274.

In other words, in the related art, the ground terminal of the driver element 500 is disposed on a separate connection pattern, and accordingly, the connection pattern connected to the ground terminal is electrically connected with the cathode electrode through a wire.

In contrast, in the present invention, the ground terminal of the driver element 500 is also disposed on the pad on which the cathode electrode is disposed, so that the signal distance between the cathode electrode and the driver element 500 can be minimized.

Accordingly, in the present invention, a part of the driver element 500 may be positioned on a region vertically overlapping with the pad 222. In this case, a part of the driver element 500 positioned on a region vertically overlapping the pad 222 may be a region in which a ground terminal is formed.

Meanwhile, referring to FIGS. 9A-9C, the vertical cavity type surface-emission laser element 100 is disposed on the pad 222 and comprises a plurality of via parts VP1, VP2, VP3 constituting the respective vias V1, V2, and V3 may be disposed to overlap in a vertical direction with at least one via part.

That is, as shown in FIG. 9A, the vertical cavity type surface-emission laser element 100 may be disposed in a central region of the pad 220 and may be disposed to overlap two via parts in a vertical direction. In contrast, as shown in FIG. 9B, the vertical cavity type surface-emission laser element 100 may be disposed in an outer region of the pad 220 to overlap only one via part in a vertical direction. In addition, as shown in FIG. 9C, the vertical cavity type surface-emission laser element 100 may be disposed in a corner region of the pad 220 to be disposed to overlap only one via part in a vertical direction.

Meanwhile, as shown in FIG. 10, a plurality of ground terminals may be included on a lower surface of the driver element 500. For example, the driver element 500 may include first to third ground terminals 510, 520, and 530. In addition, the first to third ground terminals 510, 520, and 530 may be directly attached to the pad through the second connection part 270 disposed on the pad 222. Accordingly, the ground terminal may be connected to the cathode electrode of the vertical cavity type surface-emitting laser element 100 disposed on the pad 222 through the first connection part 280 without a separate connection member such as a wire.

Referring to FIGS. 11A and 11B, in FIG. 11A, a first connection part 23 is disposed on a separate second substrate 20, and a vertical cavity type surface emitting laser element 22 is disposed on the first connection part 23.

In addition, the driver element 70 is disposed on the first substrate 10. That is, the driver element 70 is mounted on the circuit pattern layer 11 disposed on the substrate through the second connection part 80.

Accordingly, the driver element 70 and the vertical cavity type surface-emission laser element 22 are electrically connected to each other through a separate connection member 14. Specifically, the ground terminal of the driver element 70 is positioned on the circuit pattern layer 11 disposed on the first substrate 10. In addition, the cathode electrode of the vertical cavity type surface-emission laser element 22 is positioned on the metal layer 21 disposed on the second substrate 20. The conventional second substrate 20 is made thicker than the first substrate 10 because it is difficult to adjust the height due to the use of the AlN substrate. Moreover, in the related art, the second substrate 20 could be manufactured at the same height as the first substrate 10, but it was difficult because a process for matching the manufacturing cost and height was separately required. In addition, even if the height of the second substrate 20 was adjusted to the height of the first substrate 10, the second substrate 10 as a separate substrate had to be inserted into the first substrate 10, thereby there was a space between the first and second substrates, so that the circuit pattern layer 11 and the metal layer 21 could not be made together. Accordingly, in the conventional light emitting module, the connection member 14 is positioned between the circuit pattern layer 11 and the metal layer 21.

In contrast, in the present invention, as shown in FIG. 11B, the first connection part 280 in which the vertical cavity type surface-emission laser element is disposed and the second connection part 270 in which the driver element is disposed are both positioned on one pad 222. That is, since the cathode electrode of the vertical cavity type surface-emission laser element 100 is positioned on the pad 222, a separate connection member is unnecessary. In addition, a ground terminal of the driver element 500 may also be located on the pad 222.

Therefore, in the present invention, unlike the comparative example, the signal distance between the driver element 500 and the vertical cavity type surface-emission laser element 100 can be minimized, thereby, signal loss can be minimized by reducing inductance.

Meanwhile, referring to FIGS. 12A and 12B, the upper surface of the pad 222 disposed on the uppermost insulating layer may not be flat and may have a curvature. That is, an upper surface of a region vertically overlapping the via parts VP1, VP2, and VP3 among the upper surfaces of the pad 222 may include a concave portion CR that is depressed by a predetermined depth in a lower direction.

This is, each of the via parts is a large area having a bar shape, and accordingly, a height difference from other areas may occur in the process of filling a metal material in the via hole constituting each of the via parts.

A plurality of via holes constituting each of the via parts VP1, VP2, and VP3 may be formed by any one of mechanical, laser, and chemical processing. when the via hole is formed by machining, methods such as milling, drilling, and routing can be used, and when formed by laser processing, a UV or $CO_2$ laser method can be used. In addition, when formed by chemical processing, the insulating layers 211, 212, 213 may be opened using a chemical containing aminosilane or ketones.

On the other hand, the laser processing is a cutting method that takes a desired shape by concentrating optical energy on the surface to melt and evaporate a part of the material, and it is possible to easily process complex formations by a computer program, this makes it possible to process even difficult composite materials that are difficult with other methods.

In addition, the laser processing has a cutting diameter of at least 0.005 mm, and has a wide range of possible thicknesses.

As the laser processing drill, it is preferable to use a YAG (Yttrium Aluminum Garnet) laser, a $CO_2$ laser, or an ultraviolet (UV) laser. YAG laser is a laser that can process both copper foil layers and insulating layers, and $CO_2$ laser is a laser that can only process insulating layers.

When the via hole is formed, the via hole is filled with a conductive material to form the vias V1, V2, and V3. The metal material forming the vias (V1, V2, V3) is any one selected from copper (Cu), silver (Ag), tin (Sn), gold (Au), nickel (Ni), and palladium (Pd). It may be a material, and the conductive material filling may be performed by any one of electroless plating, electroplating, screen printing, sputtering, evaporation, ink jetting, and dispensing, or a combination thereof. Can be used.

That is, in the process of filling the inside of the via hole with a conductive material, the pad 222 is also formed, the concave portion CR may be formed on the upper surface of the pad due to a difference in plating between an area in which the via hole is disposed and an area other than the area.

In this case, in the pad forming process according to the filling of the via hole, by performing overplating and polishing the overplated area. Accordingly, the upper surface of the pad may be made flat. However, in the present invention, the first insulating layer 211 has a flexible characteristic, and thus it is difficult to polish the overplated region. Accordingly, the upper surface of the pad in an area overlapping the via parts VP1, VP2, and VP3 may have a concave portion CR. It is preferable that a minimum height of the concave portion CR is formed higher than the upper surface of the substrate. That is, the concave portion is formed higher than the upper surface of the via. Accordingly, when the vertical cavity type surface-emission laser element 100 is mounted, inclination is minimized, thereby minimizing a problem in which the divergent angle of light is changed.

At this time, if the vertical cavity type surface-emission laser element 100 is disposed on the concave portion CR, a problem may occur in mounting reliability of the vertical cavity type surface emission laser element 100, and thus normal light emission It may not work. That is, if the vertical cavity-type surface-emission laser element 100 is disposed on the concave portion CR, the vertical cavity-type surface-emission laser element 100 may have a predetermined inclination angle and may be mounted on the pad, which It may affect the divergence angle of light of the vertical cavity type surface-emission laser element 100.

Accordingly, in the present invention, as shown in FIGS. 12A and 12B, the vertical cavity surface is formed on a region not vertically overlapping the plurality of via parts VP1, VP2, VP3 of the upper surface of the pad, or the plurality of via parts VP1, VP2, and VP3 may be disposed so as to be positioned in a region that does not vertically overlap two sides facing each other among four sides of the vertical cavity type surface-emission laser element 100 as shown in FIG. 9B. FIG. 12A is a cross-sectional view of the light emitting module when the vertical cavity type surface emitting laser element 100 is disposed on a region that does not vertically overlap with the plurality of via parts VP1, VP2, VP3, and FIG. 12B is a plan view of FIG. 12A Accordingly, the plurality of via parts VP1, VP2, and VP3 may not be disposed on at least some of the areas vertically overlapping with the pad 220. In addition, the vertical cavity type surface-emission laser element 100 may be disposed on a region where the plurality of via parts VP1, VP2, and VP3 are not disposed in the vertical direction. In this case, an area of the plurality of via parts VP1, VP2, and VP3 may be further increased to inhibit a problem in heat dissipation performance. For example, each of the plurality of via parts VP1, VP2, and VP3 may include a plurality of via holes overlapping not only in the first direction but also in the second direction as shown in FIG. 7A.

Meanwhile, in the present invention, the mounting position of the vertical cavity type surface-emission laser element 100 is adjusted to minimize the signal distance between the driver element 500 and the vertical cavity type surface-emission laser element 100.

That is, as shown in FIGS. 13A and 13B, the plurality of via parts VP1, VP2, and VP3 are disposed in a region vertically overlapping the upper surface of the pad on the far side from the driver element 500. Accordingly, the via parts VP1, VP2, and VP3 constituting the vias V1, V2, and V3 are not located under the upper surface of the upper surface of the pad 220 adjacent to the driver element 500. In addition, the vertical cavity type surface emitting laser element 100 is disposed on the upper surface of the pad in a region adjacent to the driver element 500. Here, FIG. 13A is a cross-sectional view of the light emitting module, and FIG. 12B is a plan view of FIG. 12A.

Accordingly, while increasing the mounting reliability of the vertical cavity type surface-emission laser element 100, a signal distance between the driver element 500 and the vertical cavity type surface-emission laser element 100 may be minimized. In addition, it is possible to solve a problem caused by inclination of the light emitting element due to the concave portion CA of the pad.

Figure 14:
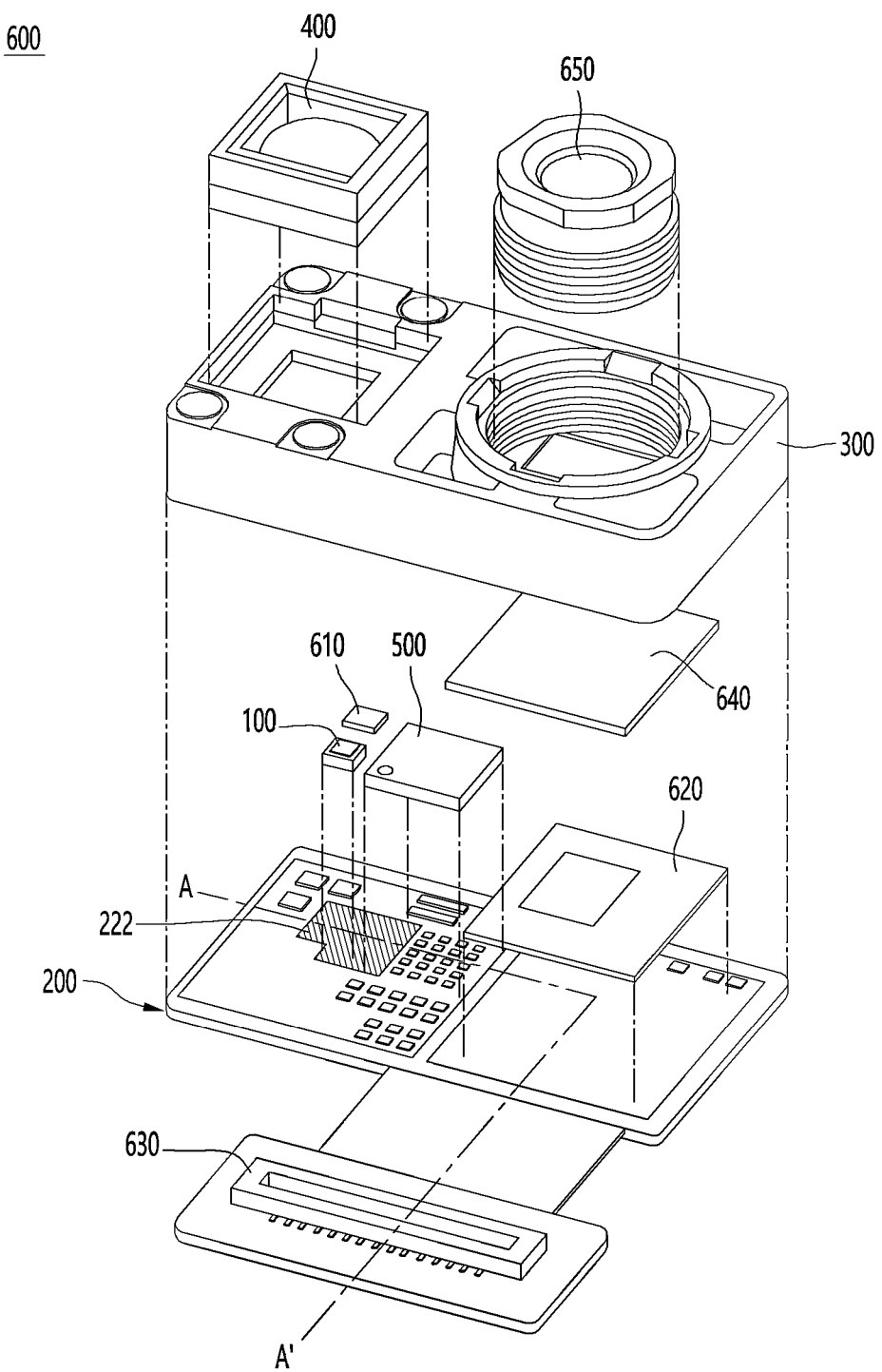
FIG. 14 is a perspective view illustrating a camera device according to an embodiment.
Figure 15:
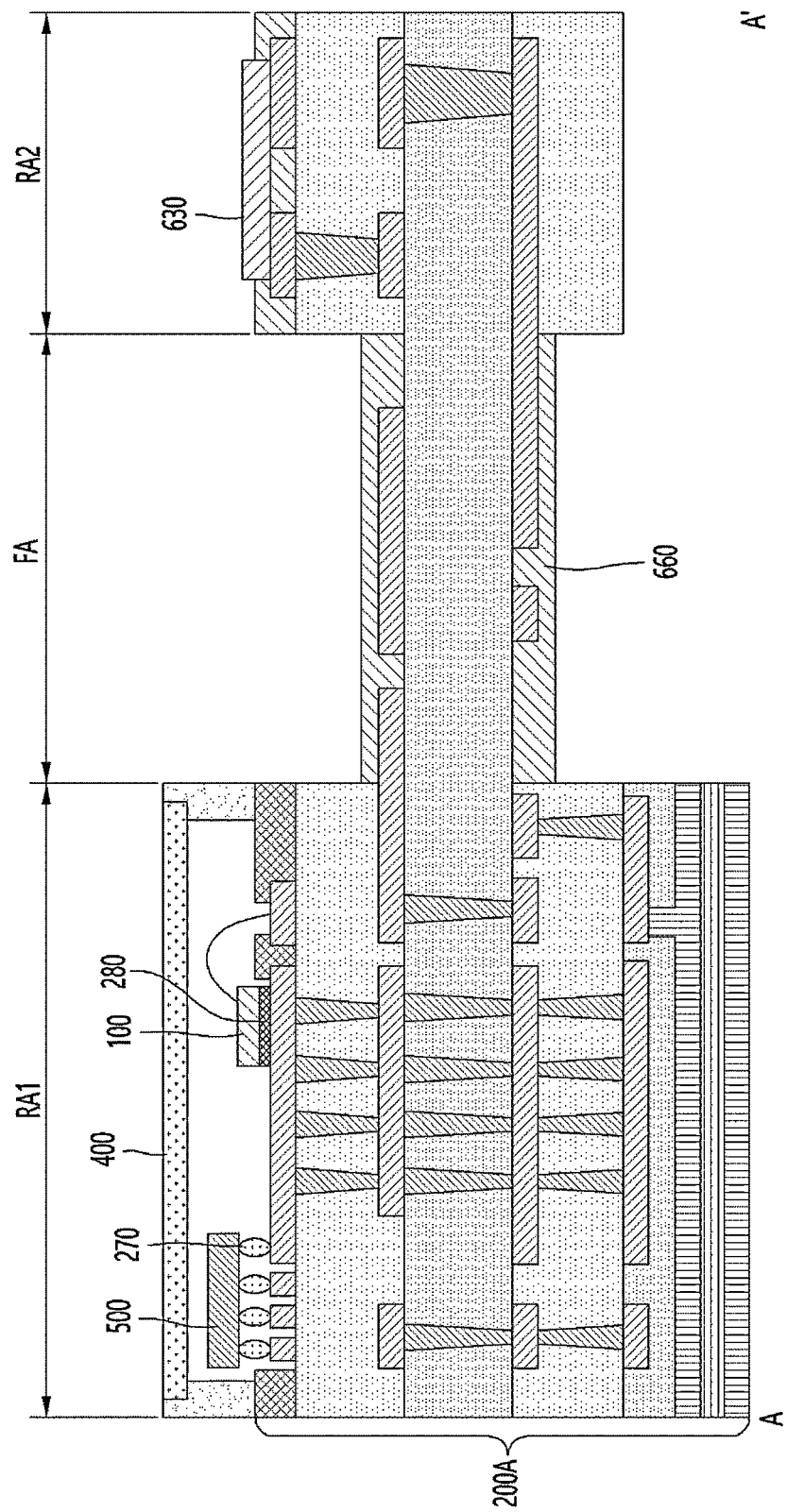
FIG. 15 is a cross-sectional view showing the camera device taken along line A-A' of FIG. 14.
Figure 16:
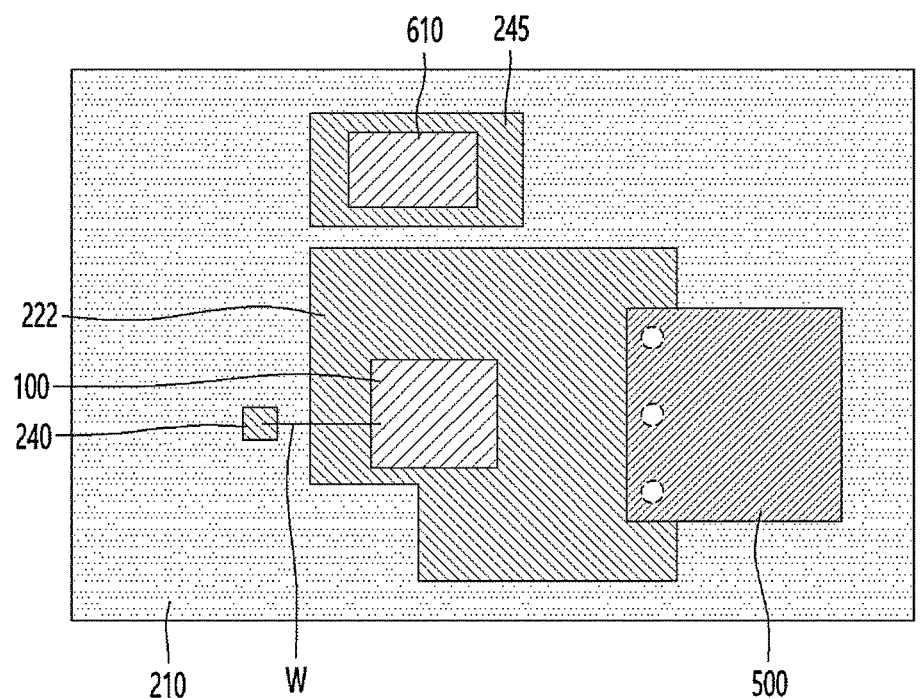
FIG. 16 is a diagram showing an arrangement relationship of the driver element, the vertical cavity type surface-emitting laser element, and the light receiving element of FIG. 14.

FIG. 14 is a perspective view showing a camera device according to an embodiment of the present invention, FIG. 15 is a cross-sectional view showing the camera device taken along line A-A' of FIG. 14, and FIG. 16 is a diagram showing an arrangement relationship of the driver element, the vertical cavity type surface-emitting laser element, and the light receiving element of FIG. 14.

Referring to FIGS. 14 to 16, the light emitting package and the light emitting module including the same in the present invention can be applied to a camera device.

Accordingly, an image sensor 620, a filter 640 and the connector 630 excluding the vertical cavity type surface-emission laser element 100 and the driver element 500 may be further disposed on the substrate 210 constituting the light emitting package or the light emitting module, a light receiving element 610.

To this end, the substrate 210 may include a first rigid region RA1, a flexible region FA, and a second rigid region RA2. In addition, the connector 630 is disposed on the second rigid region RA2.

The connector 630 may be electrically connected to the image sensor 620. Also, the connector 630 may be electrically connected to a control board (not shown) of an electronic device in which the camera module is mounted.

That is, the connector 630 may transmit an image signal of a digital signal sensed through the image sensor 620 to the control board.

A flexible area FA is positioned between the first rigid area RA1 and the second rigid area RA2. The flexible region FA has a stacked structure of a substrate 210 different from the rigid region. That is, the substrate 210 of the first and second rigid regions RA1 and RA2 may include a plurality of insulating layers 211, 212 and 213 as described above. In addition, only the first insulating layer 211 excluding the second insulating layer 212 and the third insulating layer 213 is positioned in the flexible region FA. Accordingly, the flexible region FA has a flexible characteristic according to the characteristic of the first insulating layer 211. Meanwhile, a cover lay 660 is positioned on the surface of the first insulating layer 211 of the flexible region FA. The cover lay 660 may protect the circuit pattern layer disposed on the surface of the first insulating layer 211 of the flexible region FA.

Meanwhile, the first rigid region RA1 may be divided into a plurality of regions. That is, the first rigid region RA1 may be divided into a first region in which a light emitting module including the vertical cavity type surface-emitting laser element 100 is disposed, and a second region in which a camera module including a lens assembly is disposed.

In addition, as described above, the vertical cavity type surface-emitting laser element 100, the driver element 500, the light receiving element 610, and the mounting pad 245 of the light receiving element 610 are disposed on the first region. In addition, the image sensor 620, the filter 640, and the lens assembly 650 are disposed on the second area.

Meanwhile, the holder 300 is disposed on the first region and the second region, and including a first opening exposing an upper portion of the first region and a second opening exposing an upper portion of the second region. In addition, the first opening may include a first seating part in which the diffusion part 400 is disposed. In addition, the second opening may include a second seating part on which the lens assembly 650 is disposed.

Meanwhile, the image sensor 620 may be mounted together with an image signal processor (ISP) (not shown), but the CIS (CMOS Image Sensor) used in the embodiment of the present invention is a sensor equipped with an ISP function, and the image signal processing module is not separately provided.

The filter 640 may be positioned on an upper portion of the image sensor 620 to reduce transmittance of infrared rays and increase reflectivity to protect the image sensor 620. In addition, the filter 640 increases the transmittance of a visible ray region recognized by a person so that the image sensor 620 can collect more image information.

Figure 17:
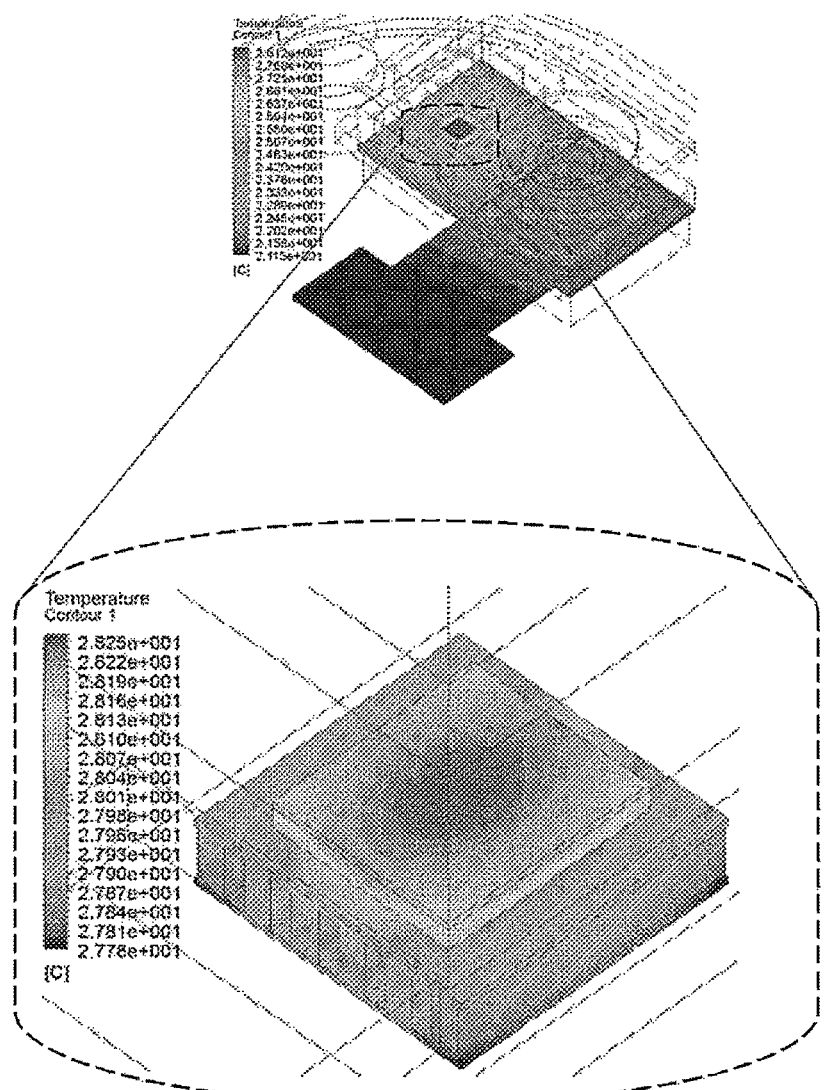
FIG. 17 is a diagram illustrating heat dissipation characteristics in a light emitting package, a light emitting module, and a camera device according to an exemplary embodiment.

FIG. 17 is a diagram showing heat dissipation characteristics in a light emitting package, a light emitting module, and a camera device according to an embodiment of the present invention.

Referring to FIG. 17, in order to confirm heat dissipation characteristics in a light emitting package including vias V1, V2, and V3, a light emitting module, and a camera device according to an embodiment of the present invention, the area of the heat dissipation via was applied as 40% of the surface area of the pad. And, as a result of the thermal simulation, it was confirmed that the heat dissipation characteristics similar to those of the conventional AlN substrate (the second substrate in the comparative example) were exhibited. That is, as shown in FIG. 17, it was confirmed that the ambient temperature was 20° C., and the maximum temperature of the region where the vertical cavity type surface-emission laser element 100 was disposed was 28.26° C. In addition, the maximum was disposed was 38.5° C. when the area of the heat dissipation via is 10% of the surface area of the pad, the maximum was disposed was 33.1° C. when the area of the heat dissipation via is 20% of the surface area of the pad, the maximum was disposed was 30.5° ° C. when the area of the heat dissipation via is 30% of the surface area of the pad, the maximum was disposed was 28° C. when the area of the heat dissipation via is 50% of the surface area of the pad, the maximum was disposed was 27.5° C. when the area of the heat dissipation via is 60% of the surface area of the pad, and the maximum was disposed was 27.2° C. when the area of the heat dissipation via is 75% of the surface area of the pad, Hereinafter, a light emitting package equipped with a vertical cavity type surface-emitting laser element according to another embodiment will be described.

Figure 18:
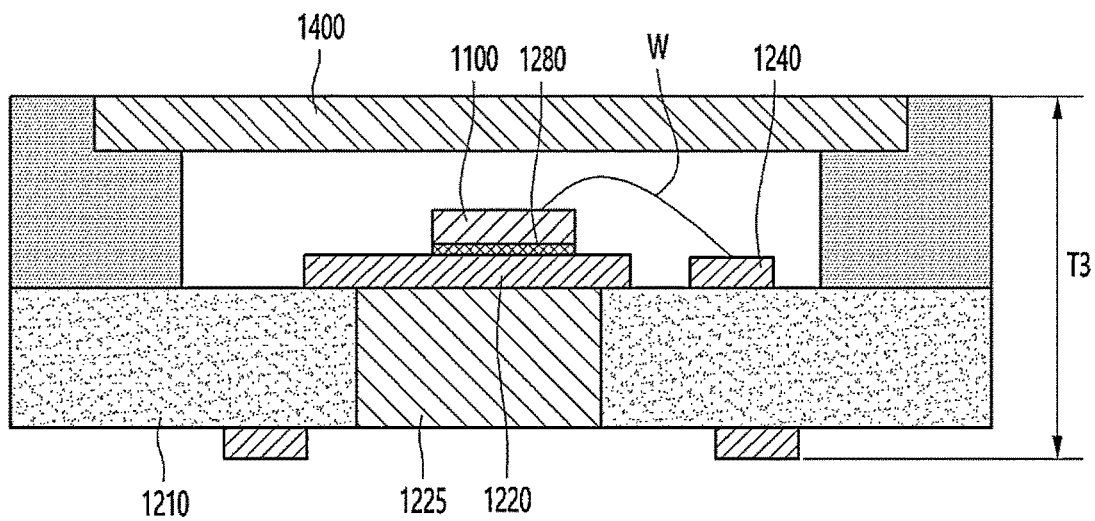
FIG. 18 is a schematic diagram of a printed circuit board equipped with a vertical cavity type surface-emitting laser element according to another embodiment.

FIG. 18 is a schematic diagram of a light emitting package equipped with a vertical cavity type surface-emitting laser element according to an embodiment of the present invention.

Referring to FIG. 18, in the light emitting package according to an embodiment of the present invention, only one printed circuit board may be used to mount the vertical cavity type surface emitting laser element 1100. The substrate 1210 constituting the light emitting package according to the embodiment may be a flexible-rigid printed circuit board (RFPCB). The substrate 1210 constituting the light emitting package according to the embodiment may be a rigid printed circuit board. The substrate 1210 constituting the light emitting package according to the embodiment may be a flexible circuit board.

In detail, in the light emitting package according to the embodiment, a vertical cavity type surface-emission laser element 1100 and a pattern part 1240 connected to the vertical cavity type surface-emission laser element 1100 may be disposed on one substrate 1210.

The substrate 1210 may be a support substrate of a printed circuit board for arranging the vertical cavity type surface-emission laser element 1100. In addition, the substrate 1210 may be a support substrate for disposing the pattern part 1240 electrically connected to the vertical cavity type surface-emission laser element 1100. In addition, the substrate 1210 may be a support substrate for a printed circuit board for disposing various signal wires that transmit signals to the vertical cavity type surface-emission laser element 1100 through the pattern part 1240.

The thickness of the substrate 1210 as described above may be 200 μm to 250 μm. That is, the thickness of the substrate 1210 may be substantially the same as the thickness of the first substrate 10 in the comparative example.

At this time, in the present invention, the vertical cavity type surface emitting laser element 1100 is disposed on the substrate 1210. Accordingly, in the light emitting package according to the embodiment of the present invention, unlike the comparative example, the total thickness of the light emitting package is determined by the thickness of the substrate 1210.

Therefore, in the present invention, it can be manufactured to be slimmer than the total thickness of the light emitting package in the comparative example determined by the second substrate or determined by the sum of the respective thicknesses of the first and second substrates.

That is, the light emitting package in the embodiment as shown in FIG. 18 may have a total thickness T3 including a metal plate of 3.1 mm to 3.43 mm smaller than that of T1 and T2.

Accordingly, the total thickness T3 of the light emitting package in the embodiment may have a thickness of 80% to 95% of the thickness T1 of the comparative example of FIG. 1A. For example, the total thickness T3 of the light emitting package in the embodiment may have a thickness of 85% to 90% of the thickness T1 of the comparative example of FIG. 1A.

In addition, the total thickness T3 of the light emitting package in the embodiment may have a thickness of 20% to 50% of the thickness T2 of the comparative example of FIG. 1B. For example, the total thickness T3 of the light emitting package in the embodiment may have a thickness of 25% to 40% of the thickness T2 of the comparative example of FIG. 1B. For example, the total thickness T3 of the light emitting package in the embodiment may have a thickness of 25% to 35% of the thickness T2 of the comparative example of FIG. 1B.

Since the light emitting package including the vertical cavity type surface-emission laser element 100 according to the embodiment requires only one printed circuit board to mount the vertical cavity type surface-emission laser element 100 and arrange a circuit pattern. It is possible to reduce the total thickness of the light emitting package. In detail, in the light emitting package according to the embodiment, the heat dissipation substrate (the second substrate) including aluminum nitride may be removed, and thus the total thickness of the light emitting package may be reduced.

In addition, in the light emitting package including the vertical cavity type surface-emitting laser element 1100 according to the embodiment, the adhesive layer between the first substrate and the second substrate can be omitted, thereby solving the problem due to poor adhesion of the adhesive layer. Therefore, the reliability of the light emitting package can be improved.

In addition, in the light emitting package including the vertical cavity type surface emitting laser element 1100 according to the embodiment, since the signal is transmitted on one substrate 1210, the signal transmission distance and signal loss can be minimized. Specifically, conventionally, a signal is transmitted between the first substrate and the second substrate, or a signal is transmitted between the cathode electrode and the anode electrode through a wire, thereby increasing the signal transmission distance. On the other hand, an embodiment according to the present invention, the vertical cavity type surface-emission laser element 100 and the circuit patterns are mounted and arranged on the one substrate 1210, and at least one of a cathode electrode and an anode electrode of the vertical cavity type surface emission laser element is not connected via wire, and thereby the signal transmission distance can be drastically reduced.

In addition, the light emitting package including the vertical cavity type surface-emitting laser element 1100 according to the embodiment may be manufactured in a single process. thereby, the embodiment can improve process efficiency and product yield compared to those in which the first and second substrates were respectively manufactured by separate processes in the prior art.

A holder 1300 is disposed on the substrate 1210. Further, a diffusion part 1400 is disposed on the holder 1300 to cover an upper region of the vertical cavity type surface-emission laser element 1100. The diffusion part 1400 may inhibit the light from being directly exposed to the user while diffusing the light generated from the vertical cavity type surface-emission laser element 1100.

A pad 1220 is disposed on the surface of the substrate 1210, in an area vertically overlapping the area where the vertical cavity type surface emitting laser element 1100 is disposed. When the substrate 1210 is formed of at least two or more insulating layers, the pads 1220 may be formed on each insulating layer.

In this case, the vertical cavity type surface-emission laser element 1100 is disposed on an uppermost pad 1220 disposed among the pads 1220. That is, the uppermost pad 1220 is a mounting pad on which the vertical cavity type surface-emission laser element 1100 is mounted.

A heat dissipation part 1225 is disposed in the substrate 1210 while passing through the substrate 1210. The heat dissipation part 1225 may be formed through the substrate 1210 on a region vertically overlapping with the pad 1220.

That is, the pad 1220 is disposed on an uppermost surface of the substrate 1210. In addition, the vertical cavity type surface-emitting laser element 1100 is mounted on the pad 1220. In this case, the heat dissipation part 1225 is disposed on the substrate 1210 vertically overlapped with the pad 1220. The heat dissipation part 1225 is disposed passing through the upper and lower surfaces of the substrate 1210. Accordingly, the upper surface of the heat dissipation part 1225 directly contacts the lower surface of the pad 1220. In addition, the lower surface of the heat dissipation part 1225 is exposed through the lower surface of the substrate 1210.

Meanwhile, a general heat dissipation part may be formed on the substrate 1210 to perform only a heat transfer function of discharging heat generated by the heating element to the outside.

On the other hand, in the present embodiment, the heat dissipation part 1225 may perform a signal transmission function as well as a heat transmission function. That is, the heat dissipation part 1225 may be electrically connected to the vertical cavity type surface emitting laser element. Preferably, the heat dissipation part 1225 may be electrically connected to a cathode electrode of the vertical cavity type surface-emitting laser element. This will be described in detail below.

An entire upper surface of the heat dissipation part 1225 may overlap and be disposed in a vertical direction with the lower surface of the pad 1220. In addition, a part of the upper surface of the heat dissipation part 1225 may be disposed to overlap in a vertical direction with the lower surface of the vertical cavity type surface-emission laser element 1100 mounted on the pad 1220. Accordingly, in the present invention, heat generated by the vertical cavity type surface-emitting laser element 1100 can be emitted to the outside through the heat dissipation part 1225 disposed in an area overlapping the vertical cavity type surface-emission laser element 1100 or the pad 1220 in a vertical direction, thereby heat dissipation of the vertical cavity type surface-emission laser element 1100 may be improved.

Figure 19:
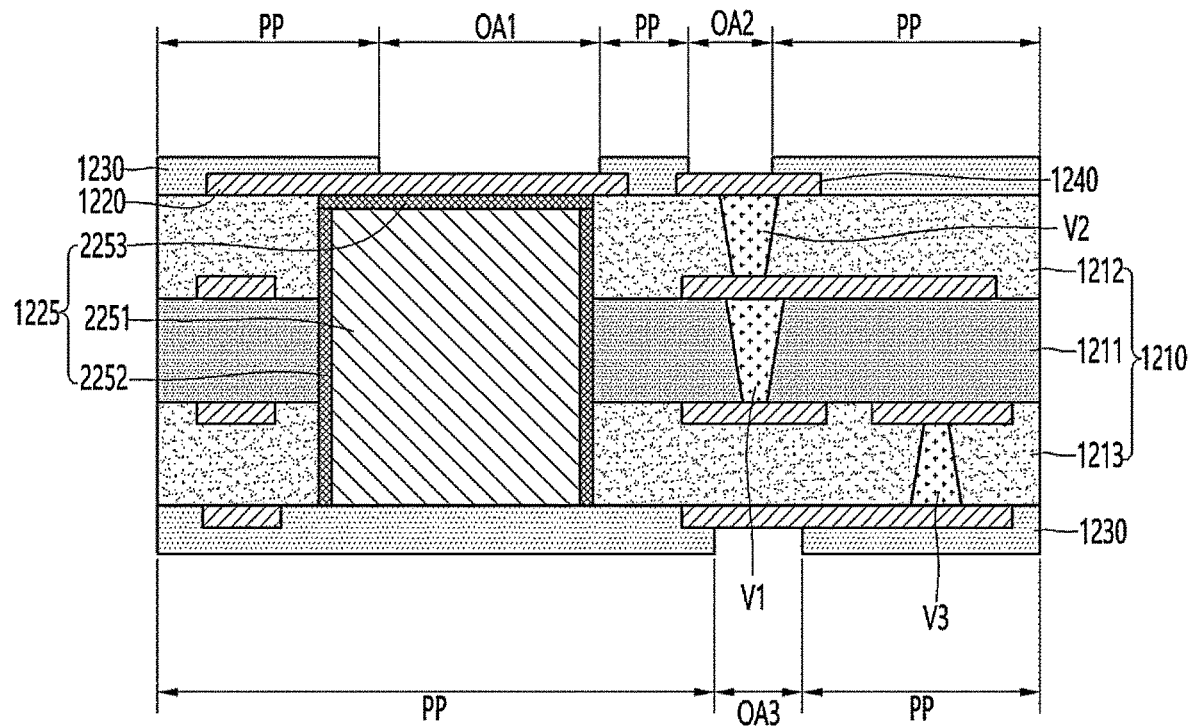
FIG. 19 is a view showing a printed circuit board according to another embodiment.
Figure 20:
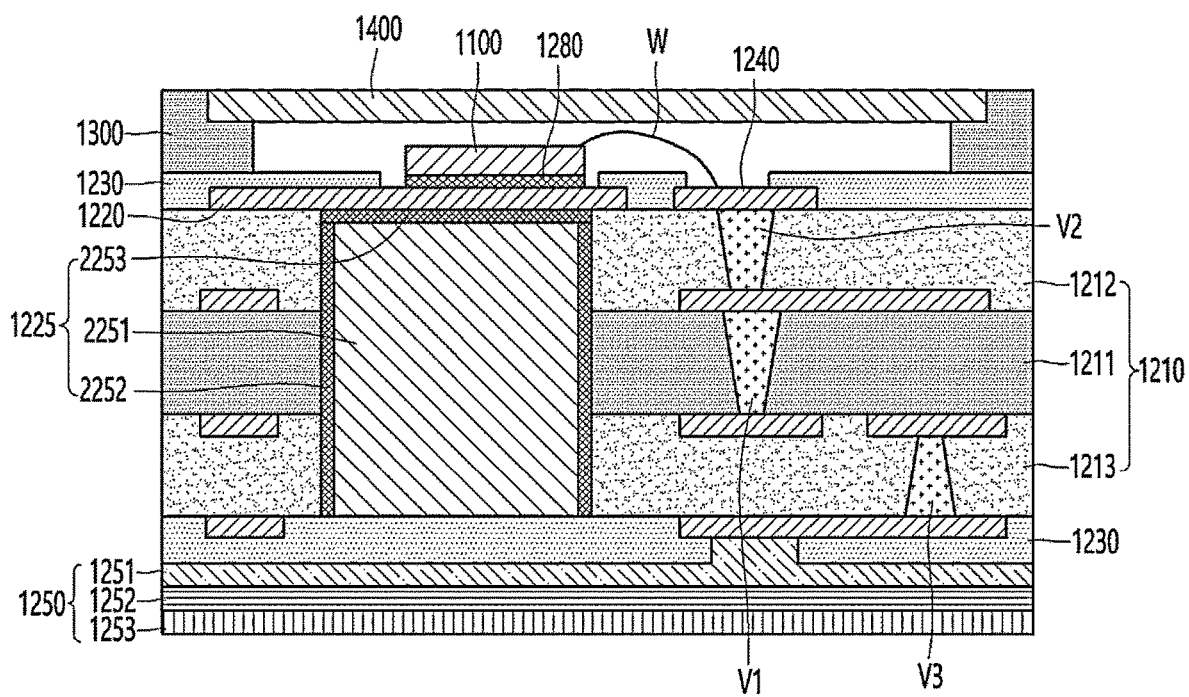
FIG. 20 illustrates a light emitting package in which a vertical cavity type surface-emitting laser element is mounted on the printed circuit board of FIG. 19.

FIG. 19 is a view showing a printed circuit board according to an embodiment of the present invention, and FIG. 20 shows a light emitting package in which a vertical cavity type surface-emitting laser element is mounted on the printed circuit board of FIG. 19.

Referring to FIGS. 19 and 20, the printed circuit board 1200 includes a substrate 1210, a pad 1220, a via (V1, V2, V3), a heat dissipation part 1225, a protective layer 1230, and an electrode pattern 1240. In addition, the light emitting package may further include a vertical cavity type surface-emitting laser element 1100 and a connection part 1280 on the printed circuit board 1200.

The substrate 1210 may have a flat plate structure. The substrate 1210 may be a support substrate that serves as the basis of a printed circuit board (PCB). Here, the substrate 210 may be implemented as a double-sided substrate including a single insulating layer, and may be implemented as a multilayer substrate in which a plurality of insulating layers are successively stacked.

Preferably, the substrate 1210 may include a plurality of insulating layers 1211, 1212, and 1213. The plurality of insulating layers 1211, 1212, 1213 may have a first insulating layer 1211 disposed in a center, and a second insulating layer 1212 disposed on the first insulating layer 1211, and a third insulating layer 1213 disposed under the first insulating layer 1211. Accordingly, the substrate 1210 in the present invention may be configured as 4 layers based on the circuit pattern layer. However, this is only an embodiment of the present invention, and the circuit pattern layer may be composed of two layers (single insulating layer), and differently, may be composed of six or more layers. Hereinafter, for convenience of description, it will be described that the substrate 1210 includes three insulating layers, and accordingly, four circuit pattern layers are implemented on the substrate 1210.

A wiring pattern layer is disposed on the surfaces of the plurality of insulating layers 1211, 1212, and 1213, respectively. In this case, the wiring pattern layer may include a plurality of wirings patterned on the surfaces of the plurality of insulating layers 1211, 1212, and 1213. The plurality of wires may be disposed to be spaced apart from each other on the surfaces of the plurality of insulating layers 1211, 1212, and 1213.

In this case, the area of the substrate 1210 may be larger than the area of the wiring pattern layer. In detail, a plan area of the substrate 1210 may be larger than a plan area of the wiring pattern layer. That is, the wiring pattern layer may be partially disposed on the surface of the substrate 1210. For example, the surface of the wiring pattern layer may directly contact the substrate 1210, and the surface of the substrate 1210 may be exposed between a plurality of wirings constituting the wiring pattern layer. The wiring pattern layer may include a conductive material.

The wiring pattern layer may include a pad 1220 and an electrode pattern 1240. That is, the pad 1220 and the electrode pattern 1240 are formed on the insulating layer 1212 disposed on the uppermost portion of the substrate 1210. The pad 1220 may be a chip mounting pad for mounting a chip on the substrate 1210. The electrode pattern 1240 may be an electrode pad electrically connected to the chip mounted on the pad 1220 through a wire.

That is, when the chip is the vertical cavity type surface-emission laser element 1100, the pad 1220 disposed on an area vertically overlapping the area in which the vertical cavity type surface emission laser element 1100 is disposed and an electrode pattern 1240 connected to an anode electrode of the vertical cavity type surface-emission laser element 1100 through a connection member (eg, a wire) are disposed on the uppermost surface of the substrate 1210.

In addition, the wiring pattern layer may include a ground pattern. That is, a ground pattern (not shown) for grounding the printed circuit board 1200 may be formed on the lowermost surface of the substrate 1210.

The protective layer 1230 may be disposed on the surface of the substrate 1210. Preferably, the protective layer 1230 may be partially disposed on the wiring pattern layer formed on the outermost side of the substrate 1210. Specifically, a part of the protective layer 1230 may be disposed on the outermost surface of the substrate 1210, and the remaining part may be disposed on the wiring pattern layer formed on the outermost part of the substrate 1210. The protective layer 1230 is disposed to cover the wiring pattern layer, and thus, damage or film removal due to oxidation of the wiring pattern layer may be inhibited.

The protective layer 1230 may be partially disposed on the remaining area of the surface of the wiring pattern layer except for an area to be electrically connected to the chip. Accordingly, the protective layer 1230 may partially overlap the wiring pattern layer in a vertical direction.

An area of the protective layer 1230 may be smaller than the area of the substrate 1210. The protective layer 1230 includes a plurality of open areas disposed in an area other than an end part of the substrate 1210.

The protective layer 1230 may include a first open area OA1 having a hole-like shape. The first open area OA1 may be a non-arrangement area of the protective layer 1230 in which the chip (eg, a vertical cavity type surface emitting laser element) is mounted among the wiring pattern layers. Accordingly, the wiring pattern layer may be exposed to the outside in the first open area OA1.

The protective layer 1230 may include a second open area OA2 having the same shape as the hole. The second open area OA2 may be a non-arrangement area of the protective layer 1230 in which the wiring pattern layer is electrically connected to a chip mounted on the first open area OA1. Accordingly, the wiring pattern layer may be exposed to the outside in the second open area OA2.

The protective layer 1230 may include a third open area OA2 having the same shape as the hole. The third open area OA3 may be a non-arrangement area of the protective layer 1230 in an area in which a ground pattern for grounding is formed among the wiring pattern layers. Accordingly, the wiring pattern layer corresponding to the ground pattern in the third open area OA3 may be exposed to the outside.

Meanwhile, the pad 1220 may have a larger area than a chip mounted on the pad 1220. That is, a plan area of the pad 1220 may be larger than a plan area of the chip.

In addition, vias V1, V2, and V3 for signal transmission between different layers may be disposed in the substrate 1210. The vias V1, V2, and V3 may include a first via V1 electrically connecting the wiring pattern layers disposed on the upper and lower surfaces of the first insulating layer 1211. In addition, the vias V1, V2, and V3 include a second via V2 electrically connecting the wiring pattern layer disposed on the upper surface of the second insulating layer 1212 and the upper surface of the first insulating layer 1211. In addition, the vias V1, V2, and V3 include a third via V3 electrically connecting the wiring pattern layers disposed on a lower surface of the first insulating layer 1211 and a lower surface of the third insulating layer 1213.

Meanwhile, when a through hole constituting the vias V1, V2, and V3 is formed, a heat dissipation hole (not shown) is formed in the insulating layers 1211, 1212 and 1213 in a region vertically overlapping with the pad 1220. The heat dissipation hole includes a first portion formed in the first insulating layer 1211 in a region vertically overlapping with the pad 1220, a second portion formed in the second insulating layer 1212 in a region vertically overlapping with the pad 1220, and a third portion formed in the third insulating layer 1213 in a region vertically overlapping with the pad 1220. In addition, the first to third portions are aligned each other in a perpendicular direction. In other words, the first to third parts are formed to be aligned with each other in the insulating layers 1211, 1212, 1213, and accordingly, one heat dissipation hole may be formed according to the combination of the first to third parts.

A heat dissipation part 1225 is formed in the heat dissipation hole. The upper surface of the heat dissipation part 1225 may be directly contacted with the lower surface of the pad 1220. In addition, the lower surface of the heat dissipation part 1225 may be exposed through the lower portion of the third insulating layer 1213 disposed at the lowermost portion of the substrate 1210.

That is, the heat dissipation part 1225 may be formed by filling the heat dissipation hole formed in the substrate 1210. At this time, the heat dissipation part 1225 may be formed of a metal having high thermal conductivity. For example, the heat dissipation part 1225 may be formed of a metal including copper.

For example, the heat dissipation part 1225 may be formed of an alloy containing copper. For example, the heat dissipation part 1225 may be formed of an alloy of copper and nickel. For example, the heat dissipation part 1225 may be formed of an alloy containing silver or aluminum. Preferably, the heat dissipation part 1225 may include the same metal material as the metal material constituting the vias V1, V2, and V3. Therefore, the heat dissipation part 1225 may be formed of the same metal material as the metal material constituting the vias V1, V2, and V3 among copper (Cu), silver (Ag), tin (Sn), gold (Au), nickel (Ni), aluminum, and palladium (Pd).

Meanwhile, the heat dissipation part 1225 may be formed for heat dissipation of a chip disposed on the pad 1220. Therefore, it is preferable that the heat dissipation part 1225 includes a metal material having high thermal conductivity. At this time, the thermal conductivity of copper is about 400 W/mK, and heat generated from the chip can be efficiently transferred to the outside. Therefore, it is preferable that the heat dissipation part 1225 and the vias V1, V2, and V3 are formed of the same metal material including the copper.

The heat dissipation part 1225 may include a heat dissipation coin 2251 and plating parts 2252 and 2253.

The plating parts 2252 and 2253 may be disposed on an inner wall of the heat dissipation hole and an upper surface of the heat dissipation part 1225. Preferably, the plating parts 2252 and 2253 include a first plating part 2252 disposed on the inner wall of the heat dissipation part 1225 and a second plating part 2253 disposed on the heat dissipation coin 2251.

The first plating part 2252 may be formed by plating on the inner wall of the heat dissipation hole before the heat dissipation coin 2251 is inserted. In addition, differently, the first plating part 2252 may be formed by filling the space between the heat dissipation hole and the heat dissipation coin 2251 after the heat dissipation coin 2251 is inserted.

In this case, the first plating part 2252 may include the same metal material as the vias V1, V2, and V3 as described above. The first plating part 2252 may be formed by flash plating for reliability of an electrical signal and protection of the substrate 1210.

It is preferable that the first plating part 2252 is formed to have a thickness satisfying 10 to 15 μm. That is, when a horizontal width of the heat dissipation coin 2251 has the same width as the horizontal width of the heat dissipation hole and the heat dissipation coin 2251 is inserted, the inner wall of the heat dissipation hole may be damaged. Therefore, it is preferable that the horizontal width of the heat dissipation coin 2251 is smaller than the horizontal width of the heat dissipation hole.

In addition, the first plating part 2252 may be formed before the heat dissipation coin 2251 is inserted in order to inhibit damage to the inner wall of the heat dissipation hole when the heat dissipation coin 2251 is inserted. Alternatively, the first plating part 2252 may be formed by filling the space between the heat dissipation coin 2251 and the inner wall of the heat dissipation hole with a metallic material after the heat dissipation coin 2251 is inserted.

The second plating part 2253 is disposed on the heat dissipation coin 2251. The upper surface of the second plating part 2253 may be disposed on the same plane as the upper surface of the second insulating layer 1212. That is, a part of the pad 220 is disposed on the second insulating layer 1212 and a remaining part of the pad 220 is disposed on the heat dissipating part 1225.

In this case, when a step occurs between the surface of the second insulating layer 1212 and the surface of the heat dissipation part 1225, a problem may occur in the plating reliability of the pad 1220. That is, when there is a step difference between the surface of the second insulating layer 1212 and the surface of the heat dissipating part 1225, the step may also occur on the upper surface of the pad 1220. In addition, this affects the mounting reliability of a chip mounted on the pad 1220. Accordingly, in the present invention, the upper surface of the heat dissipation part 1225 and the upper surface of the second insulating layer 1212 are arranged on the same plane.

In this case, the upper surface of the heat dissipation coin 2251 and the upper surface of the second insulating layer 1212 may be placed on the same plane without the second plating part 2253. However, in the process of inserting the heat dissipation coin 2251, it may not be easy to align the surface of the heat dissipation coin 2251 with the surface of the second insulating layer 1212.

Therefore, in the present invention, the heat dissipation coin 2251 is inserted so that the upper surface of the heat dissipation coin 2251 is positioned lower than the upper surface of the second insulating layer 1212. In addition, after the heat dissipation coin 2251 is inserted, the second plating part 2253 is formed on the heat dissipation coin 2251, and The upper surface of the second plating part 2253 and the upper surface of the second insulating layer 1212 are positioned on the same plane.

Meanwhile, the heat dissipation part 1225 may have a height ranging from 200 μm to 300 μm. Accordingly, the lower surface of the heat dissipation part 1225 may be positioned higher than the lower surface of the third insulating layer 1213. In addition, the lower surface of the heat dissipating part 1225 may be disposed on the same plane as the lower surface of the third insulating layer 1213. In addition, a lower surface of the heat dissipation part 1225 may be positioned lower than a lower surface of the third insulating layer 1213.

In addition, the first horizontal width of the heat dissipation part 1225 may have a range of 1 mm to 2 mm. In addition, the second horizontal width of the heat dissipation part 1225 may have a range of 1 mm to 2 mm. Accordingly, the heat dissipation part 1225 may have a circular cross-sectional shape having the same first and second horizontal widths.

Meanwhile, the pad 1220 may have a first horizontal width of 1500 μm and a second horizontal width of 1600 μm. The first horizontal width may be defined as a horizontal width in a horizontal direction or a horizontal width in an X-axis direction. Also, the second horizontal width may be defined as a horizontal width in a vertical direction or a horizontal width in a Y-axis direction. Here, the pad 1220 may have a ' I' shape in cross section. In addition, the first and second horizontal widths may mean the widths of the largest regions in each direction.

A connection part 1280 is disposed on the pad 1220. The connection part 1280 may be a metal paste. For example, the connection part 1280 may be a silver (Ag) paste.

In addition, the vertical cavity type surface-emission laser element 1100 may be disposed on the connection part 1280.

The connection part 1280 may have a hexahedral shape. In detail, the connection part 1280 may have a rectangular cross section. For example, the connection part 1280 may have a square or rectangular cross section.

In addition, the vertical cavity type surface-emission laser element 1100 is disposed on the connection part 1280. That is, the vertical cavity type surface-emission laser element 100 may be mounted on the pad 1220 through the connection part 1280. Accordingly, the pad 1220 may also be referred to as a mounting pad for mounting the vertical cavity type surface-emission laser element 1100.

In this case, the pad 1220 in the present invention may have a surface area of at least 1.2 times or more than the surface area of the vertical cavity type surface-emission laser element 1100. The pad 1220 may have a surface area of at least 1.5 times or more than the surface area of the vertical cavity type surface-emitting laser element 1100. The pad 1220 may have a surface area of at least twice that of the vertical cavity type surface-emission laser element 1100. The pad 1220 may have a surface area of at least 2.5 times or more than the surface area of the vertical cavity type surface-emitting laser element 1100.

That is, the pad 1220 provides a mounting area in which the vertical cavity type surface-emission laser element 1100 is mounted. In addition, the pad 1220 may be provided to transfer heat generated from the vertical cavity type surface-emission laser element 1100 to a lower portion through the heat dissipation part 1225. Accordingly, the pad 1220 may have a surface area of 150% to 300% of the surface area of the vertical cavity type surface-emitting laser element 1100. At this time, if the surface area of the pad 1220 is less than 150% of the surface area of the vertical cavity type surface-emitting laser element 1100, there is a problem in that the heat emission performance of the vertical cavity type surface emitting laser element 1100 decreases. In addition, if the surface area of the pad 1220 is greater than 300% of the surface area of the vertical cavity type surface-emission laser element 100, there is a problem in that the total volume of the light emitting package increases due to an increase in the space occupied by the pad 1220.

In addition, as described above, the heat dissipation part 1225 is disposed in the heat dissipation hole formed on a region vertically overlapping with the pad 1220. In this case, the heat dissipation part 1225 may not only transfer heat generated from the vertical cavity type surface-emission laser element 1100, but may be electrically connected to the vertical cavity type surface-emission laser element 1100. In other words, the heat dissipation part 1225 may be electrically connected to a cathode electrode disposed at the lowermost portion of the vertical cavity type surface-emission laser element 1100.

Meanwhile, the heat dissipation part 1225 may have a circular column shape having the same first horizontal width and the second horizontal width. Preferably, the heat dissipation part 1225 may have a circular cross section. However, the present invention is not limited thereto, and the heat dissipation part 1225 may have an oval shape. In other words, the heat dissipation part 1225 may have a second horizontal width longer than a first horizontal width. In addition, in the drawing, it is shown that only one heat dissipation coin 2251 is inserted under the pad 1220, but this is only an example, and a plurality of heat dissipation coins 2251 spaced apart from each other at a predetermined interval may be disposed under the pad 1220. In other words, a plurality of elliptical heat dissipation coins having a second horizontal width greater than the first horizontal width may be disposed under the pad 220 at a predetermined distance apart from each other.

In this case, the surface area of the heat dissipation part 1225 may have at least 40% or more of the surface area of the pad 1220. For example, the surface area of the heat dissipation part 1225 may have at least 45% or more of the surface area of the first pad 1220. For example, the surface area of the heat dissipation part 1225 may have at least 50% or more of the surface area of the pad 1220. For example, the surface area of the heat dissipation part 1225 may have at least 60% or more of the surface area of the pad 1220. For example, the surface area of the heat dissipation part 1225 may have at least 65% or more of the surface area of the pad 1220. For example, the surface area of the heat dissipation part 1225 may have at least 70% or more of the surface area of the pad 1220. For example, the surface area of the heat dissipation part 1225 may be 75% or less of the surface area of the pad 1220.

If the surface area of the heat dissipation part 1225 is less than 40% of the surface area of the pad 1220, heat generated by the vertical cavity type surface-emission laser element 1100 cannot be efficiently discharged. In addition, if the surface area of the heat dissipation part 1225 is larger than 75% of the surface area of the pad 1220, a space for arranging the wiring pattern layer may be insufficient. That is, a wiring pattern layer is disposed on the surface of the first insulating layer 1211. In this case, some of the wiring pattern layers may be positioned on an area vertically overlapping with the pad 1220. Therefore, as the surface area of the heat dissipation part 1225 increases, the space for arranging the wiring pattern layer on the surface of the first insulating layer 1211 may decrease, and accordingly, the volume of the printed circuit board 1200 may increase. In addition, if all of the wiring pattern layers are arranged in a limited space, the spacing of the wiring pattern layers must be reduced, which may cause an electrical reliability problem in which adjacent wiring pattern layers are connected to each other.

In addition, a part of an upper surface of the heat dissipation part 1225 may overlap the vertical cavity type surface-emitting laser element 1100 in a vertical direction. That is, the heat dissipation part 1225 may include an overlapping region overlapping the lower surface of the vertical cavity type surface-emission laser element 1100 in a vertical direction. In this case, the surface area of the overlapping area of the heat dissipation part 1225 may be 10% or more of the surface area of the vertical cavity type surface-emission laser element 1100. Here, the surface area of the overlapping region may be an area of a surface having a larger area among the upper and lower surfaces of the heat dissipating part 1225. For example, the overlapping area of the heat dissipation part 1225 may be 15% or more of the surface area of the vertical cavity type surface-emission laser element 1100. For example, the overlapping area of the heat dissipation part 1225 may be 20% or more of the surface area of the vertical cavity type surface-emission laser element 1100. For example, the overlapping area of the heat dissipation part 1225 may be 30% or more of the surface area of the vertical cavity type surface-emission laser element 1100. For example, the overlapping area of the heat dissipation part 1225 may be 40% or more of the surface area of the vertical cavity type surface-emission laser element 1100. For example, the overlapping area of the heat dissipation part 1225 may be 50% or more of the surface area of the vertical cavity type surface-emission laser element 1100. For example, the overlapping area of the heat dissipation part 1225 may be 60% or more of the surface area of the vertical cavity type surface-emission laser element 1100.

Accordingly, the light emitting package 1200 according to the present invention may be manufactured to be slimmer than the light emitting package of the comparative example in which the total thickness is determined by the substrate 1210.

The light emitting package including the vertical cavity type surface-emission laser element 1100 according to the embodiment requires only one substrate to mount the vertical cavity type surface-emission laser element 1100 and arrange a circuit pattern layer. Accordingly, the total thickness of the light emitting package may be reduced. In detail, the light emitting package according to the embodiment may remove the heat dissipation substrate (the second substrate) including aluminum nitride.

In addition, in the light emitting package including the vertical cavity type surface-emission laser element 1100 according to the embodiment, the adhesive layer between the first substrate and the second substrate in the comparative example may be omitted. Since the problem caused by poor adhesion of the adhesive layer can be solved, the reliability of the light emitting package can be improved.

In addition, in the light emitting package including the vertical cavity type surface emitting laser element 1100 according to the embodiment, since the signal is transmitted on one substrate 1210, the signal transmission distance and signal loss can be minimized. Specifically, conventionally, a signal is transmitted between the first substrate and the second substrate, or a signal is transmitted between the cathode electrode and the anode electrode through a wire, thereby increasing the signal transmission distance. On the other hand, an embodiment according to the present invention, the vertical cavity type surface-emission laser element 1100 and the circuit patterns are mounted and arranged on the one substrate 1210, thereby the signal transmission distance can be drastically reduced. Specifically, in the present invention, when the substrate is connected to the cathode of the vertical cavity type surface-emitting laser element, signal transmission is performed through the additional connection without wire bonding, thereby minimizing signal loss.

In addition, the light emitting package including the vertical cavity type surface-emission laser element 1100 according to the embodiment can be manufactured in a single process (that is, a process of manufacturing one substrate), and thereby, the embodiment can improve process efficiency and product yield compared to those in which the first and second substrates were respectively manufactured by separate processes in the prior art.

Meanwhile, the protective layer 1230 exposes a surface of at least one wiring pattern layer among the wiring pattern layers. In this case, the protective layer 1230 may include an upper protective layer 1230 disposed on the second insulating layer 1212 and a lower protective layer 1230 disposed under the third insulating layer 1213.

In addition, the upper protective layer 1230 may expose the vertical cavity type surface-emitting laser element 1100 and the electrode pattern 1240 mounted on the second insulating layer 1212. In addition, the lower protective layer 1230 may expose a ground pattern for the ground.

In addition, a protective part 1250 may be disposed under the lower protective layer 1230.

The protective part 1250 may be entirely formed on the lower surface of the lower protective layer 1230 including the ground area exposed through the lower protective layer 1230.

In this case, the protective part 1250 may include a shielding layer 1251 disposed under a lower surface of the lower protective layer 1230 and the ground area exposed through the lower protective layer 1230. The shielding layer 1251 may be a shielding layer that shields Electro Magnetic Interference (EMI).

An adhesive layer 1252 may be disposed on a lower surface of the shielding layer 1251. The adhesive layer 1252 may be disposed under the shielding layer 1251 for attaching the metal plate 1253. The metal plate 1253 may be a sus (SUS). The metal plate 1253 may have a thickness of 100 μm.

Meanwhile, a holder 1300 is disposed on the upper protective layer 1230. In this case, an adhesive layer (not shown) may be disposed between the upper protective layer 1230 and the holder 1300, and the holder 1300 may be stably attached to the upper protective layer 1230.

In this case, the holder 1300 includes a seating part on which the diffusion part 1400 is seated while exposing the upper region of the vertical cavity type surface-emission laser element 1100. In addition, a diffusion part 1400 is disposed on the seating part to cover an upper region of the vertical cavity type surface-emission laser element 1100. The diffusion part 1400 may be referred to as a diffuser.

As described above, in the printed circuit board and the light emitting package including the vertical cavity type surface-emitting laser element according to the embodiment, the heat dissipation part is inserted on the area vertically overlapping the vertical cavity type surface emission laser element. In this case, the width of the heat dissipation part may have a width greater than that of the vertical cavity type surface-emission laser element. Accordingly, in the present invention, heat generated from the vertical cavity type surface-emission laser element can be efficiently discharged through the arrangement of the heat dissipation part, and thus heat dissipation characteristics can be improved.

Figure 21:
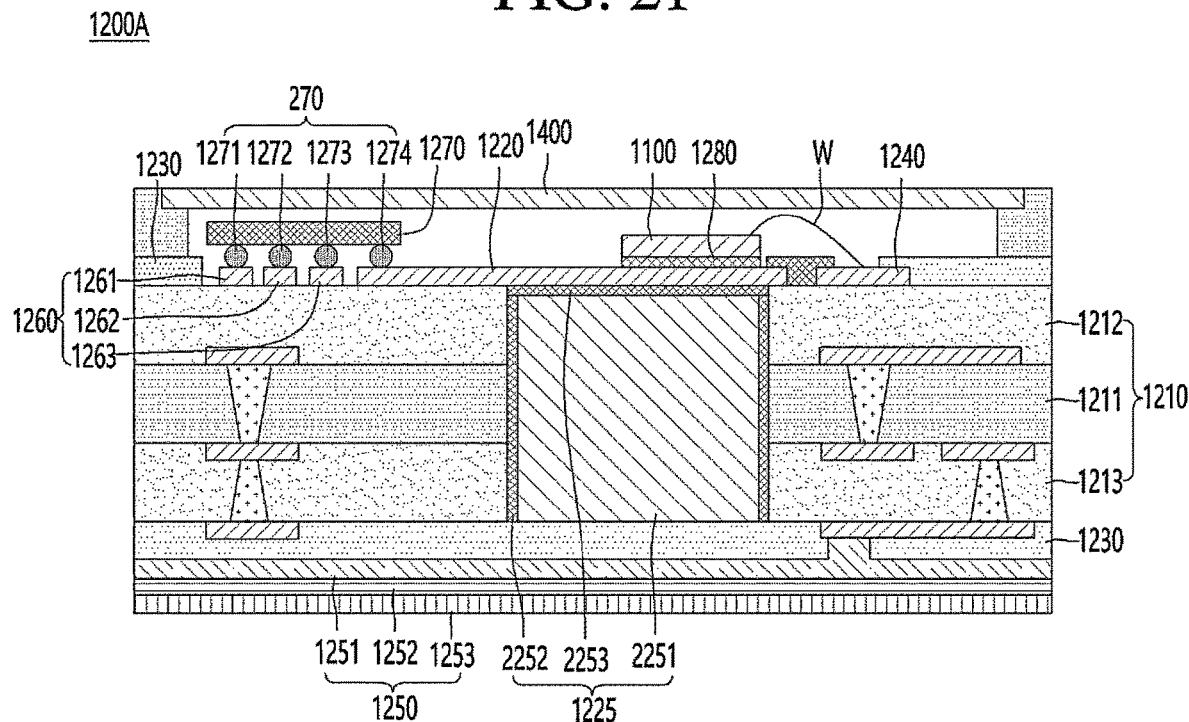
FIG. 21 is a diagram illustrating a light emitting module according to another embodiment.
Figure 22A:
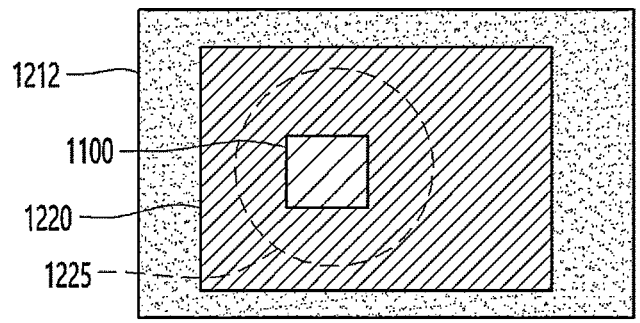
FIGS. 22A-22C are plan views showing an arrangement of a vertical cavity type surface-emitting laser element according to another embodiment.
Figure 22B:
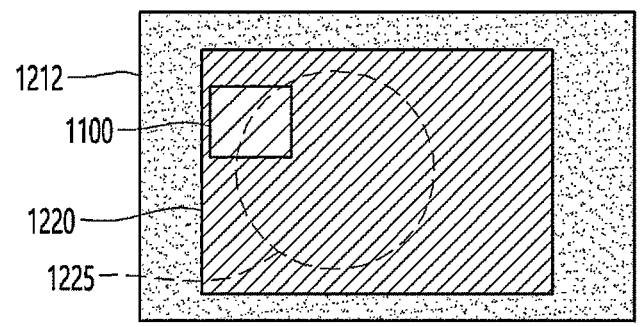
Figure 22C:
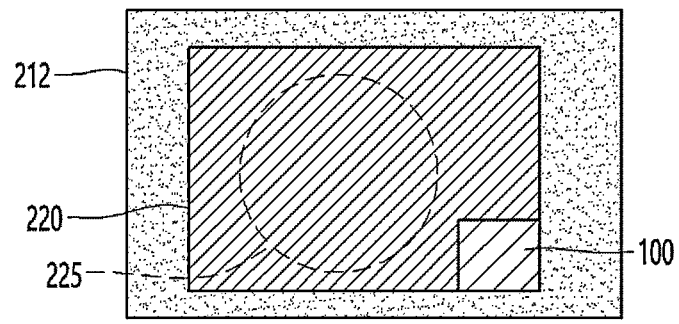
Figure 23:
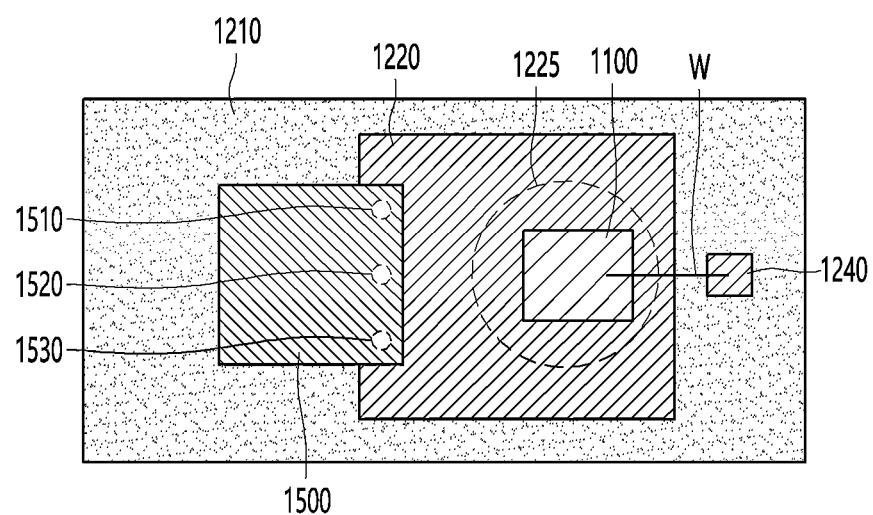
FIG. 23 is a plan view showing a connection relationship between the driver element of FIG. 21 and the vertical cavity type surface-emission laser element.
Figure 24A:
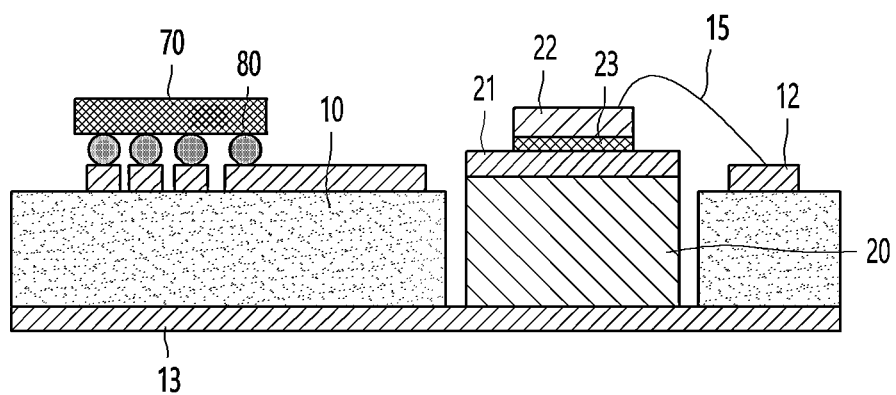
FIGS. 24A and 24B are diagrams comparing circuit distances between a driver element of the present embodiment and a comparative example and a cathode electrode of a vertical cavity type surface-emission laser element.
Figure 24B:
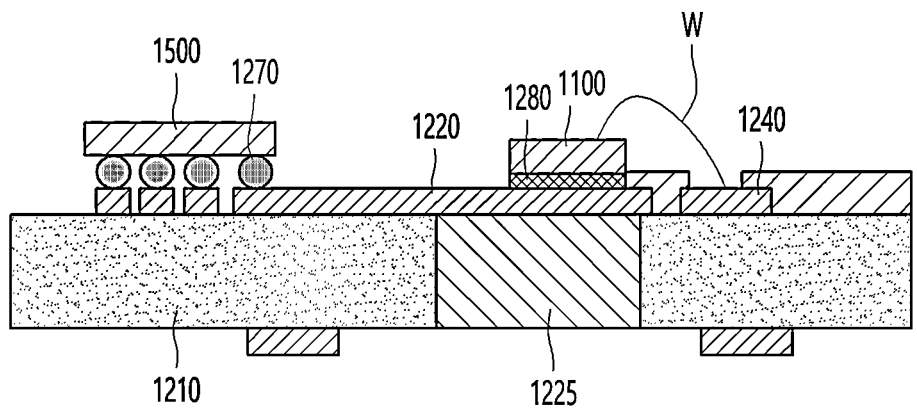

FIG. 21 is a view showing a light emitting module according to an embodiment of the present invention, FIGS. 22A-22C are plan views showing an arrangement of a vertical cavity type surface-emitting laser element according to an embodiment of the present invention, FIG. 23 is a plan view showing a connection relationship between the driver element of FIG. 21 and the vertical cavity type surface-emitting laser element, and FIGS. 24A and 24B are views comparing circuit distances between a driver element of the present invention and a comparative example and a cathode electrode of a vertical cavity type surface-emitting laser element.

Hereinafter, a light emitting module according to an embodiment of the present invention will be described with reference to FIGS. 21 to 24B.

In the light emitting module according to the exemplary embodiment of the present invention, the driver element 1500 may be additionally disposed on the insulating layers 1211, 1212, and 1213 in the light emitting package of FIG. 19.

That is, the light emitting module includes a substrate 1210 including insulating layers 1211, 1212, and 1213, a pad 1220, a heat dissipation part 1225, a protective layer 1230, an electrode pattern 1240, and a protective part 1250.

In this case, a connection pattern 1260 for mounting the driver element 1500 is additionally formed on an upper surface of the uppermost insulating layer 1212 among the insulating layers 1211, 1212, and 1213.

In addition, a second connection part 1270 is disposed on the connection pattern 1260, and the driver element 1500 is attached on the second connection part 1270 by adhesive force provided by the second connection part 1270. That is, the vertical cavity type surface-emitting laser element 1100 is attached to the pad 1220 through the first connection part 1280, and the driver element 1500 is attached on the connection pattern 1260 through the second connection part 1270.

In this case, the first connection part 1280 and the second connection part 1270 may have different shapes. For example, the first connection part 1280 may have a hexahedral shape. In detail, the cross section of the first connection part 1280 may have a rectangular shape. In more detail, the cross section of the first connection part 1280 may have a rectangular or square shape. For example, the second connection part 1270 may have a spherical shape. The cross-section of the second connection part 1270 may have a circular shape. Alternatively, the second connection part 1270 may have a partially or wholly rounded shape. For example, the cross-sectional shape of the second connection part 1270 may include a flat surface at one side and a curved surface at the other side opposite to the one side. In addition, the first connection part 1280 and the second connection part 1270 may have different sizes.

Meanwhile, a plurality of terminals (not shown) are positioned on the lower surface of the driver element 1500. The plurality of terminals may include a reception terminal for receiving a signal, a transmission terminal for transmitting a signal, and a ground terminal. In this case, conventionally, the ground terminal of the driver element 1500 and the ground terminal of the vertical cavity type surface-emission laser element 1100 are interconnected through a connection member such as a separate wire, but in this embodiment, there may be no separate wire. In addition, a separate wire may not be required when connecting the ground terminal and the cathode electrode of the vertical cavity type surface-emission laser element 1100.

Alternatively, in the present invention, both the cathode electrode and the ground terminal of the driver element 1500 may be positioned on the pad 1220.

That is, the connection pattern 1260 on which the driver element 1500 is disposed is disposed on the upper surface of the second insulating layer 1212. In this case, the connection pattern 1260 may be disposed on the second insulating layer 1212 according to the number of terminals provided in the driver element 500. In this case, in the present invention, a part of the pad 1220 on which the vertical cavity type surface-emission laser element 1100 is disposed is used as a connection pattern of the driver element 1500

That is, the connection pattern 1260 may include first to third connection patterns 1261, 1262, and 1263. In addition, first to third sub-connection parts 1271, 1272, and 1273 constituting the second connection part 1270 are disposed on the first to third connection patterns 1261, 1262, and 1263, respectively. In addition, the driver element 1500 may be mounted on the connection pattern through the first to third sub-connection parts 1271, 1272, and 1273. At this time, a fourth sub-connection part 1274 constituting the second connection part 1270 is also located on the pad 1222, and a ground terminal of the driver element 1500 may be located on the fourth sub-connection part 1274.

In other words, in the related art, the ground terminal of the driver element 1500 is disposed on a separate connection pattern, and accordingly, the connection pattern connected to the ground terminal is electrically connected with the cathode electrode through a wire In contrast, in the present invention, the ground terminal of the driver element 1500 is also disposed on the pad on which the cathode electrode is disposed, so that the signal distance between the cathode electrode and the driver element 500 can be minimized.

Accordingly, in the present invention, a part of the driver element 1500 may be positioned on a region vertically overlapping with the pad 1220. In this case, a part of the driver element 1500 positioned on a region vertically overlapping the pad 1220 may be a region in which a ground terminal is formed.

Meanwhile, referring to FIGS. 22A-22C, the vertical cavity type surface-emission laser element 1100 may be disposed on the pad 1220 and may be disposed to overlap the heat dissipating part 1225 in a vertical direction.

That is, as shown in FIG. 22A, the vertical cavity type surface-emission laser element 1100 may be disposed in a central region of the pad 1220. Accordingly, the entire area of the vertical cavity type surface-emission laser element 1100 may be disposed to overlap the heat dissipation part 1225.

In contrast, as shown in FIG. 22B, the vertical cavity type surface-emitting laser element 1100 is disposed in the outer region of the pad 1220 so that only a part of the lower surface of the vertical cavity type surface-emitting laser element 1100 may be disposed to overlap the heat dissipation part 1225.

In addition, as shown in FIG. 22C, the vertical cavity type surface-emission laser element 1100 may not include an area overlapping the heat dissipation part 1225 by being disposed in the edge area of the pad 1220. However, in this case, the distance between the vertical cavity type surface-emission laser element 1100 and the heat dissipation part 1225 increases, and a problem may occur in heat dissipation. Accordingly, in the present invention, as shown in FIGS. 22A and 22B, a part of the vertical cavity type surface-emission laser element 1100 is disposed so as to overlap the heat dissipation part 1225 in a vertical direction.

Meanwhile, as shown in FIG. 23, a plurality of ground terminals may be included on a lower surface of the driver element 1500. For example, the driver element 1500 may include first to third ground terminals 1510, 1520, and 1530. In addition, the first to third ground terminals 1510, 1520, and 1530 may be directly attached to the pad through the second connection part 1270 disposed on the pad 1220. Accordingly, the ground terminal may be connected to the cathode electrode of the vertical cavity type surface-emitting laser element 1100 disposed on the pad 1220 through the first connection part 1280 without a separate connection member such as a wire.

Referring to FIGS. 24A and 24B, in FIG. 24A, a first connection part 23 is disposed on a separate second substrate 20, and a vertical cavity type surface emitting laser element 22 is disposed on the first connection part 23.

In addition, the driver element 70 is disposed on the first substrate 10. That is, the driver element 70 is mounted on the circuit pattern layer 11 disposed on the substrate through the second connection part 80.

Accordingly, the driver element 70 and the vertical cavity type surface-emission laser element 22 are electrically connected to each other through a separate connection member 14. Specifically, the ground terminal of the driver element 70 is positioned on the circuit pattern layer 11 disposed on the first substrate 10. In addition, the cathode electrode of the vertical cavity type surface-emission laser element 22 is positioned on the metal layer 21 disposed on the second substrate 20. The conventional second substrate 20 is made thicker than the first substrate 10 because it is difficult to adjust the height due to the use of the AlN substrate. Moreover, in the related art, the second substrate 20 could be manufactured at the same height as the first substrate 10, but it was difficult because a process for matching the manufacturing cost and height was separately required. In addition, even if the height of the second substrate 20 was adjusted to the height of the first substrate 10, the second substrate 10 as a separate substrate had to be inserted into the first substrate 10, thereby there was a space between the first and second substrates, so that the circuit pattern layer 11 and the metal layer 21 could not be made together. Accordingly, in the conventional light emitting module, the connection member 14 is positioned between the circuit pattern layer 11 and the metal layer 21.

In contrast, in the present invention, as shown in FIG. 24B, the first connection part 1280 in which the vertical cavity type surface-emission laser element is disposed and the second connection part 1270 in which the driver element is disposed are both positioned on one pad 1220. That is, since the cathode electrode of the vertical cavity type surface-emission laser element 1100 is positioned on the pad 1220, a separate connection member is unnecessary. In addition, a ground terminal of the driver element 1500 may also be located on the pad 1220.

Therefore, in the present invention, unlike the comparative example, the signal distance between the driver element 1500 and the vertical cavity type surface-emission laser element 1100 can be minimized, thereby, signal loss can be minimized by reducing inductance.

Figure 25:
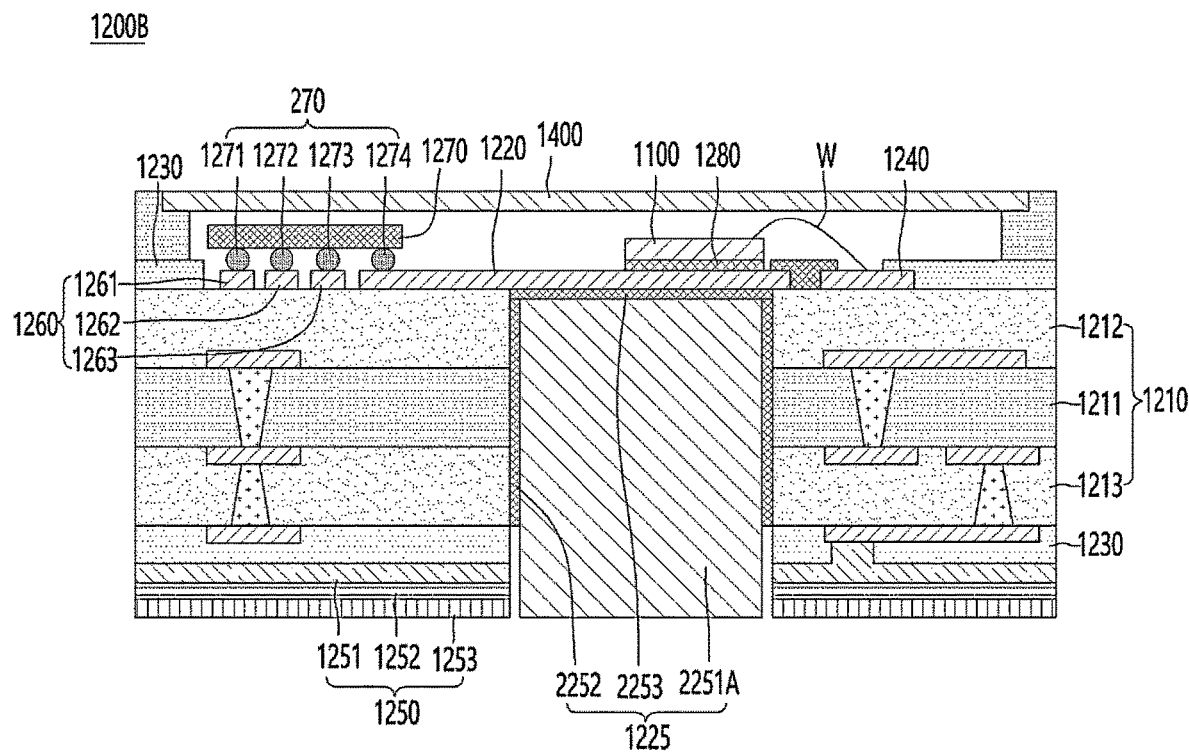
FIG. 25 is a view showing a light emitting module according to another embodiment of the present invention.

FIG. 25 is a diagram illustrating a light emitting module according to another embodiment.

Referring to FIG. 25, since the light emitting module is substantially the same as the structure of FIG. 21 except for the heat dissipation part 1225 and the protection part 1250, a description thereof will be omitted.

Unlike in FIG. 21, the heat dissipation part 1225 has a height greater than that of the substrate 1210. Accordingly, a part of the heat dissipation part 1225 is formed to protrude from the lower surface of the substrate 1210.

Accordingly, in FIG. 21, the protective layer 1230 is disposed to cover the lower surface of the heat dissipation part 1225.

Alternatively, as shown in FIG. 25, the protective layer 1230 is disposed on the lower surface of the third insulating layer 1213, and a first hole exposing the heat dissipation part 1225 may be formed. In addition, the protective layer 1230 may be disposed to be spaced apart from the heat dissipating part 1225 by a predetermined distance. In other words, a space of a predetermined interval may be formed between the heat dissipation part 1225 and the protective layer 1230. However, differently, the protective layer 1230 and the heat dissipating part 1225 may contact each other.

The protective part 1250 is disposed under the protective layer 1230. As described above, the protective part 1250 may include a shielding layer 1251, an adhesive layer 1252, and a metal plate 1253. In addition, each of the shielding layer 1251, the adhesive layer 1252, and the metal plate 1253 constituting the protective layer 1230 may be disposed under the protective layer 1230 and may include a second hole exposing the heat dissipation part 1225. At this time, the heat dissipation part 1225 and the protective part 1250 should not contact each other. That is, the protective part 1250 is a ground area in contact with the ground pattern, and thus, when the protective part 1250 contacts the heat dissipation part 1225, an electrical reliability problem occurs. Accordingly, the heat dissipation part 1225 and the protective part 1250 may be disposed in a state spaced apart from each other by a predetermined interval.

Figure 26:
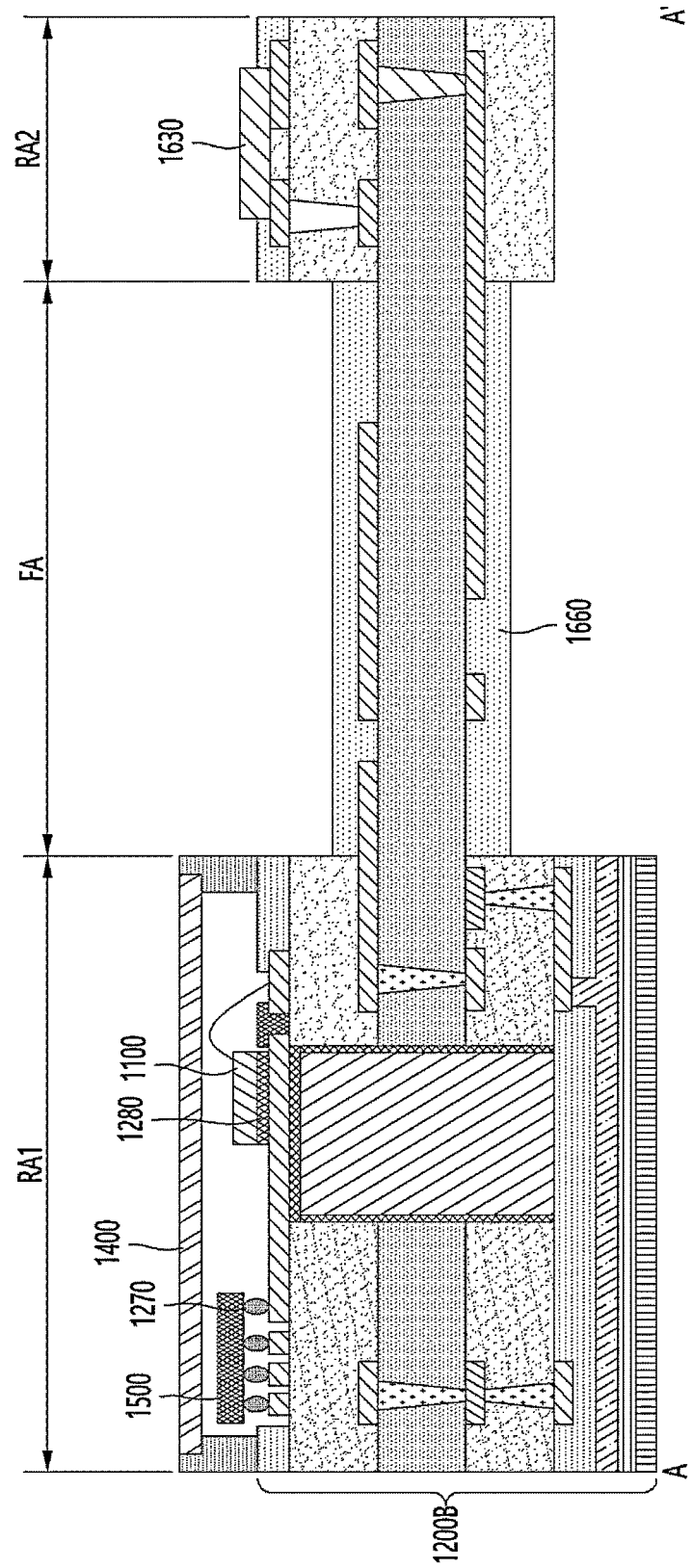
FIG. 26 is a cross-sectional view illustrating a camera device according to another embodiment.

FIG. 26 is a cross-sectional view illustrating a camera device according to another embodiment.

Referring to FIG. 26, the substrate 1210 may include a first rigid region RA1, a flexible region FA, and a second rigid region RA2. In addition, the connector 1630 is disposed on the second rigid region RA2.

A flexible area FA is positioned between the first rigid area RA1 and the second rigid area RA2. The flexible region FA has a stacked structure of a substrate 1210 different from the rigid region. That is, the substrate 1210 of the first and second rigid regions RA1 and RA2 may include a plurality of insulating layers 1211, 1212 and 1213 as described above. In addition, only the first insulating layer 1211 excluding the second insulating layer 1212 and the third insulating layer 1213 is positioned in the flexible region FA. Accordingly, the flexible region FA has a flexible characteristic according to the characteristic of the first insulating layer 1211. Meanwhile, a cover lay 1660 is positioned on the surface of the first insulating layer 1211 of the flexible region FA. The cover lay 1660 may protect the circuit pattern layer disposed on the surface of the first insulating layer 1211 of the flexible region FA Meanwhile, the first rigid region RA1 may be divided into a plurality of regions. That is, the first rigid region RA1 may be divided into a first region in which a light emitting module including the vertical cavity type surface-emitting laser element 1100 is disposed, and a second region in which a camera module including a lens assembly is disposed.

Meanwhile, since the detailed structure for each region of the substrate has already been described in FIG. 15, a detailed description thereof will be omitted.

Figure 27:
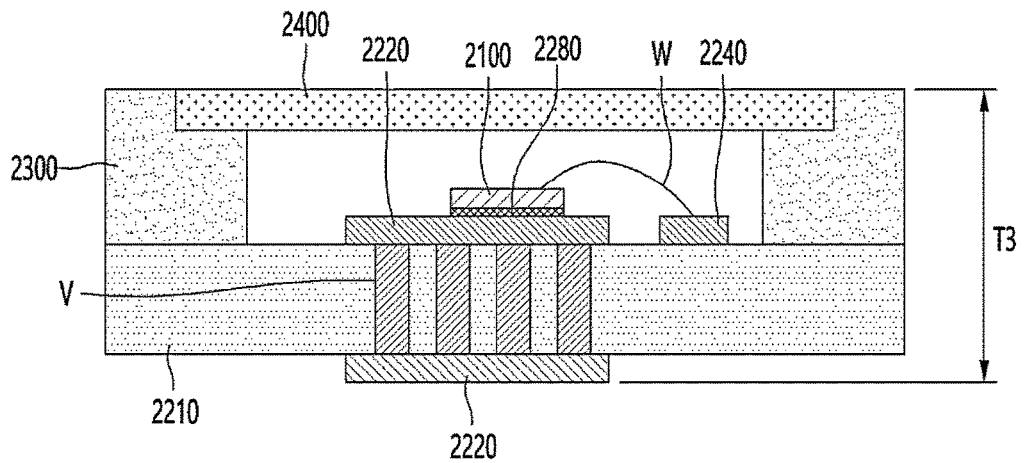
FIG. 27 is a schematic diagram of a light emitting package according to another exemplary embodiment.

FIG. 27 is a schematic diagram of a light emitting package according to another exemplary embodiment.

Referring to FIG. 27, in the light emitting package according to an embodiment of the present invention, only one printed circuit board may be used to mount the vertical cavity type surface emitting laser element 2100. The substrate 2210 constituting the light emitting package according to the embodiment may be a flexible-rigid printed circuit board (RFPCB). The substrate 2210 constituting the light emitting package according to the embodiment may be a rigid printed circuit board. The substrate 2210 constituting the light emitting package according to the embodiment may be a flexible circuit board.

In detail, in the light emitting package according to the embodiment, a vertical cavity type surface-emission laser element 2100 and a pattern part 2240 connected to the vertical cavity type surface-emission laser element 2100 may be disposed on one substrate 2210.

That is, the light emitting package in the embodiment as shown in FIG. 27 may have a total thickness T3 including a metal plate of 3.1 mm to 3.43 mm smaller than that of T1 and T2.

Accordingly, the total thickness T3 of the light emitting package in the embodiment may have a thickness of 80% to 95% of the thickness T1 of the comparative example of FIG. 1A. For example, the total thickness T3 of the light emitting package in the embodiment may have a thickness of 85% to 90% of the thickness T1 of the comparative example of FIG. 1A.

In addition, the total thickness T3 of the light emitting package in the embodiment may have a thickness of 20% to 50% of the thickness T2 of the comparative example of FIG. 1B. For example, the total thickness T3 of the light emitting package in the embodiment may have a thickness of 25% to 40% of the thickness T2 of the comparative example of FIG. 1B. For example, the total thickness T3 of the light emitting package in the embodiment may have a thickness of 25% to 35% of the thickness T2 of the comparative example of FIG. 1B.

A holder 2300 is disposed on the substrate 2210. Further, a diffusion part 2400 is disposed on the holder 2300 to cover an upper region of the vertical cavity type surface-emission laser element 2100. The diffusion part 2400 may inhibit the light from being directly exposed to the user while diffusing the light generated from the vertical cavity type surface-emission laser element 2100.

A pad 220 is disposed on the surface of the substrate 2210, in an area vertically overlapping the area where the vertical cavity type surface emitting laser element 100 is disposed. When the substrate 2210 is formed of at least two or more insulating layers, the pads 2220 may be formed on each insulating layer.

In this case, the vertical cavity type surface-emission laser element 100 is disposed on an uppermost pad 2220 disposed among the pads 2220. That is, the uppermost pad 2220 is a mounting pad on which the vertical cavity type surface-emission laser element 2100 is mounted.

In addition, vias V for electrically connecting the pads 2220 disposed in different layers are disposed in the substrate 2210. In this case, a plurality of vias may be disposed in the substrate 210.

At this time, the plurality of vias include a signal transmission via electrically connecting circuit patterns of different layers to each other, and a heat dissipation via for discharging heat generated from the vertical cavity type surface emitting laser element 2100 to the outside. In addition, the heat dissipation via may be positioned on a region overlapping the pad 2220 in a vertical direction, based on a region where the pad 2220 is disposed. That is, the connection part 2280 is disposed on the uppermost pad 2220, and the vertical cavity type surface-emission laser element 2100 is mounted on the uppermost pad 2220 through the connection part 2280.

In addition, the heat dissipation via V is disposed between the uppermost pad 2220 and the lowermost pad 2220. In this case, the heat dissipation via V is positioned on a region overlapping the uppermost pad 2220 in a vertical direction, and thus heat transferred through the uppermost pad 2220 may be discharged to the outside.

At this time, the general heat dissipation vias are disposed in the printed circuit board only for the purpose of heat transfer.

On the other hand, in the present invention, not only the heat transfer function but also a signal transfer function can be performed. That is, the heat dissipation via V may be electrically connected to the vertical cavity type surface emitting laser element 2100. Preferably, the heat dissipation via V may be electrically connected to a cathode electrode of the vertical cavity type surface-emission laser element 2100. This will be described in detail below.

In this case, the heat dissipation via V may include a plurality of via parts VP spaced apart from each other in the first direction and the second direction within the substrate 2210. In FIG. 27, it is shown that the heat dissipation via V is composed of four via parts VP spaced apart from each other by a predetermined distance based on the first direction. The first direction may be a horizontal direction (or an X-axis direction) of an upper surface of the substrate 2210.

However, the number of via parts VP may be proportional to the area of the pad 2220. That is, the number of via parts may be increased or decreased to increase or decrease the area of the via parts VP.

In addition, each of the via parts VP constituting the heat dissipation via V may have a circular shape spaced apart from each other by a predetermined interval in the first direction and the second direction. That is, each of the via parts may have substantially the same widths of the first direction and the second direction.

That is, the heat dissipation via V may include a plurality of first via parts spaced apart from each other in a first direction, and a plurality of second via parts spaced apart from each other in a second direction from each of the plurality of first via parts. have.

As described above, in the embodiment as described above, by configuring a heat dissipation via including a plurality of via parts spaced apart from each other in the first direction and the second direction, the area of the heat dissipation via can be increased, so that more heat generated from the vertical cavity type surface emitting laser element can be radiated to the outside. Specifically, in the present invention, a heat dissipation via (V) including a plurality of via parts is disposed on a region vertically overlapping with the pad 2220, and the vertical cavity type surface emitting laser element 2100 is provided through the disposed heat dissipation via (V). By allowing the heat generated from to be radiated to the outside, heat dissipation of the vertical cavity type surface-emission laser element 100 may be improved.

Figure 28:
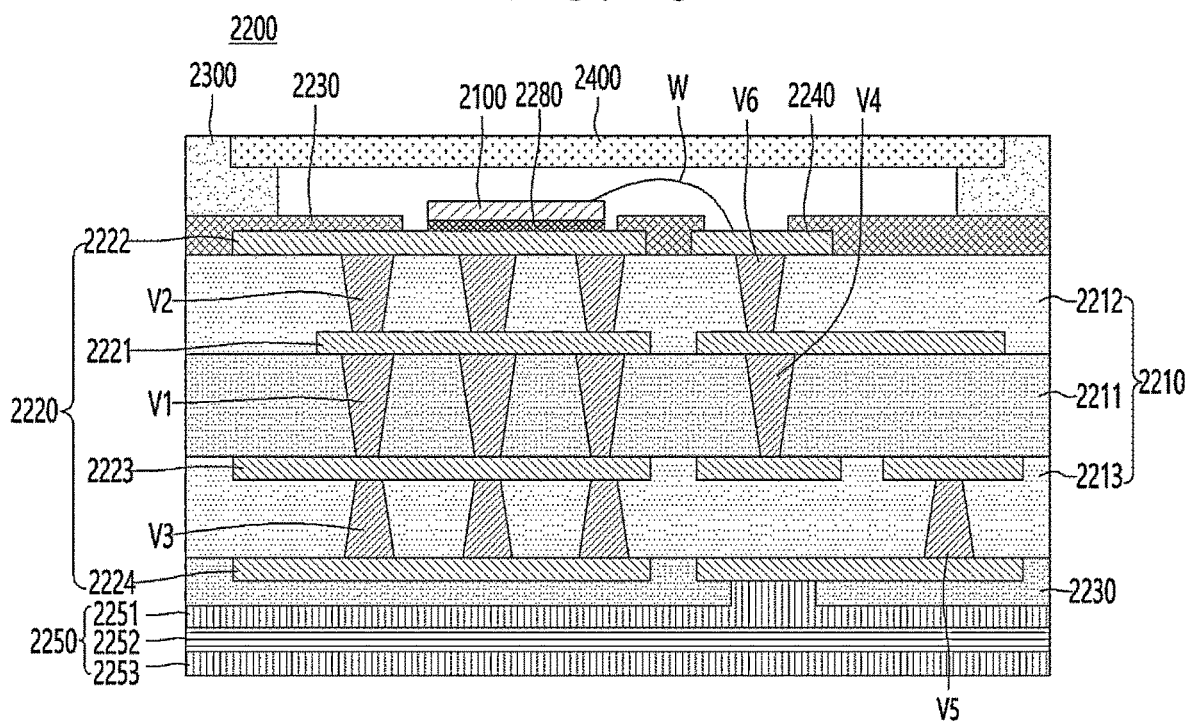
FIG. 28 is a diagram illustrating the light emitting package of FIG. 27.
Figure 29A:
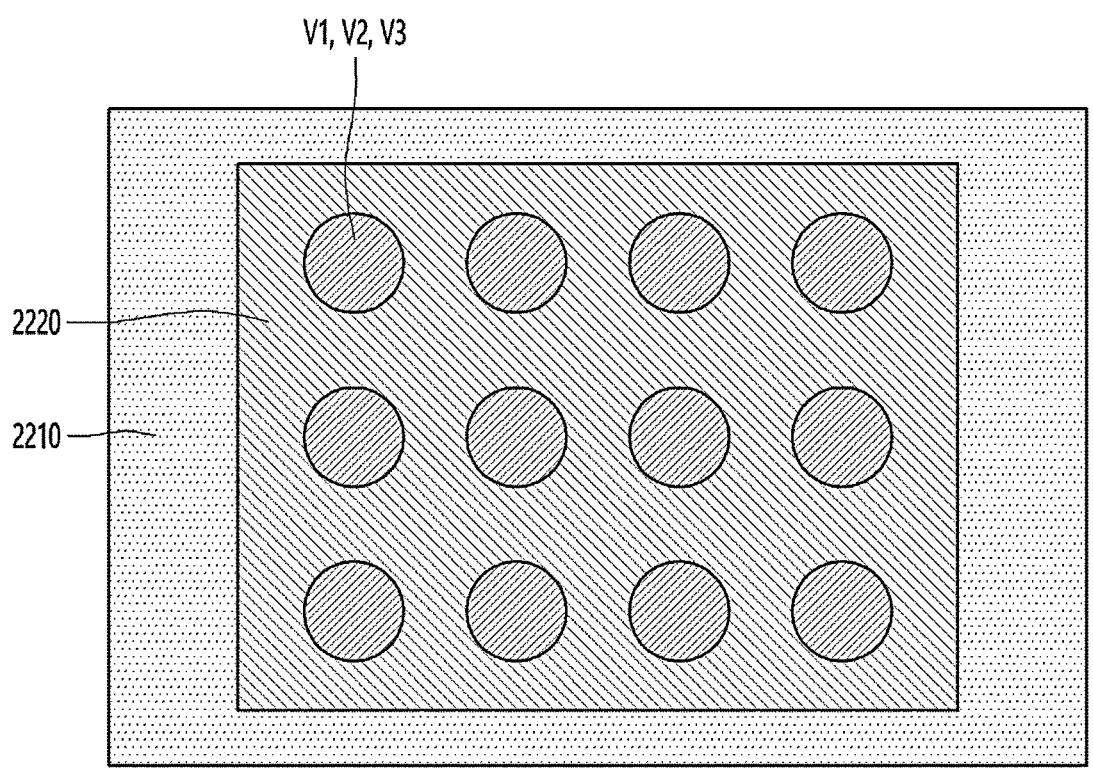
FIGS. 29A and 29B are plan views of the vias shown in FIG. 27.
Figure 29B:
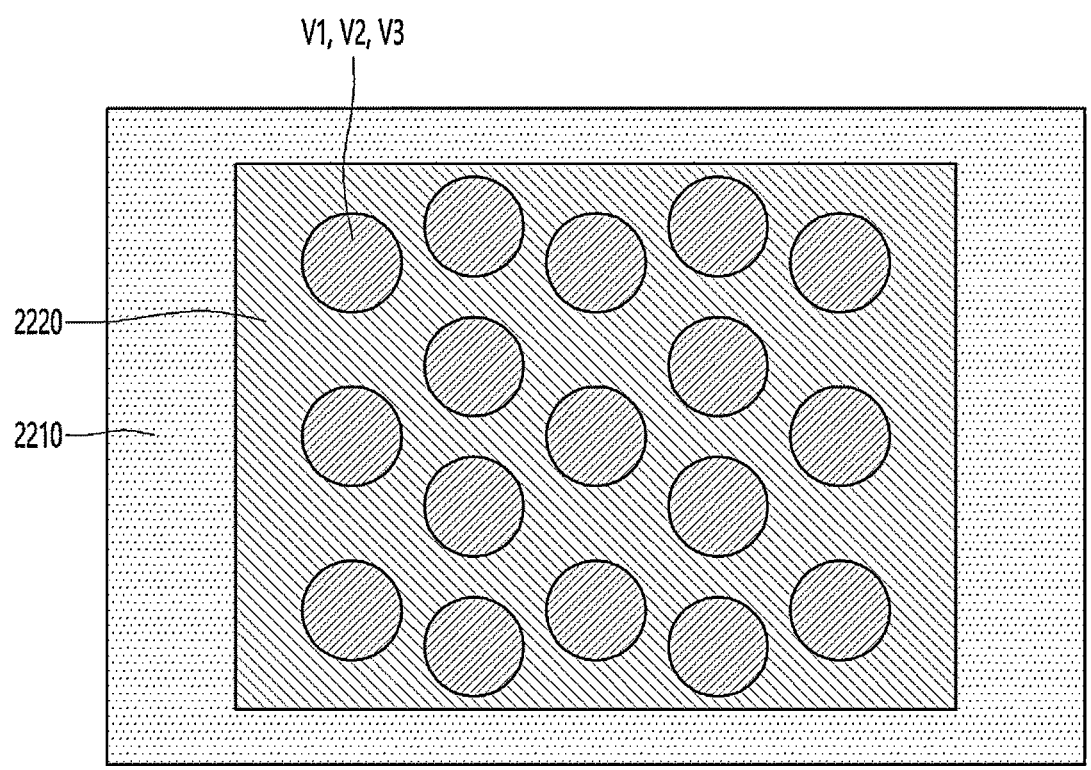

FIG. 28 is a view showing a light emitting package according to an embodiment, and FIGS. 29A and 29B are plan views of the via shown in FIG. 28.

FIGS. 28 to 29B, the light emitting package 2200 includes a vertical cavity type surface emitting laser element 2100, a substrate 2210, a pad 2220, a via V1, V2, V3, V4, V5, and a protection layer 2230, an electrode pattern 2240, a protective part 2250, a connection member (Wire, W), a holder 2300, and a diffusion part 2400.

The substrate 2210 may include a plurality of insulating layers 2211, 2212, and 2213.

Circuit pattern layers are disposed on surfaces of the plurality of insulating layers 2211, 2212, and 2213, respectively. In this case, the circuit pattern layer may include a pad 2220 disposed on a region overlapping a region in which the vertical cavity type surface-emission laser element 2100 is disposed, and an electrode pattern 2240 connected to an anode electrode of the vertical cavity type surface-emission laser device 2100 through the connection member W.

The circuit pattern layer includes the pad 2220. The pad 2220 includes a first pad 2221 disposed on an upper surface of the first insulating layer 2211, a second pad 2222 disposed on an upper surface of the second insulating layer 2212, a third pad 2223 disposed on a lower surface of the first insulating layer 2211, and a fourth pad 2224 disposed on a lower surface of the third insulating layer 2213.

The first to fourth pads 2221, 2222, 2223, and 2224 are positioned on an area of the surface of the plurality of insulating layers 2211, 2212, 2213 perpendicular to the area where the vertical cavity type surface-emission laser element 2100 is disposed. The first to fourth pads 2221, 2222, 2223, and 2224 may have a larger surface area than that of the vertical cavity type surface-emission laser element 2100.

Preferably, the vertical cavity type surface-emission laser element 2100 may have a first horizontal width of 660 μm and a second horizontal width of 720 μm. In this case, the first horizontal width may be a horizontal width in the X-axis direction of the vertical cavity type surface-emission laser element 2100, and the second horizontal width may be a horizontal width in the Y-axis direction of the vertical cavity type surface-emission laser element 2100. Hereinafter, a linear distance in the X-axis direction is referred to as a first horizontal width, and a linear distance in the Y-axis direction is referred to as a second horizontal width.

Meanwhile, a lowermost layer of the vertical cavity type surface-emission laser element 2100 constitutes an electrode part. In addition, the electrode part is disposed on the second pad 2222. In this case, a first horizontal width of the electrode part may be 600 μm, and a second horizontal width of the electrode part may be 670 μm. This will be described in detail below.

Meanwhile, each of the first to fourth pads 2221, 2222, 2223, and 2224 may have different horizontal widths. Preferably, each of the first horizontal width and the second horizontal width of the second to fourth pads 2222, 2223, and 2224 may be the same. In addition, the first horizontal width and the second horizontal width of the first pad 2221 may be smaller than the first and second horizontal widths of each of the second to fourth pads.

The first pad 2221 may have a first horizontal width of 800 μm and a second horizontal width of 900 μm. That is, on the upper surface of the first insulating layer 2211 on which the first pad 2221 is disposed, in addition to the vertical cavity type surface emitting laser element 2100, a circuit pattern layer for connection with an additional chip may be disposed. In addition, a circuit pattern layer connecting between an external device and the light emitting package 200 may be disposed on the upper surface of the first insulating layer 2211. Accordingly, the first pad 2211 disposed on the upper surface of the first insulating layer 2211 may have first and second horizontal widths smaller than those of the second to fourth pads 2222, 2223, and 2224. have. In addition, the first insulating layer 2211 may be a flexible substrate, and the second insulating layer disposed on the upper and lower surfaces of the first insulating layer 2211 may be a rigid substrate.

In addition, each of the second to fourth pads 2222, 2223, and 2224 may have a first horizontal width of 1500 μm and a second horizontal width of 1600 μm.

A connection part 280 is disposed on the second pad 2222 among the first to fourth pads 2221, 222, 223 and 2224. For example, the connection part 2280 may be a metal paste.

*In this case, the surface area of the second pad 2222 in the present invention may be at least twice the surface area of the vertical cavity type surface-emission laser device 2100. In the present invention, the surface area of the second pad 2222 in the present invention may be 4 times or more of the surface area of the vertical cavity type surface-emission laser device 2100. In the present invention, the surface area of the second pad 2222 in the present invention may be 6 times or more of the surface area of the vertical cavity type surface-emission laser device 2100.

That is, the second pad 2222 provides a mounting area in which the vertical cavity type surface-emission laser element 2100 is mounted. In addition, the second pad 2222 may be provided to transfer heat generated from the vertical cavity type surface-emission laser element 2100 to a lower portion through the via V. Accordingly, the second pad 2222 may have a surface area of 200% or more of the surface area of the vertical cavity type surface-emission laser element 2100. In addition, the second pad 2222 may have a surface area of 400% or more of the surface area of the vertical cavity type surface-emission laser element 2100. In addition, the second pad 2222 may have a surface area of 600% or more of the surface area of the vertical cavity type surface-emission laser element 2100.

At this time, if the surface area of the second pad 2222 is less than 200% of the surface area of the vertical cavity type surface-emission laser element 2100, there is a problem in that the heat emission performance of the vertical cavity type surface emitting laser element 2100 decreases. In addition, if the surface area of the second pad 2222 is greater than 610% of the surface area of the vertical cavity type surface-emitting laser element 2100, there is a problem in that the total volume of the light emitting package increases due to an increase in the space occupied by the second pad 2222.

Meanwhile, the first to fourth pads 2221, 2222, 2223, and 2224 may be disposed on regions overlapping in the vertical direction, respectively. In other words, the first to fourth pads 2221, 2222, 2223, and 2224 may be vertically aligned and positioned on the surfaces of the plurality of insulating layers 2211, 2212, and 2213. In other words, the first to fourth pads 2221, 2222, 2223, and 2224 may be aligned and positioned on a region overlapping the vertical cavity type surface-emission laser element 2100 in a vertical direction.

Meanwhile, a plurality of vias V1, V2, V3, V4, and V5 are disposed in the plurality of insulating layers 2211, 2212, 2213. A second via group V4 and V5 among the plurality of vias V1, V2, V3, V4, and V5 are through vias disposed for signal transmission between different layers, and a first via group V1, V2, V3 is a heat dissipation via that emits heat generated from the vertical cavity type surface-emission laser element 2100 to the outside. Accordingly, the first via group V1, V2, and V3 may include heat dissipation vias. In this case, the first via group V1, V2, and V3 do not only perform a heat dissipation function, but may also perform a signal transmission function by being electrically connected to the vertical cavity type surface-emission laser element 2100. In other words, the first via group V1, V2, and V3 are electrically connected to an electrode part (more specifically, a cathode electrode) disposed at the lowermost portion of the vertical cavity type surface-emission laser element 2100.

The first to third vias V1, V2, and V3 constituting the first via group V1, V2, and V3 are formed through the plurality of insulating layers 2211, 2212, and 2213, respectively.

Preferably, the first via V1 is formed through the first insulating layer 2211. The second via V2 is formed through the second insulating layer 2212. In addition, the third via V3 is formed through the third insulating layer 2213. In addition, the first to third vias V3 may directly contact at least one of the first to fourth pads 2221, 2222, 2223, and 2224.

In other words, an upper surface of the first via V1 may directly contact a lower surface of the first pad 2221 and a lower surface of the first via V1 may directly contact an upper surface of the third pad 2223. In addition, an upper surface of the second via V2 may directly contact a lower surface of the second pad 2222 and a lower surface of the second via V2 may directly contact an upper surface of the first pad 2221. An upper surface of the third via V3 may directly contact a lower surface of the third pad 2223, and a lower surface of the third via V3 may directly contact an upper surface of the fourth pad 2224.

Each of the first to third vias V1, V2, and V3 may include a plurality of via parts VP spaced apart from each other in first and second directions within the substrate 2210. That is, each of the first to third vias V1, V2, and V3 includes a plurality of first via parts spaced apart from each other in a first direction within the plurality of insulating layers 2211, 2212, and 2213, respectively, and a plurality of second via parts spaced apart from each of the first via parts in a second direction.

Meanwhile, in the above, it was said that the plurality of via parts are spaced apart in first and second directions perpendicular to each other. However, this is only an exemplary embodiment, and the spaced direction of the plurality of via parts may vary according to exemplary embodiments. For example, the spaced direction may be a diagonal direction or an oblique direction other than a direction perpendicular to the first direction.

The first direction may be a horizontal direction (or an X-axis direction) of an upper surface of each of the plurality of insulating layers 2211, 2212, and 2213, and the second direction may be a vertical direction (or a Y-axis direction) of an upper surface of each of the plurality of insulating layers 2211, 2212, and 2213.

In addition, each of the via parts constituting the first to third vias V1, V2, and V3 connected to the first to fourth pads 2221, 2222, 2223, and 2224 may have a circular shape. Accordingly, each of the via parts may have substantially the same width in the first direction and the width in the second direction.

That is, the first horizontal width and the second horizontal width of each of the via parts constituting the first to third vias V1, V2, and V3 may be substantially the same. In this case, each of the first horizontal width and the second horizontal width of each of the via parts may have a range of 10 μm to 1 mm. For example, each of the first horizontal width and the second horizontal width of each via part may have a range between 100 μm and 900 μm. For example, each of the first horizontal width and the second horizontal width of each via part may have a range between 300 μm and 750 μm. For example, each of the first horizontal width and the second horizontal width of each of the via parts may have a range of 450 μm to 600 μm.

In addition, each via part constituting the first to third vias V1, V2, and V3 may be spaced apart from each other in the first direction and the second direction within the respective insulating layers. In this case, the spaced width in the first direction may have a range of 2 μm to 100 μm. For example, the spaced width in the first direction may have a range of 4 μm to 80 μm. For example, the spaced width in the first direction may have a range of 7 μm to 60 μm. For example, the spaced width in the first direction may have a range of 10 μm to 50 μm. Also, similarly, the spaced width in the second direction may have a range of 2 μm to 100 μm. For example, the spaced width in the second direction may have a range of 4 μm to 80 μm. For example, the spaced width in the second direction may have a range of 7 μm to 60 μm. For example, the spaced width in the second direction may have a range of 10 μm to 50 μm.

Meanwhile, a thickness of each via part constituting the first to third vias V1, V2, and V3 may range from 1 μm to 200 μm. For example, a thickness of each via part constituting the first to third vias V1, V2, and V3 may range from 10 μm to 150 μm. For example, a thickness of each via part constituting the first to third vias V1, V2, and V3 may range from 50 μm to 100 μm. For example, a thickness of each via part constituting the first to third vias V1, V2, and V3 may range from 70 μm to 90 μm.

That is, as described above, each of the via parts constituting the first to third vias V1, V2, and V3 in the present invention has the first horizontal width, the second horizontal width, the spaced width of the first direction, and the spaced width of the second direction in a predetermined range. Accordingly, an area ratio of the via can be maximized within a limited arrangement area, and thus heat dissipation characteristics can be maximized.

Preferably, the surface area of the first to third vias V1, V2, and V3 including the plurality of via parts may be determine by the surface area of the second pad 2222 on which the vertical cavity type surface emitting laser element 2100 is mounted. In this case, the surface area of each of the first to third vias V1, V2, and V3 may be an upper surface or a lower surface. In this case, the first to third vias V1, V2, and V3 have a trapezoidal shape, and accordingly, an upper surface area and a lower surface area of each of the first to third vias (V1, V2, V3) are different each other. the surface area of the first to third vias V1, V2, and V3 may mean a larger area among the upper surface area and the lower surface area.

Each of the first to third vias V1, V2, and V3 may have the surface area of at least 10% or more of the surface area of the second pad 2222. For example, the surface area of each of the first to third vias V1, V2, and V3 may have at least 15% or more of the surface area of the second pad 2222. For example, the surface area of each of the first to third vias V1, V2, and V3 may have at least 20% or more of the surface area of the second pad 2222. For example, the surface areas of each of the first to third vias V1, V2, and V3 may have at least 30% or more of the surface area of the second pad 2222. For example, the surface area of each of the first to third vias V1, V2, and V3 may have at least 40% or more of the surface area of the second pad 2222. For example, the surface area of each of the first to third vias V1, V2, and V3 may have at least 50% or more of the surface area of the second pad 2222. For example, the surface area of each of the first to third vias V1, V2, and V3 may be 60% or less of the surface area of the second pad 2222. For example, the surface area of each of the first to third vias V1, V2, and V3 may be 75% or less of the surface area of the second pad 2222.

At this time, if the surface area of each of the first to third vias V1, V2, and V3 is less than 10% of the surface area of the second pad 2222, the heat generated from the vertical cavity type surface emitting laser element 2100 cannot be released efficiently. In addition, if the surface area of the first to third vias V1, V2, V3 is greater than at least 75% of the surface area of the second pad 2222, a part of each of the first to third vias V1, V2, V3 does not overlap (or may not be aligned) with the lower surface of the second pad 2222, and thereby degrades the reliability of the via. In addition, if the surface area of the first to third vias V1, V2, V3 is greater than at least 75% of the surface area of the second pad 2222, the gap between the plurality of via parts constituting each via becomes narrower, thereby, side surfaces of each via part are connected to each other, and the via area is widened. Accordingly, when filling the conductive material inside the via, since the conductive material is filled lower than the substrate, it is difficult to form the pad flat. For this reason, a reliability problem of disconnection (no current passing through) may occur when a device such as a vertical cavity type surface emitting laser is mounted.

In addition, a part of each of the first to third vias V1, V2, and V3 may overlap with the vertical cavity type surface-emitting laser element 2100 in a vertical direction.

In this case, a surface of each of the first to third vias V1, V2, and V3 may include an overlapping region overlapping a lower surface of the vertical cavity type surface-emission laser element 2100. In this case, the surface area of the overlapping area of each of the first to third vias V1, V2, and V3 may be 10% or more of the surface area of the vertical cavity type surface-emission laser element 2100. Here, the surface area of the overlapping region may be an area of a surface having a larger area among an upper surface and a lower surface of each of the vias. For example, the overlapping area of each of the first to third vias V1, V2, and V3 may be 15% or more of the surface area of the vertical cavity type surface-emission laser element 2100. For example, the overlapping area of each of the first to third vias V1, V2, and V3 may be 20% or more of the surface area of the vertical cavity type surface-emission laser element 2100. For example, the overlapping area of each of the first to third vias V1, V2, and V3 may be 30% or more of the surface area of the vertical cavity type surface-emission laser element 2100. For example, the overlapping area of each of the first to third vias V1, V2, and V3 may be 40% or more of the surface area of the vertical cavity type surface-emission laser element 2100. For example, the overlapping area of each of the first to third vias V1, V2, and V3 may be 50% or more of the surface area of the vertical cavity type surface-emission laser element 2100. For example, the overlapping area of each of the first to third vias V1, V2, and V3 may be 60% or more of the surface area of the vertical cavity type surface-emission laser element 2100.

Meanwhile, a protective layer 2230 is disposed on uppermost and lowermost portions of the substrate 2210.

A thickness of the protective layer 230 may be 1 µm to 20 µm. The thickness of the protective layer 230 may be 1 µm to 15 µm. For example, the thickness of the protective layer 230 may be 5 µm to 20 µm. When the thickness of the protective layer 230 is more than 20 µm, the total thickness of the light emitting package may increase. When the thickness of the protective layer 230 is less than 1 µm, reliability of the circuit pattern layer included in the light emitting package may be deteriorated.

The protective layer 230 exposes a surface of at least one circuit pattern layer among the circuit pattern layers. In this case, the protective layer 230 includes an upper protective layer 230 disposed on the second insulating layer 212 and a lower protective layer 230 disposed under the third insulating layers 211, 212 and 213.

In addition, the upper protective layer 2230 may expose the vertical cavity type surface-emission laser element 2100 mounted on the second insulating layer 2212 and the electrode pattern 2240. Also, the circuit pattern layer disposed on the second insulating layer 2212 may include a ground region for ground, and the upper protective layer 2230 may expose the ground region.

In addition, the lower protective layer 2230 may be disposed while exposing a ground area for ground among the circuit pattern layer disposed on the lower surface of the third insulating layer 2213.

In addition, a protective part 2250 may be disposed under the lower protective layer 2230.

The protective part 2250 may be entirely formed on the lower surface of the lower protective layer 2230 including the ground area exposed through the lower protective layer 2230.

In this case, the protective part 2250 may include a shielding layer 2251 disposed under a lower surface of the lower protective layer 2230 and the ground area exposed through the lower protective layer 2230. The shielding layer 2251 may be a shielding layer that shields Electro Magnetic Interference (EMI).

An adhesive layer 2252 may be disposed on a lower surface of the shielding layer 2251. The adhesive layer 2252 may be disposed under the shielding layer 2251 for attaching the metal plate 2253. The metal plate 2253 may be a sus (SUS). The metal plate 2253 may have a thickness of 100 µm.

Meanwhile, a holder 2300 is disposed on the upper protective layer 2230.

*In this case, the holder 2300 includes a seating part on which the diffusion part 400 is seated while exposing the upper region of the vertical cavity type surface-emission laser element 2100. In addition, a diffusion part 2400 is disposed on the seating part to cover an upper region of the vertical cavity type surface-emission laser element 2100. The diffusion part 2400 may be referred to as a diffuser.

In the embodiment of the present invention as described above, vias V1, V2, and V3 including a plurality of via parts having a bar shape are formed under the pad 2220 on which the vertical cavity type surface emitting laser element 2100 is disposed. The plurality of vias V1, V2, and V3 transfer heat generated from the vertical cavity type surface-emission laser element 2100 to the outside from a lower portion of the vertical cavity type surface-emission laser element 2100. In this case, the plurality of vias V1, V2, and V3 have a larger area that can be formed in the same space than the conventional circular vias, and thus emission characteristics can be improved.

Hereinafter, the vias V1, V2, and V3 including the plurality of via parts will be described with reference to FIGS. 29A and 29B. The vias V1, V2, and V3 are heat dissipation vias, and are disposed on a region overlapping the pad 220 in a vertical direction as described above. In addition, a part of the vias V1, V2, and V3 are vertically overlapped with an area in which the vertical cavity type surface-emission laser element 2100 is disposed.

In this case, each of the vias V1, V2, and V3 includes a plurality of via parts. The horizontal width in the first direction of each of the plurality of via parts may be the same as the horizontal width in the second direction as shown in FIG. 29A. For example, the horizontal width in the first direction may have a range between 0.9 times and 1.1 times the horizontal width in the second direction.

Meanwhile, each of the plurality of via parts is disposed to be spaced apart from each other in the first direction and the second direction. In this case, in the drawing, the plurality of via parts are arranged parallel to one side of the linear pad (i.e., spaced apart in the first direction), or arranged in the vertical direction of the one side (i.e. It is spaced apart in the second direction), but the present invention is not limited thereto. That is, as shown in FIG. 29B, each of the via parts constituting the vias V1, V2, and V3 may have a curved or zigzag shape, thus may be formed obliquely while having a certain inclination angle with one side of the pad.

In addition, each of the first horizontal width and the second horizontal width of each of the via parts constituting the first to third vias V1, V2, and V3 may have a range between 10 µm and 1 mm. For example, each of the first horizontal width and the second horizontal width of each via part may have a range between 100 µm and 900 µm. For example, each of the first horizontal width and the second horizontal width of each via part may have a range between 300 µm and 750 µm. For example, each of the first horizontal width and the second horizontal width of each of the via parts may have a range of 450 µm to 600 µm.

In addition, each of the via parts constituting the first to third vias V1, V2, and V3 may be disposed to be spaced apart from each other in the first direction within a range between 2 µm and 100 µm. In addition, each of the via parts constituting the first to third vias V1, V2, and V3 may be disposed to be spaced apart from each other in the first direction within a range of 10 μm to 50 μm. In addition, each of the via parts constituting the first to third vias V1, V2, and V3 may be disposed to be spaced apart from each other in the second direction within a range of 2 μm to 100 μm. In addition, each of the via parts constituting the first to third vias V1, V2, and V3 may be disposed to be spaced apart from each other in the second direction within a range of 10 μm to 50 μm.

Meanwhile, as shown in FIG. 29A, each of the first to third vias V1, V2, and V3 is shown to include 12 via parts, but this is only an embodiment, the number of via parts may further increase or decrease according to the area of the pad 2220.

In addition, as shown in FIG. 29B, each of the via parts constituting the first to third vias V1, V2, and V3 may be disposed not to be spaced apart from each other in a direction perpendicular to each other, but to be spaced apart from each other in a diagonal direction. Accordingly, the number of via parts that can be formed in the same area can be maximized.

Figure 30:
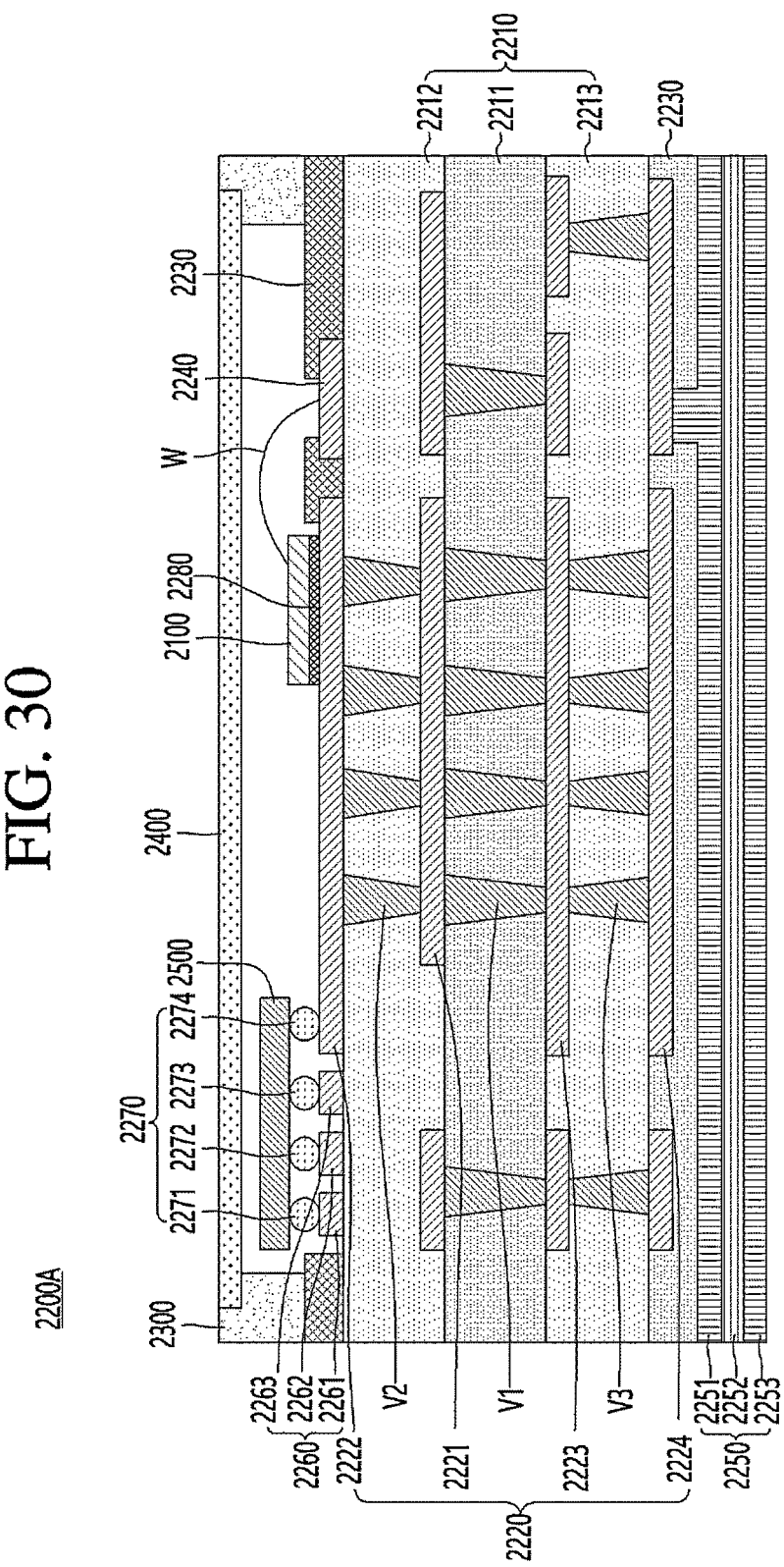
FIG. 30 is a diagram illustrating a light emitting module according to another embodiment.
Figure 31A:
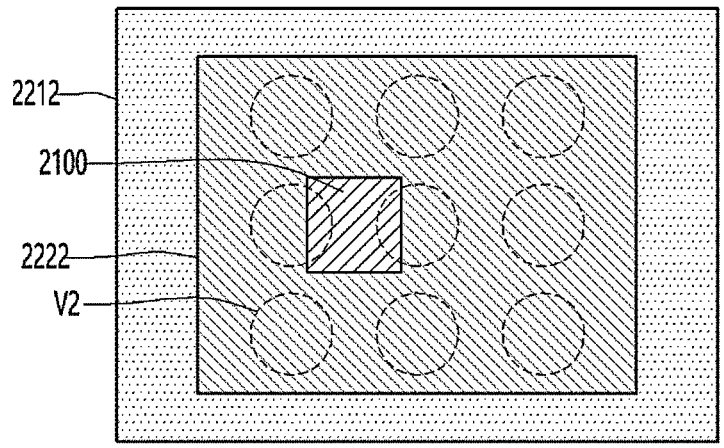
FIGS. 31A-31C are plan views showing an arrangement of a vertical cavity type surface emitting laser element according to an embodiment.
Figure 31B:
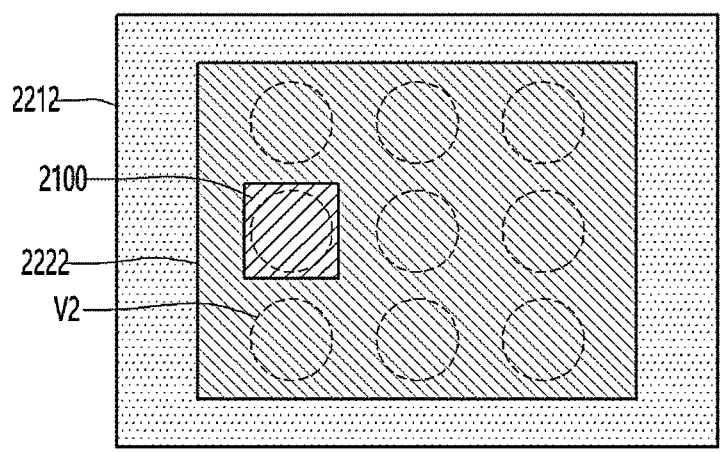
Figure 31C:
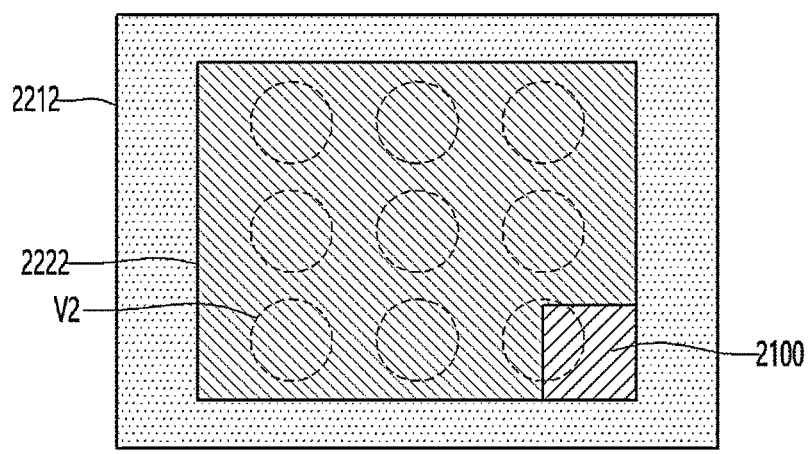
Figure 32:
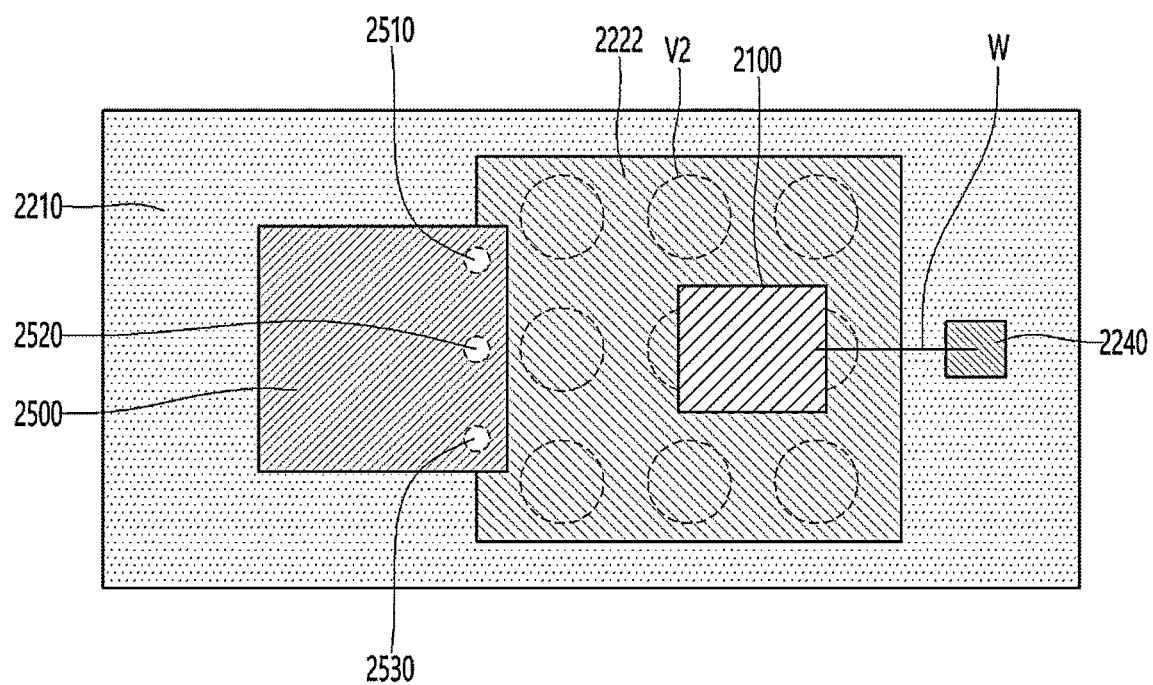
FIG. 32 is a plan view showing a connection relationship between the driver element of FIGS. 31A-31C and the vertical cavity type surface-emission laser element.
Figure 33A:
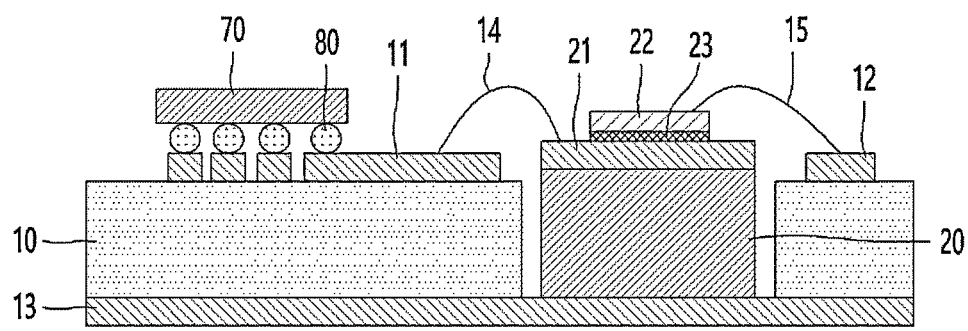
FIGS. 33A and 33B are diagrams comparing circuit distances between a driver element of Examples and Comparative Examples and a cathode electrode of a vertical cavity type surface-emission laser element.
Figure 33B:
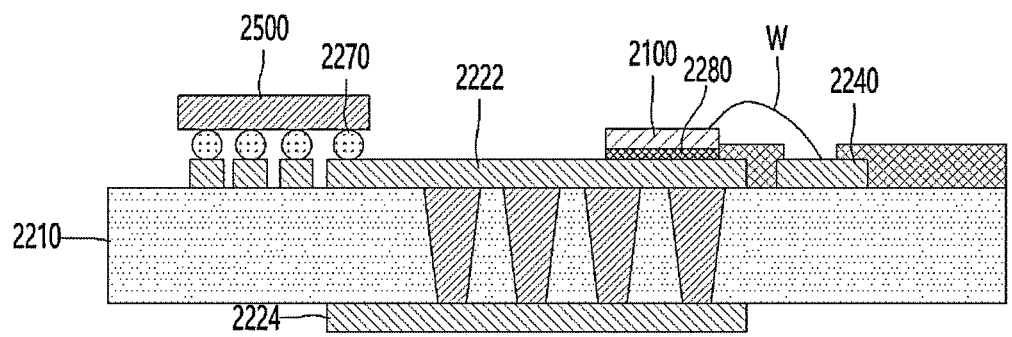
Figure 34A:
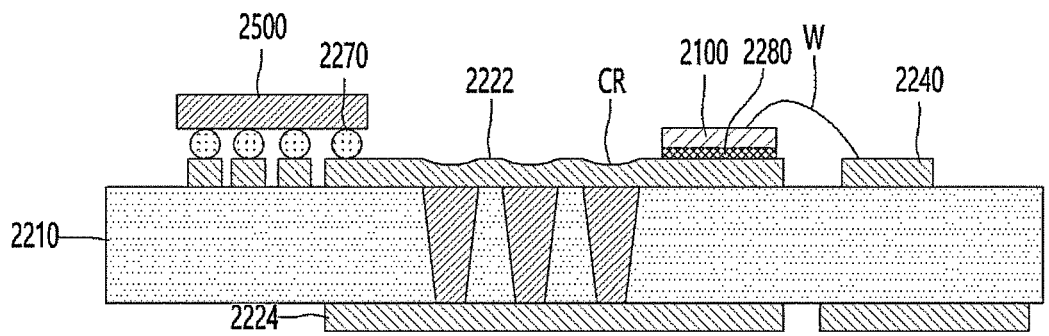
FIGS. 34A and 34B are views showing an arrangement of a vertical cavity type surface-emitting laser element according to another embodiment.
Figure 34B:
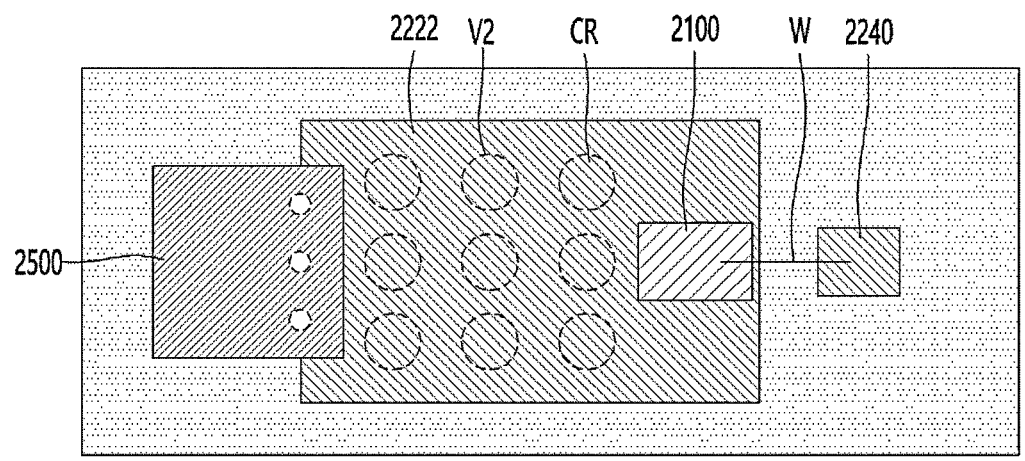
Figure 35A:
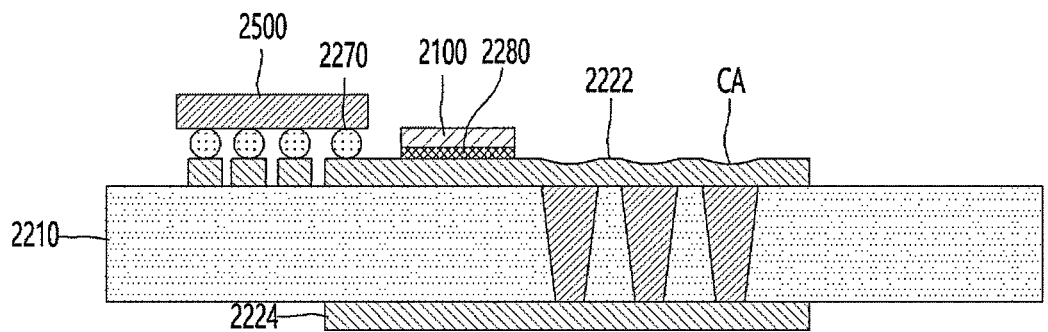
FIGS. 35A and 35B are views showing an arrangement of a vertical cavity type surface-emission laser element according to another embodiment.
Figure 35B:
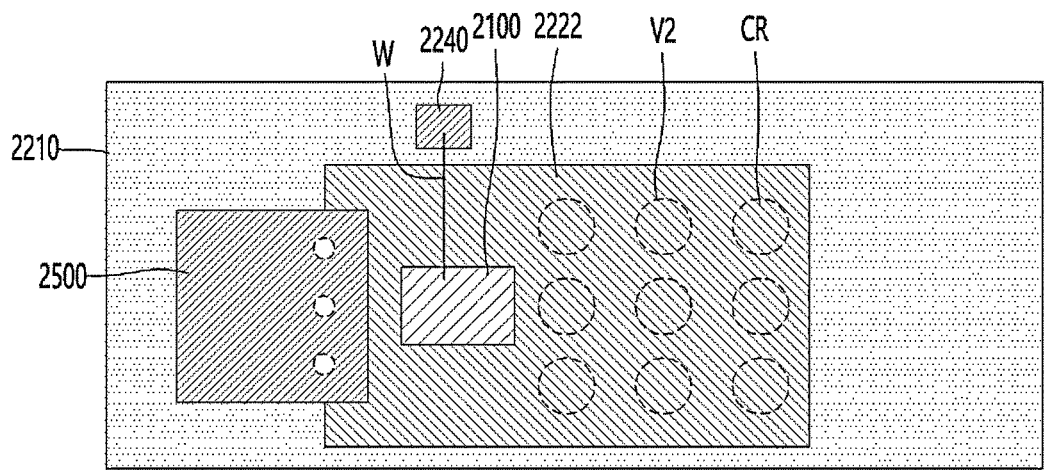

FIG. 30 is a view showing a light emitting module according to the embodiment, FIGS. 31A-31C are plan views showing an arrangement form of a vertical cavity type surface-emission laser device 2100 according to an embodiment of the present invention, FIG. 32 is a plan view showing a connection relationship between the driver element of FIGS. 31A-31C and the vertical cavity type surface-emission laser element 2100, FIGS. 33A and 33B are diagrams comparing circuit distances between a driver element of an embodiment and a comparative example and a cathode electrode of the vertical cavity type surface-emission laser element 2100, FIGS. 34A and 34B are diagrams showing an arrangement of a vertical cavity type surface-emitting laser device 2100 according to another embodiment of the present invention, and FIGS. 35A and 35B are diagrams illustrating an arrangement of a vertical cavity type surface-emitting laser device 2100 according to another embodiment.

Hereinafter, a light emitting module according to an embodiment will be described with reference to FIGS. 30 to 35B.

In the light emitting module according to the exemplary embodiment of the present invention, a driver element 2500 may be additionally disposed on the insulating layers 2211, 2212, and 2213 in the light emitting package of FIG. 28.

That is, the light emitting module includes the substrate 2210 including the insulating layers 2211, 2212, and 2213, the pads 2220 including the first to third pads, the vias V1, V2, and V3, the protective layer 2230, the electrode pattern 2240 and the protective part 2250.

At this time, a connection pattern 2260 for mounting the driver element 2500 is additionally formed on the upper surface of the uppermost insulating layer 2212 among the insulating layers 2211, 2212, and 2213.

In addition, a second connection part 2270 is disposed on the connection pattern 2260, and the driver element 2500 is attached on the second connection part 2270 by the adhesive force provided by the second connection part 2270. That is, the vertical cavity type surface-emission laser element 2100 is attached to the pad 2220 through the first connection part 280, and the driver element 2500 is attached on the connection pattern 2260 through the second connection part 2270.

Alternatively, in the present invention, both the cathode electrode and the ground terminal of the driver element 500 may be positioned on one pad. In this case, the one pad may be a pad electrically connected to the vias V1, V2, and V3, or a pad disposed on an area vertically overlapping with the vias V1, V2, and V3, and preferably the one pad is a second pad 222 disposed on the uppermost insulating layer.

That is, the connection pattern 2260 on which the driver element 2500 is disposed is disposed on the upper surface of the second insulating layer 2212. In this case, the connection pattern 2260 may be disposed on the second insulating layer 2212 according to the number of terminals provided in the driver element 2500. In this case, in the present invention, a part of the pad 2222 on which the vertical cavity type surface-emission laser element 2100 is disposed is used as a connection pattern of the driver element 2500.

That is, the connection pattern 2260 may include first to third connection patterns 2261, 2262, and 2263. In addition, first to third sub-connection parts 2271, 2272, and 2273 constituting the second connection part 2270 are disposed on the first to third connection patterns 2261, 2262, and 2263, respectively. In addition, the driver element 2500 may be mounted on the connection pattern through the first to third sub-connection parts 2271, 2272, and 2273. At this time, a fourth sub-connection part 2274 constituting the second connection part 2270 is also located on the pad 2222, and a ground terminal of the driver element 2500 may be located on the fourth sub-connection part 2274

In other words, in the related art, the ground terminal of the driver element 500 is disposed on a separate connection pattern, and accordingly, the connection pattern connected to the ground terminal is electrically connected with the cathode electrode through a wire.

In contrast, in the present invention, the ground terminal of the driver element 2500 is also disposed on the pad on which the cathode electrode is disposed, so that the signal distance between the cathode electrode and the driver element 2500 can be minimized.

Accordingly, in the present invention, a part of the driver element 2500 may be positioned on a region vertically overlapping with the pad 2222. In this case, a part of the driver element 2500 positioned on a region vertically overlapping the pad 2222 may be a region in which a ground terminal is formed.

Meanwhile, referring to FIGS. 31A-31C, the vertical cavity type surface-emission laser element 2100 is disposed on the pad 2222 and comprises a plurality of via parts VP1, VP2, VP3 constituting the respective vias V1, V2, and V3 may be disposed to overlap in a vertical direction with at least one via part.

That is, as shown in FIG. 31A, the vertical cavity type surface-emission laser element 2100 may be disposed in a central region of the pad 2220 and may be disposed to overlap two via parts in a vertical direction. In contrast, as shown in FIG. 31B, the vertical cavity type surface-emission laser element 2100 may be disposed in an outer region of the pad 2220 to overlap the entire area of one via part in a vertical direction. In addition, as shown in FIG. 31C, the vertical cavity type surface-emission laser element 2100 may be disposed in a corner region of the pad 2220 to be disposed to overlap a partial area of one via part in a vertical direction.

Meanwhile, as shown in FIG. 32, a plurality of ground terminals may be included on a lower surface of the driver element 2500. For example, the driver element 2500 may include first to third ground terminals 2510, 2520, and 2530. In addition, the first to third ground terminals 2510, 2520, and 2530 may be directly attached to the pad through the second connection part 2270 disposed on the pad 2222. Accordingly, the ground terminal may be connected to the cathode electrode of the vertical cavity type surface-emitting laser element 2100 disposed on the pad 2222 through the first connection part 280 without a separate connection member such as a wire.

Referring to FIGS. 33A and 33B, in FIG. 33A, a first connection part 23 is disposed on a separate second substrate 20, and a vertical cavity type surface emitting laser element 22 is disposed on the first connection part 23.

In addition, the driver element 70 is disposed on the first substrate 10. That is, the driver element 70 is mounted on the circuit pattern layer 11 disposed on the substrate through the second connection part 80.

Accordingly, the driver element 70 and the vertical cavity type surface-emission laser element 22 are electrically connected to each other through a separate connection member 14. Specifically, the ground terminal of the driver element 70 is positioned on the circuit pattern layer 11 disposed on the first substrate 10. In addition, the cathode electrode of the vertical cavity type surface-emission laser element 22 is positioned on the metal layer 21 disposed on the second substrate 20. The conventional second substrate 20 is made thicker than the first substrate 10 because it is difficult to adjust the height due to the use of the AlN substrate. Moreover, in the related art, the second substrate 20 could be manufactured at the same height as the first substrate 10, but it was difficult because a process for matching the manufacturing cost and height was separately required. In addition, even if the height of the second substrate 20 was adjusted to the height of the first substrate 10, the second substrate 10 as a separate substrate had to be inserted into the first substrate 10, thereby there was a space between the first and second substrates, so that the circuit pattern layer 11 and the metal layer 21 could not be made together. Accordingly, in the conventional light emitting module, the connection member 14 is positioned between the circuit pattern layer 11 and the metal layer 21.

In contrast, in the present invention, as shown in FIG. 33B, the first connection part 2280 in which the vertical cavity type surface-emission laser element is disposed and the second connection part 2270 in which the driver element is disposed are both positioned on one pad 2222. That is, since the cathode electrode of the vertical cavity type surface-emission laser element 100 is positioned on the pad 2222, a separate connection member is unnecessary. In addition, a ground terminal of the driver element 500 may also be located on the pad 2222.

Meanwhile, referring to FIGS. 34A and 34B, the upper surface of the pad 2222 disposed on the uppermost insulating layer may not be flat and may have a curvature. That is, an upper surface of a region vertically overlapping the via parts VP1, VP2, and VP3 among the upper surfaces of the pad 2222 may include a concave portion CR that is depressed by a predetermined depth in a lower direction.

Meanwhile, as shown in FIGS. 34A and 34B, the vertical cavity type surface-emission laser device 2100 is disposed on a region of the upper surface of the pad that does not vertically overlap the plurality of via parts, or the plurality of via parts VP1, VP2, and VP3 may be disposed so as to be positioned in a region that does not vertically overlap two sides facing each other among four sides of the vertical cavity type surface-emission laser element 100 as shown in FIG. 34B. FIG. 34A is a cross-sectional view of the light emitting module when the vertical cavity type surface-emission laser element 2100 is disposed on a region that does not vertically overlap with the plurality of via parts, and FIG. 34B is a plan view of FIG. 34A.

Accordingly, the plurality of via parts VP1, VP2, and VP3 may not be disposed on at least some of the areas vertically overlapping with the pad 2220. In addition, the vertical cavity type surface-emission laser element 2100 may be disposed on a region where the plurality of via parts VP1, VP2, and VP3 are not disposed in the vertical direction. In this case, an area of the plurality of via parts VP1, VP2, and VP3 may be further increased to inhibit a problem in heat dissipation performance. For example, each of the plurality of via parts VP1, VP2, and VP3 may include a plurality of via holes overlapping not only in the first direction but also in the second direction as shown in FIG. 29B.

Meanwhile, in the present invention, the mounting position of the vertical cavity type surface-emission laser element 2100 is adjusted to minimize the signal distance between the driver element 2500 and the vertical cavity type surface-emission laser element 2100.

That is, as shown in FIGS. 35A and 35B, the plurality of via parts are disposed in a region vertically overlapping the upper surface of the pad on the far side from the driver element 2500. Accordingly, the via parts constituting the vias are not located under the upper surface of the upper surface of the pad 220 adjacent to the driver element 500. In addition, the vertical cavity type surface emitting laser element 100 is disposed on the upper surface of the pad in a region adjacent to the driver element 500. Here, FIG. 35A is a cross-sectional view of the light emitting module, and FIG. 35B is a plan view of FIG. 35B.

Accordingly, while increasing the mounting reliability of the vertical cavity type surface-emission laser element 2100, a signal distance between the driver element 500 and the vertical cavity type surface-emission laser element 2100 may be minimized. In addition, it is possible to solve a problem caused by inclination of the light emitting element due to the concave portion CA of the pad.

Figure 36:
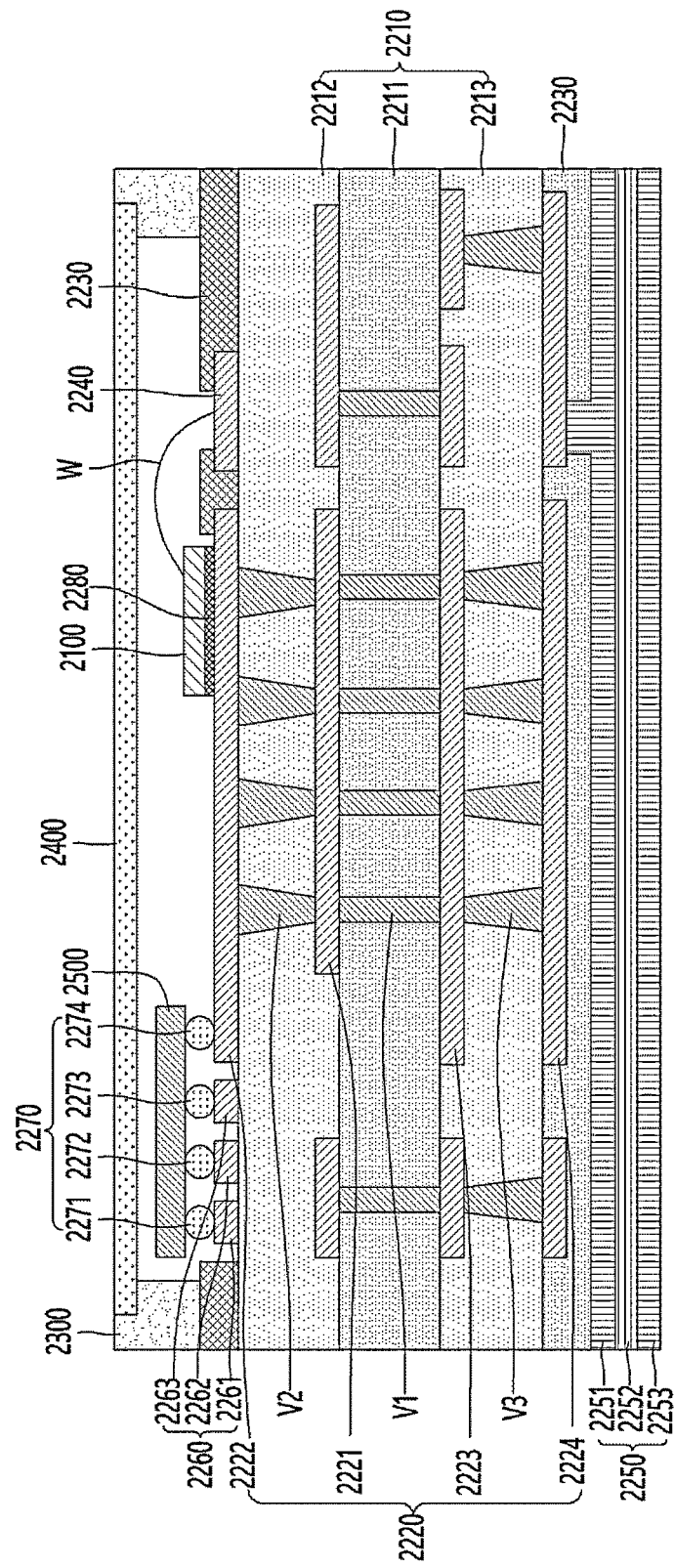
FIG. 36 is a diagram illustrating a light emitting module according to another embodiment.

FIG. 36 is a diagram illustrating a light emitting module according to another embodiment.

Referring to FIG. 36, the light emitting module 2200B according to the present invention may include a plurality of insulating layers 2211, 2212, and 2213. In the plurality of insulating layers 2211, 2212, 2213, a first insulating layer 2211 may be disposed in a center, and a second insulating layer 2212 may be disposed above the first insulating layer 2211. In addition, a third insulating layer 2213 may be disposed under the first insulating layer 2211.

In this case, the first insulating layer 2211 may be flexible, and the second insulating layer 2212 and the third insulating layer 2213 may be rigid. Preferably, the first insulating layer 2211 may be a flexible substrate, and the second and third insulating layers 2212 and 2213 may be a rigid substrate.

In addition, a plurality of vias may be formed in the first insulating layer 2211. In this case, the plurality of vias include a heat dissipation via V1 having a heat dissipation function as described above, and other vias for signal transmission. In this case, the plurality of vias may be formed by forming a through hole passing through the first insulating layer 2211 and filling the inside of the formed through hole with a conductive material. In this case, the through hole may be formed through punching through a laser and a desmear process. The desmear process may be a process of removing polyimide smear attached to an inner surface of the through hole. By the desmear process, the inner wall of the through hole formed in the first insulating layer 2211 may have an inclined surface similar to a straight line.

In other words, the vias formed in the second and third insulating layers 2212 and 2213 may have a trapezoidal shape in a vertical cross-sectional shape.

Alternatively, the via formed in the first insulating layer 2211 may have a rectangular shape in a vertical cross-sectional shape.

In addition, a heat dissipation via and a signal transmission via are formed in the first insulating layer 2211 as described above. In this case, a width of each of the vias may be different from each other. That is, a fine pattern may be implemented in the first insulating layer 2211, and thus the width of the via in the first insulating layer 2211 may be formed to a minimum. However, when the heat dissipation via is formed with the minimum width as described above, the heat dissipation characteristic may decrease. Accordingly, in the present invention, the width of the via formed on the area vertically overlapping the pad 2220 in the first insulating layer and the width of the via formed on the other area are different from each other. In other words, the width of the via may have a range as described above, and a width of a via formed on a region vertically overlapping with the pad 2220 may be larger than a width of a via formed on the other area within the above range. For example, the width of the via formed on the other area may have a width that satisfies a range of 5 to 50 µm, specifically, a range of 20 to 35 µm. In addition, the width of the via formed on the area vertically overlapping the pad 2220 may satisfy a range of 50 to 200 µm, specifically, a range of 70 to 100 µm.

Figure 37:
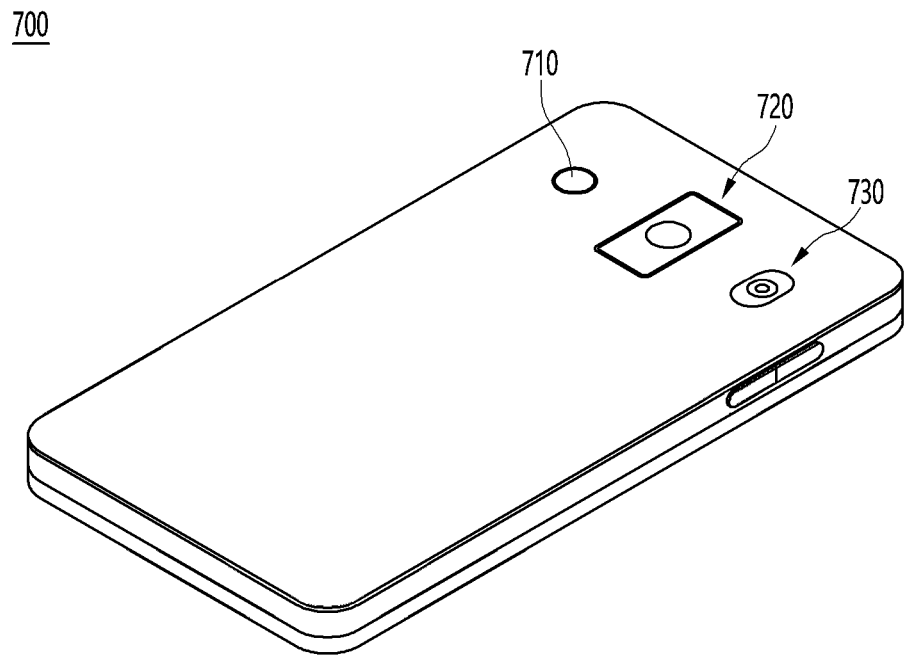
FIG. 37 is a diagram illustrating a mobile terminal according to an embodiment.

FIG. 37 is a diagram illustrating a mobile terminal according to an embodiment of the present invention.

Referring to FIG. 37, it is a perspective view of a mobile terminal 700 to which the light emitting package or light emitting module, for example, an autofocus device is applied.

As shown in FIG. 37, the mobile terminal 700 according to the embodiment may include a camera module 720, a flash module 730, and an auto focus device 710 provided on the rear side. Here, the autofocus device 710 is a light emitting package or a light emitting module, and includes one of packages including the vertical cavity type surface-emission laser devices 100 and 1100 according to the embodiment described with reference to FIGS. 2 to 26.

The flash module 730 may include a light emitting element that emits light therein. The flash module 730 may be operated by a camera operation of a mobile terminal or a user's control.

The camera module 720 may include an image photographing function and an auto focus function. For example, the camera module 720 may include an image autofocus function.

The auto focus device 710 may include an auto focus function using a laser. The auto-focusing device 710 may be mainly used under conditions in which the auto-focusing function of the image of the camera module 720 is deteriorated (for example, a proximity or dark environment of 10 m or less). The autofocus device 710 may include a light emitting unit including a vertical cavity surface emission laser (VCSEL) semiconductor device, and a light receiving unit that converts light energy such as a photodiode into electrical energy.

The invention claimed is:

1. A circuit board comprising:
   a substrate;
   a heat dissipation via passing through at least a portion of the substrate;
   a through via passing through a portion of the substrate and spaced apart from the heat dissipation via in a horizontal direction;
   a pad disposed on the substrate and overlapping with the heat dissipation via in a vertical direction and not overlapping with the through via in the vertical direction;
   a first connection part disposed on the pad;
   a first element mounted on the first connection part,
   a second connection part disposed on the pad and spaced apart from the first connection part in the horizontal direction; and
   a second element mounted on the second connection part,
   wherein the first element includes a first region overlapping the pad in the vertical direction and a second region non-overlapping with the pad in the vertical direction,
   wherein a part of the second region of the first element overlaps the through via in the vertical direction,
   wherein the pad includes an overlap region overlapping the heat dissipation via in the vertical direction and a non-overlapping region not overlapping with the heat dissipation via in the vertical direction, and
   wherein the first and second connection parts are disposed on the non-overlapping region of the pad.

2. The circuit board of claim 1, wherein an entire region of the second element is overlapped with the pad in the vertical direction.

3. The circuit board of claim 1, wherein the second region does not overlap the heat dissipation via.

4. The circuit board of claim 1, wherein the heat dissipation via comprises a plurality of heat dissipation via parts spaced apart from each other in the horizontal direction, and
   wherein the plurality of heat dissipation via parts are commonly connected to the pad.

5. The circuit board of claim 4, wherein each of the plurality of heat dissipation via parts has a first width smaller in a first horizontal direction than a second width in a second horizontal direction different from the first horizontal direction.

6. The circuit board of claim 4, wherein the plurality of heat dissipation via parts have a surface area of 10% or more of a surface area of the pad.

7. The circuit board of claim 5, wherein widths of the through via in the first and second horizontal directions are smaller than the second width.

8. The circuit board of claim 1, wherein the substrate comprises a first insulating layer and a second insulating layer,
   wherein the heat dissipation via includes a first heat dissipation via passing through the first insulating layer, and a second heat dissipation via passing through the second insulating layer, and
   wherein the first heat dissipation via overlaps the second heat dissipation via in the vertical direction.

9. The circuit board of claim 2, wherein the first element includes a driver element; and
   wherein the second element includes a vertical cavity type surface-emission laser element.

10. The circuit board of claim 2, wherein the first element comprises a ground terminal overlapping the first connection part in the vertical direction, and
    wherein the ground terminal is connected to the second element through the pad.

11. The circuit board of claim 9, wherein the second element includes a cathode electrode,
    wherein the second connection part is disposed between the cathode electrode and the pad, and
    wherein the cathode electrode and a ground terminal are connected to each other through the pad.

12. The circuit board of claim 11, wherein an upper surface of the overlap region of the pad includes a concave portion provided in a region overlapping the heat dissipation via in the vertical direction.

* * * * *